(12) United States Patent
Danesh et al.

(10) Patent No.: US 11,362,238 B2
(45) Date of Patent: Jun. 14, 2022

(54) LIGHT EMITTING DIODE CONTAINING OXIDIZED METAL CONTACTS

(71) Applicant: GLO AB, Lund (SE)

(72) Inventors: Fariba Danesh, Los Altos Hills, CA (US); Tsun Lau, Sunnyvale, CA (US)

(73) Assignee: NANOSYS, INC., Milpitas, CA (US)

( * ) Notice: Subject to any disclaimer, the term of this patent is extended or adjusted under 35 U.S.C. 154(b) by 0 days.

(21) Appl. No.: 16/720,402

(22) Filed: Dec. 19, 2019

(65) Prior Publication Data

US 2020/0127168 A1    Apr. 23, 2020

Related U.S. Application Data

(63) Continuation-in-part of application No. 16/153,062, filed on Oct. 5, 2018, now Pat. No. 10,804,436.

(60) Provisional application No. 62/569,256, filed on Oct. 6, 2017.

(51) Int. Cl.
| | |
|---|---|
| *H01L 33/40* | (2010.01) |
| *H01L 33/46* | (2010.01) |
| *H01L 33/00* | (2010.01) |
| *H01L 33/32* | (2010.01) |
| *H01L 33/62* | (2010.01) |

(52) U.S. Cl.
CPC ........ *H01L 33/405* (2013.01); *H01L 33/0025* (2013.01); *H01L 33/32* (2013.01); *H01L 33/46* (2013.01); *H01L 33/62* (2013.01)

(58) Field of Classification Search
CPC .............................. H01L 33/405; H01L 33/62
See application file for complete search history.

(56) References Cited

U.S. PATENT DOCUMENTS

| | | | |
|---|---|---|---|
| 6,287,947 B1* | 9/2001 | Ludowise | H01S 5/0421 438/606 |
| 8,309,439 B2 | 11/2012 | Seifert et al. | |
| 8,664,636 B2 | 3/2014 | Konsek et al. | |
| 8,669,574 B2 | 3/2014 | Konsek et al. | |
| 9,035,278 B2 | 5/2015 | Svensson et al. | |
| 9,054,233 B2 | 6/2015 | Ohlsson et al. | |
| 9,281,442 B2 | 3/2016 | Romano et al. | |
| 9,287,443 B2 | 3/2016 | Konsek et al. | |
| 10,418,499 B2 | 9/2019 | Schneider et al. | |

(Continued)

OTHER PUBLICATIONS

International Application No. PCT/US2018/054659, International Search Report and Written Opinion, dated Jan. 28, 2019, 13pgs.

(Continued)

*Primary Examiner* — Raj R Gupta
(74) *Attorney, Agent, or Firm* — The Marbury Law Group PLLC

(57) ABSTRACT

A light emitting diode includes a first conductivity type semiconductor material region, an active region located over the first conductivity type semiconductor material region, a second conductivity type semiconductor material layer located over the active region, a first layer containing at least one of nickel or gold located over the second conductivity type semiconductor material layer, a reflective top contact electrode located over the first layer, a dielectric material layer located over the top contact electrode and containing an opening, and a reflector located over the dielectric material layer and contacting the top contact electrode through the opening in the dielectric material layer.

20 Claims, 42 Drawing Sheets

(56) References Cited

U.S. PATENT DOCUMENTS

| | | |
|---|---|---|
| 2004/0232429 A1 | 11/2004 | Miki et al. |
| 2006/0071228 A1 | 4/2006 | Sun |
| 2011/0143472 A1 | 6/2011 | Seifert et al. |
| 2011/0169033 A1 | 7/2011 | Fukunaga et al. |
| 2011/0240959 A1 | 10/2011 | Konsek et al. |
| 2011/0254034 A1 | 10/2011 | Konsek et al. |
| 2013/0087823 A1* | 4/2013 | Tsai ............... H01L 33/38 257/98 |
| 2014/0246650 A1 | 9/2014 | Konsek et al. |
| 2014/0363912 A1 | 12/2014 | Ohlsson et al. |
| 2015/0029724 A1 | 1/2015 | Shiratori et al. |
| 2015/0090971 A1 | 4/2015 | Kim et al. |
| 2015/0188009 A1 | 7/2015 | Chih et al. |
| 2015/0207028 A1 | 7/2015 | Romano et al. |
| 2016/0118546 A1 | 4/2016 | Wuu et al. |
| 2016/0126489 A1 | 5/2016 | Yokota et al. |
| 2017/0162552 A1 | 6/2017 | Thompson |
| 2018/0159005 A1 | 6/2018 | Pokhriyal et al. |
| 2018/0198029 A1 | 7/2018 | Munteanu et al. |
| 2018/0198047 A1 | 7/2018 | Danesh et al. |
| 2018/0240952 A1* | 8/2018 | Moon ............... H01L 33/387 |
| 2019/0088820 A1 | 3/2019 | Danesh et al. |
| 2019/0109262 A1 | 4/2019 | Danesh et al. |

OTHER PUBLICATIONS

U.S. Appl. No. 16/389,510, filed Apr. 19, 2019, GLO AB.
U.S. Appl. No. 16/461,256, filed May 15, 2019, GLO AB.
U.S. Appl. No. 16/679,580, filed Nov. 11, 2019, GLO AB.
European Office Communication Pursuant to Rule 164(1) EPC and Supplemental European Search Report for European Patent Application No. 18865102, dated Aug. 9, 2021, 15 pages.
USPTO Office Communication for U.S. Appl. No. 16/152,062, dated Dec. 30, 2019.
Notification Concerning Transmittal of International Preliminary Report on Patentability and Written Opinion of the International Searching Authority for International Patent Application No. PCT/US2018/054659, dated Apr. 16, 2020, 10 pages.

* cited by examiner

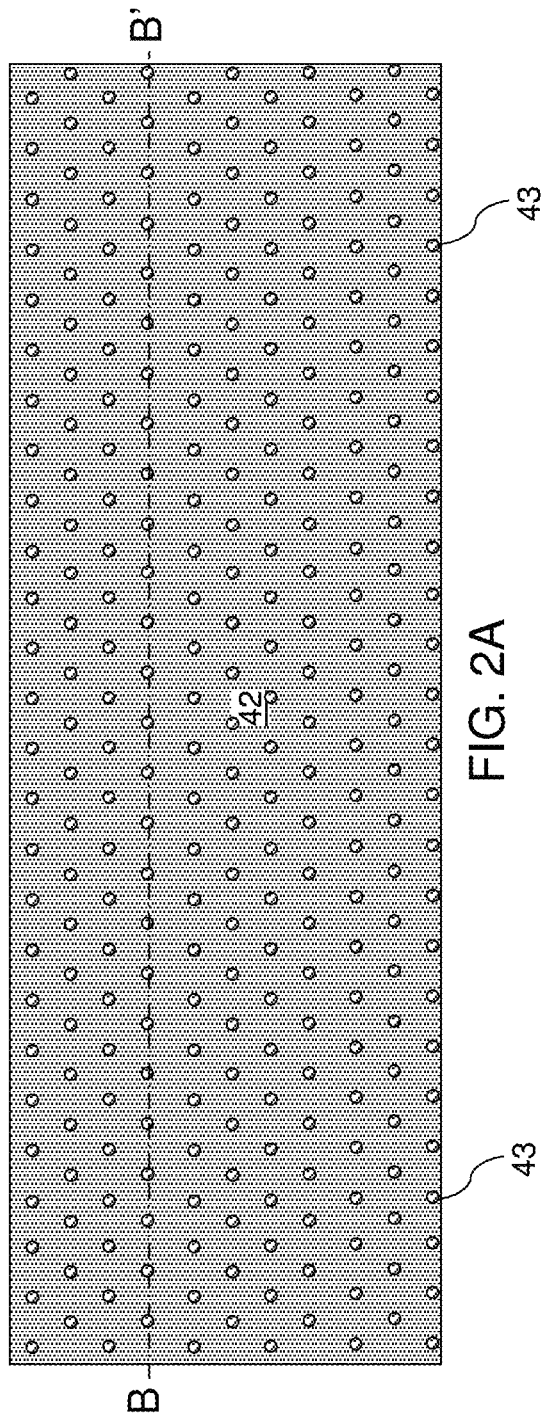
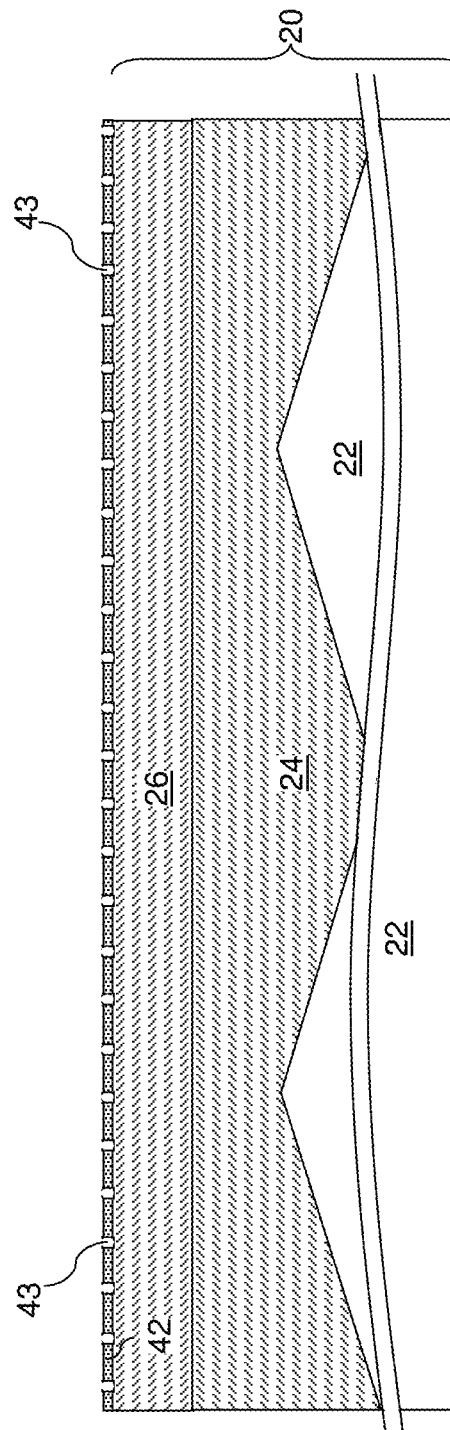

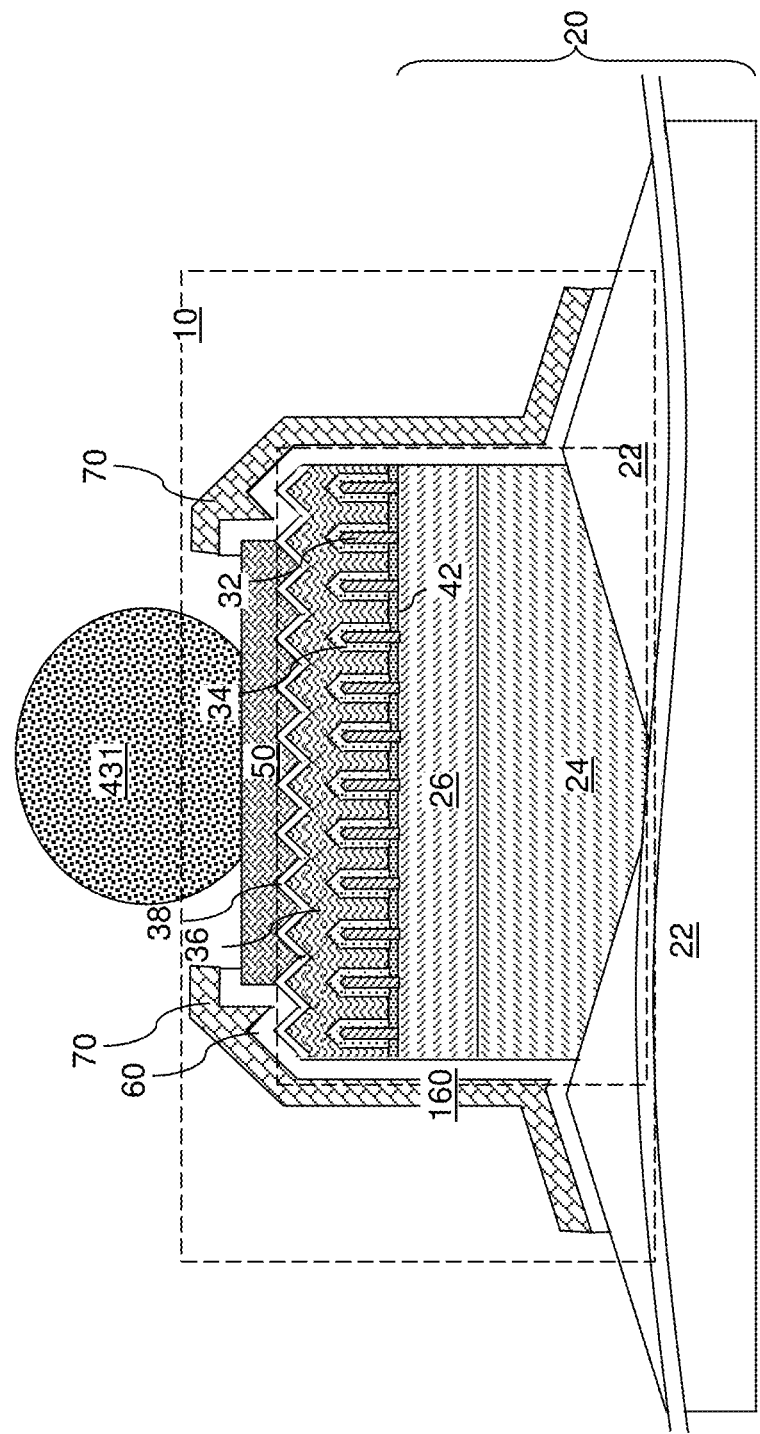

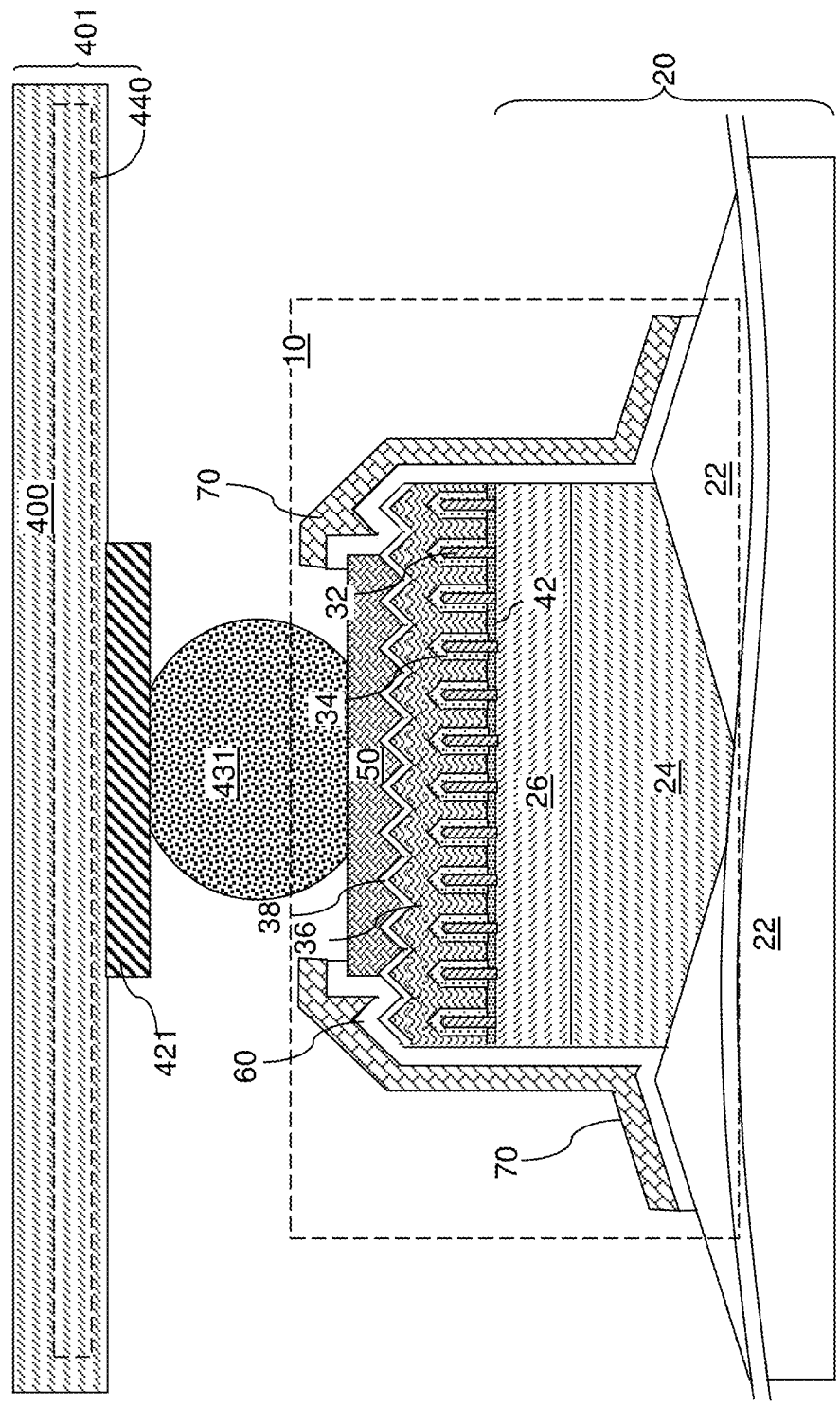

LIGHT EMITTING DIODE CONTAINING OXIDIZED METAL CONTACTS

RELATED APPLICATIONS

The instant application is a continuation-in-part application of U.S. application Ser. No. 16/153,062 filed on Oct. 5, 2018, which claims the benefit of priority of U.S. Provisional Application No. 62/569,256 filed on Oct. 6, 2017, the entire contents of which are incorporated herein by reference.

FIELD

The present invention relates to light emitting devices, and particularly to nanowire-based light emitting diodes employing oxidized metal contacts, a direct view display device employing the same, and methods of fabricating the same.

BACKGROUND

Light emitting devices such as light emitting diodes (LEDs) are used in electronic displays, such as backlights in liquid crystal displays located in laptops or televisions. Light emitting devices include light emitting diodes (LEDs) and various other types of electronic devices configured to emit light.

SUMMARY

According to one embodiment a light emitting diode includes a first conductivity type semiconductor material region, an active region located over the first conductivity type semiconductor material region, a second conductivity type semiconductor material layer located over the active region, a first layer containing at least one of nickel or gold located over the second conductivity type semiconductor material layer, a reflective top contact electrode located over the first layer, a dielectric material layer located over the top contact electrode and containing an opening, and a reflector located over the dielectric material layer and contacting the top contact electrode through the opening in the dielectric material layer.

According to one embodiment, a method of forming a first light emitting diode comprises forming a growth mask layer having an opening over a top surface of the doped compound semiconductor layer, forming a semiconductor core through the opening in the growth mask layer, forming an active region over the semiconductor core, forming a second conductivity type semiconductor material layer over the active region, forming a metal layer stack including a first metal layer and a second metal layer on the second conductivity type semiconductor material layer, and oxidizing the metal layer stack to form a transparent conductive layer including at least one conductive metal oxide.

According to another embodiment, a method of forming a first light emitting diode comprises forming a first conductivity type semiconductor material region over a substrate, forming an active region over the first conductivity type semiconductor material region, forming a second conductivity type semiconductor material layer over the active region, forming a nickel layer having a thickness in a range from 1 nm to 10 nm on the second conductivity type semiconductor material layer, forming a gold having a thickness in a range from 1 nm to 10 nm on the nickel layer, and oxidizing the nickel layer at an elevated temperature to form transparent conductive layer comprising nickel oxide while diffusing the gold layer into the second conductivity type semiconductor material layer through the nickel layer during the step of oxidizing to form a gold doped semiconductor region in the second conductivity type semiconductor material layer.

According to another embodiment a light emitting device comprises a doped compound semiconductor layer, a growth mask layer located on a top surface of the doped compound semiconductor layer, a semiconductor core extending from a top surface of the doped compound semiconductor layer through an opening in the growth mask layer, an active region located over the semiconductor core, a second conductivity type semiconductor material layer located over the active region, a transparent conductive layer located on the second conductivity type semiconductor material layer and comprising nickel oxide, and a reflector layer located on the transparent conductive layer.

According to another embodiment, a light emitting device comprises a first conductivity type semiconductor material region, an active region located over the first conductivity type semiconductor material region, a second conductivity type semiconductor material layer located over the active region, a gold doped semiconductor region located in the second conductivity type semiconductor material layer, a transparent conductive layer comprising nickel oxide located in contact with the gold doped semiconductor region, and a reflector layer located on the transparent conductive layer.

According to another embodiment, a direct view display device comprises a first light emitting diode bonded to a backplane, and a second light emitting diode bonded to the backplane. The first light emitting diode is configured to emit light of a first peak wavelength and comprises a transparent conductive layer located between a first doped semiconductor layer and an aluminum or silver reflector layer, and the second light emitting diode is configured to emit light of a second peak wavelength longer than the first peak wavelength and comprises a gold reflector layer directly contacting a second doped semiconductor layer.

BRIEF DESCRIPTION OF THE DRAWINGS

FIG. 2A is a plan view of an exemplary structure including a substrate and a patterned growth mask layer according to an embodiment of the present disclosure.

FIG. 2B is a vertical cross-sectional view of the exemplary structure of FIG. 2A.

FIG. 14 is a vertical cross-sectional view of the exemplary structure after attaching a conductive bonding structure according to an embodiment of the present disclosure.

FIG. 15 is a vertical cross-sectional view of the exemplary structure after attaching a backplane according to an embodiment of the present disclosure.

DETAILED DESCRIPTION

As used herein, a "p-plane" means a "pyramid plane," which can by any of the {1$\bar{1}$01} planes in the III-nitride system, a "c-plane" represents a {0001} plane, and an "m-plane" represents any of the {1$\bar{1}$00} planes. Growth rate means layer growth rate along the direction perpendicular to a growth surface when not otherwise specified.

A display device, such as a direct view display can be formed from an ordered array of pixels. Each pixel can include a set of subpixels that emit light at a respective peak wavelength. For example, a pixel can include a red subpixel, a green subpixel, and a blue subpixel. Each subpixel can include one or more light emitting diodes that emit light of a particular wavelength. Each pixel is driven by a backplane circuit such that any combination of colors within a color gamut may be shown on the display for each pixel. The display panel can be formed by a process in which LED subpixels are soldered to, or otherwise electrically attached to, a bond pad located on a backplane. The bond pad is electrically driven by the backplane circuit and other driving electronics.

In the embodiments of the present disclosure, a method for fabrication of a multicolor (e.g., three or more color) direct view display may be performed by using light emitting devices which emit different color light in each pixel. In one embodiment, nanostructure (e.g., nanowire) or bulk (e.g., planar) LEDs may be used. Each LED may have a respective blue, green and red light emitting active region to form blue, green and red subpixels in each pixel. In another embodiment, a down converting element (e.g., red emitting phosphor, dye or quantum dots) can be formed over a blue or green light emitting LED to form a red emitting subpixel. In another embodiment, a blue or green light emitting nanowire LED in each pixel is replaced with a regrown red emitting planar LED, such as an organic or inorganic red emitting planar LED to form a red emitting subpixel.

Figure 1A:
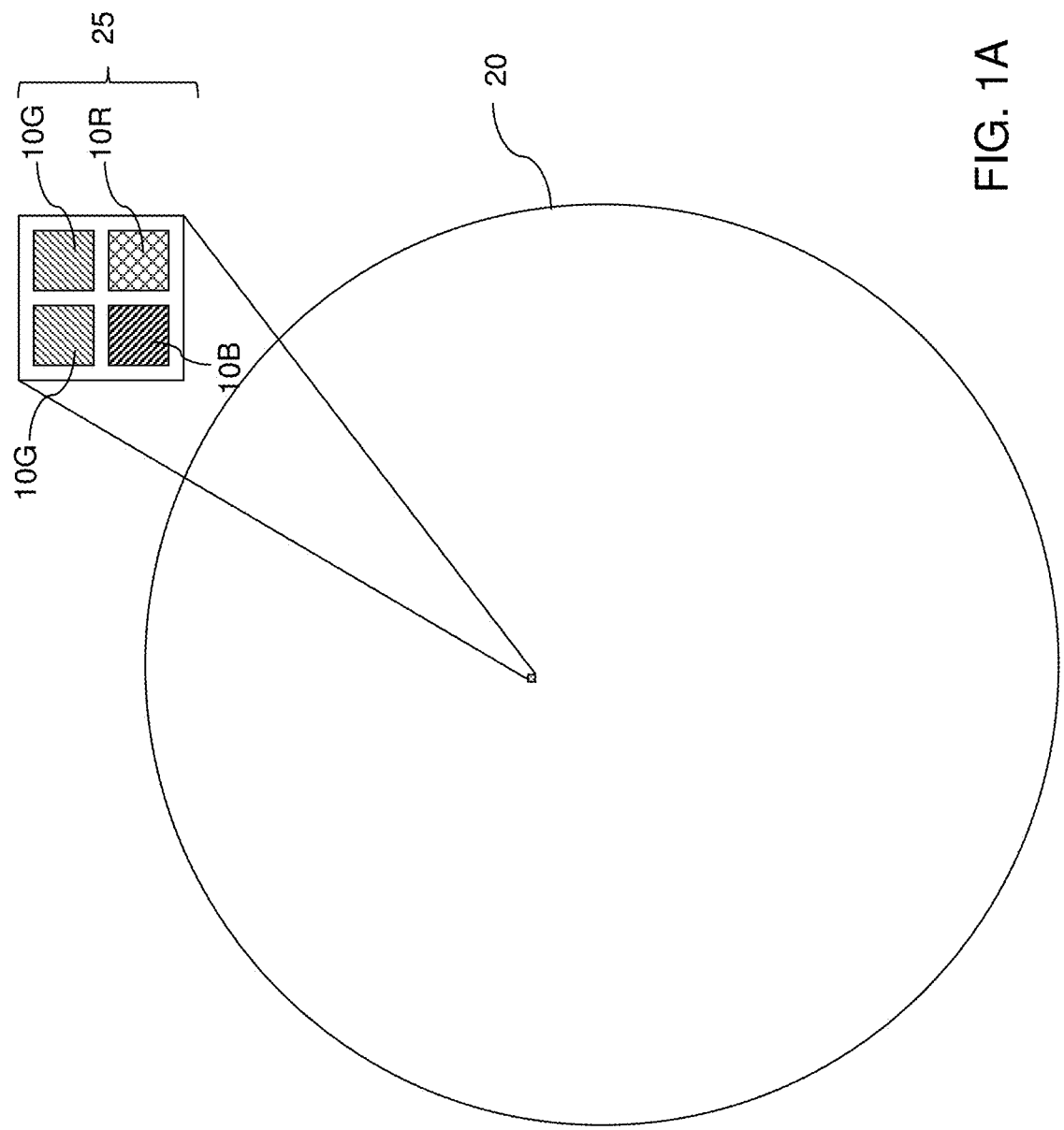
FIG. 1A is a plan view of a substrate with light emitting diodes of multiple colors according to an embodiment of the present disclosure.

FIG. 1A illustrates a substrate 20 on which an array of pixels 25 is fabricated. Each pixel 25 can include a plurality of subpixels (10B, 10G, 10R), each of which includes a cluster of light emitting nanowires configured to emit light at a respective wavelength. Each pixel 25 can include light emitting diodes that emit light at different wavelengths. For example, each pixel 25 can include at least one first-type light emitting diode 10G (such as at least one green-light-emitting diode, for example two green-light-emitting diodes) that emits light at a first peak wavelength (such as a peak wavelength in a range from 495 nm to 570 nm), at least one second-type light emitting diode 10B (such as at least one blue-light-emitting diode) that emits light at a second peak wavelength (such as a peak wavelength in a range from 400 nm to 495 nm), and at least one third-type light emitting diode 10R (such as at least one red-light-emitting diode 10R) that emits light at a third peak wavelength (such as a peak wavelength in a range from 600 nm to 700 nm). The number of each type of light emitting diodes within a pixel 25 can be selected to provide a suitable level of illumination per pixel. For example, plural nanowire LEDs which emit green, blue and red light are formed in each respective green, blue and red light emitting areas of the pixel 25. Optionally, one of the sites in the pixel 25 (e.g., the site of one of the green-emitting LEDs 10G) may be left vacant as a repair site for later attaching a repair LED device to compensate for a defective or non-functioning LED device 10G, 10B or 10R in a particular pixel 25. A vacant site may be employed for one or more additional functionalities for a display device such as touch recognition through use of an infrared photodiode sensor. Methods of forming light emitting diodes having different peak wavelengths on a single semiconductor substrate, i.e., without stacking multiple substrates over one another, is disclosed, for example, in U.S. Pat. No. 9,054,233 B2 to Ohlsson et al, which is incorporated herein by reference in its entirety.

The pixels 25, or a subset of the subpixels (10B, 10G, 10R) can be subsequently transferred to a backplane to provide a direct view display device, as will be described in more detail below. As used herein, a direct view display device refers to a display device in which each pixel 25 includes at least one light source that generates light from within upon application of a suitable electrical bias. Thus, a direct view display device does not require a back light unit or a liquid crystal material. As used herein, a "multicolor" pixel refers to a pixel that can emit light of different peak wavelengths depending on application of electrical bias, and thus, inherently capable of displaying multiple colors.

Figure 1B:
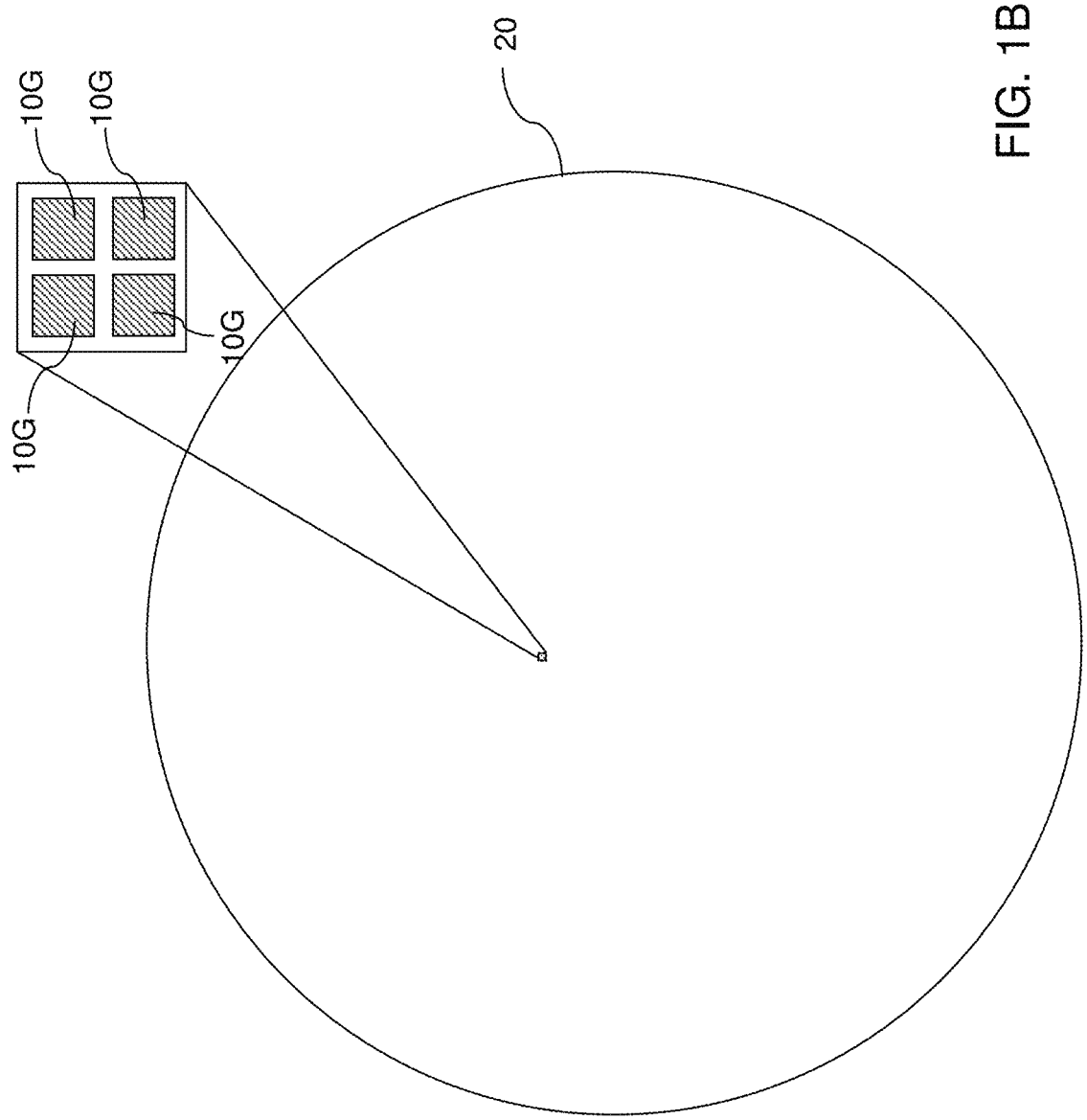
FIG. 1B is a plan view of a substrate with light emitting diodes of a same color according to an embodiment of the present disclosure.

Alternatively, only a single type of subpixels configured to emit light at a same peak wavelength may be formed on a substrate 20 instead of multiple types of subpixels (10B, 10G, 10R). FIG. 1B illustrates a substrate 20 on which only a single type of subpixels 10G (e.g., green light emitting LEDs) is formed. In this case, multiple substrates 20 can be employed as sources for multiple types of subpixels. For example, a first substrate can include subpixels 10G of a first type that emit light at a first wavelength, a second substrate can include subpixels 10B of a second type that emit light at a second wavelength (e.g., blue light emitting LEDs), and so on (e.g., third substrate can include subpixels 10R of a third type that emit light at a third wavelength, such as red light emitting LEDs).

Referring to FIGS. 2A and 2B, an exemplary structure is illustrated, which is an in-process structure for fabricating monolithic multicolor pixels 25 or single color subpixels (10B, 10G or 10R) on the substrate 20, such as an initial growth substrate. As used herein, an "in-process" structure refers to a structure that is subsequently modified to make a final structure. The exemplary structure can include a stack, from bottom to top, of a support substrate 22, an optional buffer layer 24, and a doped compound semiconductor layer 26. The support substrate 22 can include a single crystalline material layer that functions as a template for growing a single crystalline semiconductor material of the buffer layer 24. Any single crystalline material layer can be employed for the support substrate 22 provided that epitaxial growth of a compound semiconductor material, such as a III-V compound semiconductor material, from the top surface of the single crystalline material layer is possible. The support substrate 22 can include a single crystalline material such as $Al_2O_3$ (sapphire) using either basal plane or r-plane growing surfaces, diamond, Si, Ge, GaN, AlN, SiC in both wurtzite ($\alpha$) and zincblende ($\beta$) forms, InN, GaP, GaAsP, GaAs, InP, ZnO, ZnS, and ZnSe. For example, the support substrate 22 can include sapphire (i.e., single crystalline aluminum oxide) with a suitable surface orientation.

The support substrate 22 may comprise a patterned sapphire substrate (PSS) having a patterned (e.g., rough) growth surface. Bumps, dimples, and/or angled cuts may, or may not, be provided on the top surface of the support substrate 22 to facilitate epitaxial growth of the single crystalline compound semiconductor material of the buffer layer, to facilitate separation of the buffer layer 24 from the support substrate 22 in a subsequent separation process and/or to improve the light extraction efficiency through the buffer layer 24. If bumps and/or dimples are provided on the top surface of the support substrate 22, the lateral dimensions of each bump or each dimple can be in a range from 1.5 micron to 6 micron although lesser and greater lateral dimensions can also be employed. The center-to-center distance between neighboring pairs of bumps or dimples can be in a range from 3 microns to 15 microns, although lesser and greater distances can also be employed. Various geometrical configurations can be employed for arrangement of the bumps or dimples. The height of the bumps and/or the depth of the dimples may be in on the order of 1 microns to 3 microns, although lesser and greater heights and/or depths can also be employed.

The buffer layer 24 includes a single crystalline compound semiconductor material such as a III-V compound semiconductor material, for example a Group III-nitride compound semiconductor material. The deposition process for forming the buffer layer 24 can employ any of metalorganic vapor phase epitaxy (MOVPE), molecular beam epitaxy (MBE), hydride vapor phase epitaxy (HVPE), liquid phase epitaxy (LPE), metal-organic molecular beam epitaxy (MOMBE), and atomic layer deposition (ALD). The buffer layer 24 can have a constant or a graded composition such that the composition of the buffer layer 24 at the interface with the support substrate 22 provides a substantial lattice matching with the two-dimensional lattice structure of the top surface of the support substrate 22. The composition of the buffer layer 24 can be gradually changed during the deposition process. If a PSS support substrate 22 is used, then the bottom surface of the buffer layer 24 may be a patterned (i.e., rough) surface.

The materials that can be employed for a bottom portion of the buffer layer 24 can be, for example, $Ga_{1-w-x}In_wAl_xN$ in which w and x range between zero and less than one, and can be zero (i.e., GaN) and are selected to match the lattice constant of the top surface of the support substrate 22. Optionally, As and/or P may also be included in the material for the bottom portion of the buffer layer, in which case the bottom portion of the buffer layer 24 can include $Ga_{1-w-x}In_wAl_xN_{1-x-z}As_yP_z$ in which y and z between zero and less than one, that matches the lattice constant of the top surface of the support substrate 22. The materials that can be employed for an top portion of the buffer layer 24 include, but are not limited to, III-V compound materials, including III-nitride materials, such as gallium nitride (GaN), aluminum nitride (AlN), indium nitride (InN), gallium aluminum nitride, and gallium indium nitride, as well as other III-V materials, such as gallium phosphide (GaP), gallium arsenide (GaAs), gallium antimonide (GaSb), Indium phosphide (InP), indium arsenide (InAs), and indium antimonide (InSb).

The composition of the buffer layer 24 can gradually change between the bottom portion of the buffer layer 24 and the top portion of buffer layer 24 such that dislocations caused by a gradual lattice parameter change along the growth direction (vertical direction) does not propagate to the top surface of the buffer layer 24. In one embodiment, a thin bottom portion of the buffer layer 24 less than 1 micron in thickness may be undoped or doped at a low concentration of silicon.

A high quality single crystalline surface with low defect density can be provided at the top surface of the buffer layer 24. Optionally, the top surface of the buffer layer 24 may be planarized to provide a planar top surface, for example, by chemical mechanical planarization. A suitable surface clean process can be performed after the planarization process to remove contaminants from the top surface of the buffer layer 24. The average thickness of the buffer layer 24 may be in a range from 2 microns to 20 microns, although lesser and greater thicknesses can also be employed.

The doped compound semiconductor layer 26 is subsequently formed directly on the top surface of the buffer layer 24. The doped compound semiconductor layer 26 includes a doped compound semiconductor material having a doping of a first conductivity type. The first conductivity type can be n-type or p-type. In one embodiment, the first conductivity type can be n-type.

The doped compound semiconductor layer 26 can be lattice matched with the single crystalline compound semiconductor material of the top portion of the buffer layer 24. The doped compound semiconductor layer 26 may, or may not, include the same compound semiconductor material as the top portion of the buffer layer 24. In one embodiment, the doped compound semiconductor layer 26 can include an n-doped direct band gap compound semiconductor material. In one embodiment, the doped compound semiconductor layer 26 can include n-doped gallium nitride (GaN). The deposition process for forming doped compound semiconductor layer 26 can employ any of metalorganic vapor phase epitaxy (MOVPE), molecular beam epitaxy (MBE), hydride vapor phase epitaxy (HVPE), liquid phase epitaxy (LPE), metal-organic molecular beam epitaxy (MOMBE), and atomic layer deposition (ALD). The thickness of the doped compound semiconductor layer 26 can be in a range from 100 nm to 2 microns, although lesser and greater thicknesses can also be employed.

A patterned growth mask layer 42 can be formed on the top surface of the substrate 20 (e.g., on top of the doped compound semiconductor layer 26). The patterned growth mask layer 42 can be formed, for example, by depositing a dielectric material layer and patterning the dielectric material layer to form openings 43 therein. For example, a silicon nitride layer, a silicon oxide layer, or a dielectric metal oxide layer (such as an aluminum oxide layer) can be formed on the top surface of the substrate 20. In one embodiment, the dielectric material layer can include a silicon nitride layer. The thickness of the dielectric material layer can be in a range from 3 nm to 100 nm, although lesser and greater thicknesses can also be employed.

A photoresist layer (not shown) can be applied over the top surface of the dielectric material layer, and can be lithographically patterned to form openings therethrough by lithographic exposure and development. In one embodiment, the openings in the photoresist layer can be formed as a two-dimensional periodic array. The size and shape of each opening can be selected to optimize the shape and size of nanowires to be subsequently formed. The pattern of the openings in the photoresist layer can be transferred through the dielectric material layer to form the patterned growth mask layer 42. The photoresist layer can be subsequently removed, for example, by ashing.

The patterned growth mask layer 42 includes openings 43, which may, or may not, be arranged as a two-dimensional periodic array. The shape of each opening 43 may be circular, elliptical, or polygonal (such as hexagonal). A portion of the top surface of the doped compound semiconductor layer 26 is physically exposed underneath each opening 43 through the patterned growth mask layer 42.

The maximum dimension of each opening 43 (which may be a diameter, a major axis, or a diagonal dimension) may be in a range from 5 nm to 500 nm (such as from 10 nm to 250 nm), although lesser and greater dimensions may also be employed. The nearest neighbor distance within the periodic array of openings 43 can be in a range from 100 nm to 10 microns, such as from 500 nm to 1 micron, although lesser and greater nearest neighbor distances can also be employed.

While only a region of the exemplary structure is illustrated herein, it is understood that the exemplary structure can laterally extend along two independent horizontal directions as a two-dimensional array. The exemplary pattern illustrated in FIG. 2A may be repeated across a region of the substrate 20, or across the entirety of the substrate 20. Thus, multiple instances of the illustrated structures in the drawings can be formed in the exemplary structure.

Figure 3:
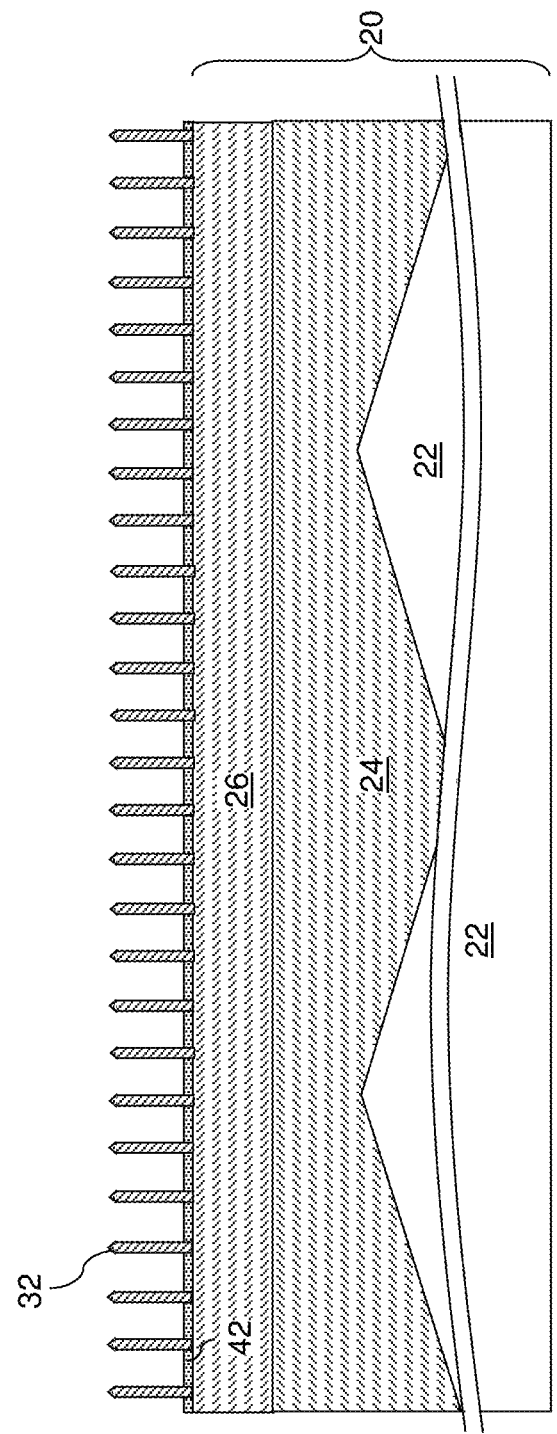
FIG. 3 is a vertical cross-sectional view of the exemplary structure after formation of nanowire cores according to an embodiment of the present disclosure.

Referring to FIG. 3, an array of nanowires cores 32 is grown through the openings 43 in the patterned growth mask layer 42. Each nanowires core 32 includes a doped compound semiconductor material having a doping of the first conductivity type, i.e., the conductivity type of doping of the doped compound semiconductor layer 26. The material of the nanowires cores 32 may be the same as, or may be different from, the material of the doped compound semiconductor layer 26. In one embodiment, the first conductivity type can be n-type, and each nanowires core 32 includes an n-doped compound semiconductor material such as III-nitride compound semiconductor material, for example n-doped gallium nitride. Alternatively, any other suitable III-V or II-VI material may be used.

Each of the nanowire cores 32 can be formed with a set of substantially vertical sidewalls and a tip portion having angled facets, i.e., facets that are not horizontal and not vertical (i.e., not parallel or perpendicular to the top surface of the substrate 20). The nanowires cores 32 can be grown, for example, by selective epitaxial growth of an n-doped compound semiconductor material. The process parameters of the selective epitaxial growth process can be selected such that an n-doped compound semiconductor material grows upward with substantially vertical sidewalls having an m-plane outer surface and angled facets having a p-pane outer surface from each opening 43 through the patterned growth mask layer 42. Methods for growing the nanowires cores 32 through the openings 43 in the patterned growth mask layer 42 with substantially vertical sidewalls and faceted tip portion are described, for example, in U.S. Pat. No. 8,664,636 to Konsek et al., U.S. Pat. No. 8,669,574 to Konsek et al., U.S. Pat. No. 9,287,443 to Konsek et al., and U.S. Pat. No. 9,281,442 to Romano et al., each of which is assigned to Glo AB and U.S. Pat. No. 8,309,439 to Seifert et al., which is assigned to QuNano AB, all of which are incorporated herein by reference in their entirety. In one embodiment, the height of the nanowires cores 32 can be in a range from 200 nm to 5 microns, although lesser and greater heights can also be employed. In the above described embodiment, the nanowire core growth step occurs through an opening 43 in a mask 42. However, any other suitable nanowire growth regime can be utilized, such as VLS growth using a catalyst particle or other selective growth methods. Thus, the selective nanowire growth is therefore used to merely exemplify rather than limit the invention.

Figure 4:
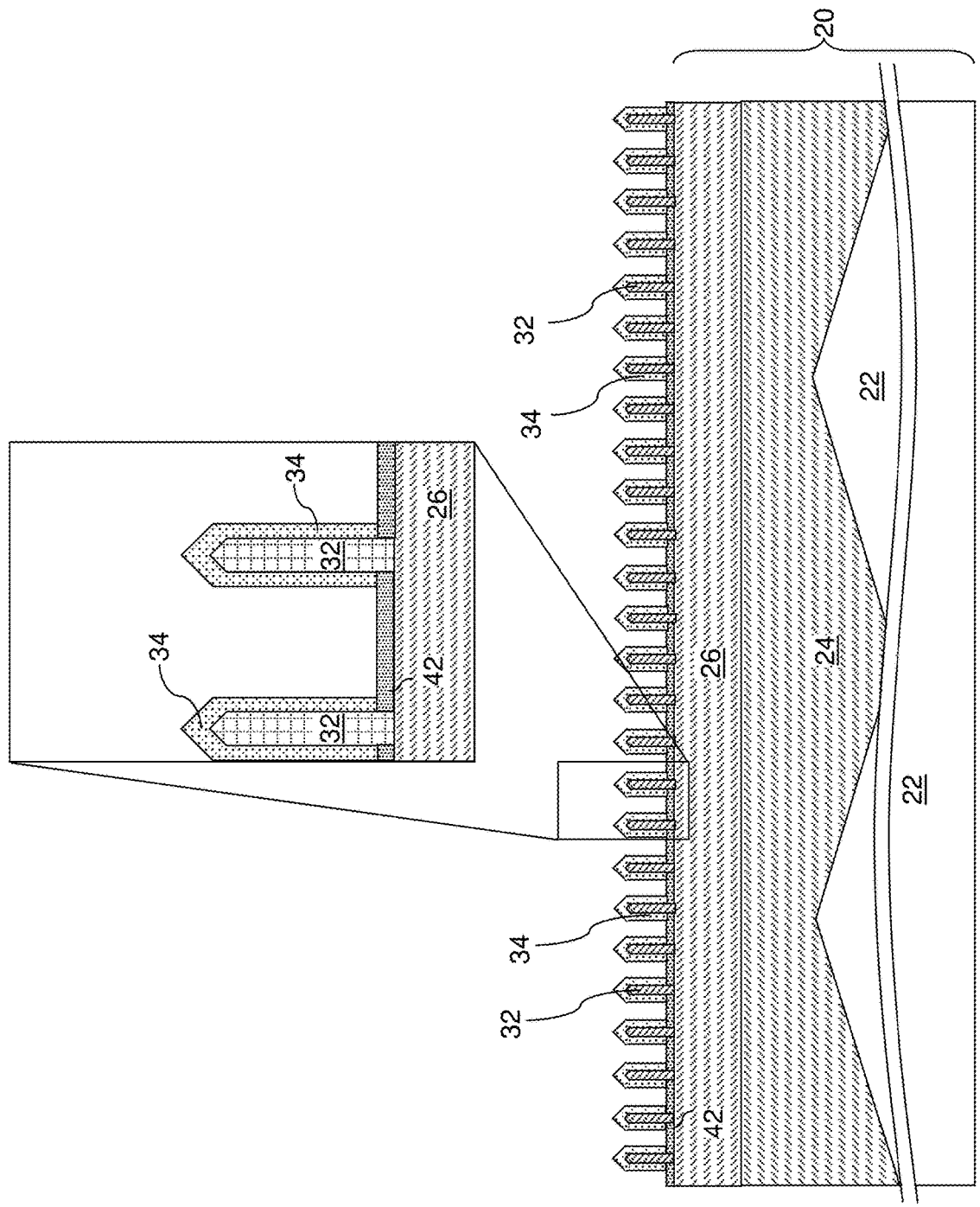
FIG. 4 is a vertical cross-sectional view of the exemplary structure after formation of active shells according to an embodiment of the present disclosure.

Referring to FIG. 4, an active shell 34 is formed on each nanowires core 32. The active shell 34 includes at least one semiconductor material that emits light upon application of a suitable electrical bias. For example, each active shell 34 can include a single or a multi-quantum well (MQW) structure that emits light upon application of an electrical bias thereacross. For example, the quantum well(s) may comprise indium gallium nitride well(s) located between gallium nitride or aluminum gallium nitride barrier layers. Alternatively, the active shell 34 can include any other suitable semiconductor layers or stack of layers for light emitting diode applications provided that it can be grown on the surfaces of the nanowires cores 32. The set of all layers within an active shell 34 is herein referred to as an active layer. The active shell may emit any color light, such as blue, green or red light.

A selective epitaxy process can be employed to grow the active shells 34. The process parameters of the selective epitaxy process can be selected such that the active shells 34 are grown as conformal structures having a same thickness throughout. In another embodiment, the active shells 34 can be grown as a pseudo-conformal structure in which the vertical portions have the same thickness throughout, and faceted portions over the tips of the nanowires cores 32 have thicknesses that differ from the thickness of the vertical portions. Methods for growing the active shells 34 on the nanowires cores 32 are described, for example, in U.S. Pat. No. 8,664,636 to Konsek et al., U.S. Pat. No. 8,669,574 to Konsek et al., U.S. Pat. No. 9,287,443 to Konsek et al., and U.S. Pat. No. 9,281,442 to Romano et al., each of which is assigned to Glo AB and U.S. Pat. No. 8,309,439 to Seifert et al., which is assigned to QuNano AB, all of which are incorporated herein by reference in their entirety. In one embodiment, the outer surfaces of the active shells 34 can include vertical faceted surfaces (i.e., vertical sidewalls) that extend perpendicular to the top surface of the doped compound semiconductor layer 26, and tapered faceted surfaces (i.e., tapered sidewalls) located at a tip of each semiconductor nanowire (32, 34) within the array of semiconductor nanowires and adjoined to an upper edge of a respective one of the vertical faceted surfaces. In one embodiment, the vertical faceted surfaces of the active shells 34 can include crystallographic m-planes, and the tapered faceted surfaces of the active shells 34 can include crystallographic p-planes.

The thickness of the vertical portions of the active shells 34 can be selected such that the active shells 34 do not merge among one another. The thickness of the vertical portions of the active shells 34 (as measured horizontally along a radial direction) can be in a range from 100 nm to 1 micron, although lesser and greater thicknesses can also be employed. Each active shell 34 includes an active light emitting layer. The composition of the active shells 34 can be selected to emit light at a desired peak wavelength by changing the composition and strain of the active shells 34. The active shells 34 can have the same composition and emit light of the same peak wavelength. Alternatively, multiple regions can be provided, which have different shapes, sizes, and/or inter-opening spacing for the openings 43. In this case, the active shells 34 can with different compositions depending on the shapes, sizes, and/or inter-opening spacing for the openings 43 within each of the multiple regions. The different compositions for the active shells 34 can be advantageously employed to fabricate multiple types of light emitting diodes, each emitting light at a respective peak emission wavelength.

Each set of a nanowires core 32 and an active shell 34 that contacts, surrounds, and overlies the nanowires core 32 constitutes a nanowire (32, 34). While nanowires are described as an embodiment of the nanostructure, other nanostructures, such as nanopyramids, can also be used. The nanowires (32, 34) can be formed as a two-dimensional array having periodicity along two independent directions. Each growth region for the nanowires (32, 34) includes at least one subpixel (10G, 10B or 10R) of the direct view display device. Each nanowire (32, 34) within the array extends vertically from the top surface of the doped compound semiconductor layer 26. Each nanowire (32, 34) within the array includes a nanowire core 32 having a doping of the first conductivity type and an active shell 34 including a preferably undoped or intrinsic active layer which emits light upon application of electrical bias therethrough.

Figure 5:
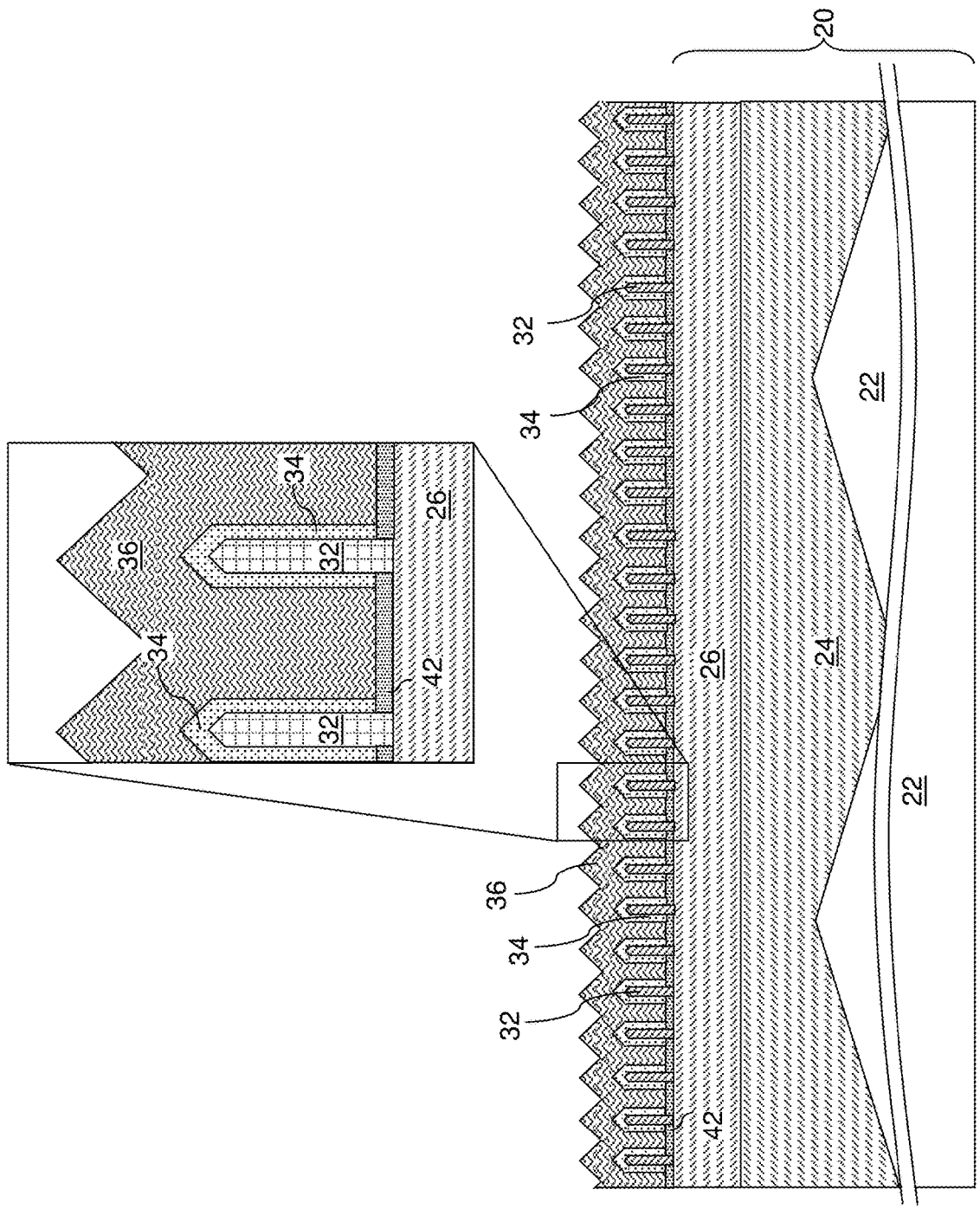
FIG. 5 is a vertical cross-sectional view of the exemplary structure after formation of a second conductivity type semiconductor material layer according to an embodiment of the present disclosure.

Referring to FIG. 5, a second conductivity type semiconductor material layer 36 is formed on the sidewalls and faceted outer surfaces of the nanowires (32, 34). The second conductivity type semiconductor material layer 36 includes a doped semiconductor material having a doping of a second conductivity type, which is the opposite of the first conductivity type. For example, if the first conductivity type is n-type, then the second conductivity type is p-type. If the first conductivity type is p-type, then the second conductivity type is n-type.

The second conductivity type semiconductor material layer 36 can include a compound semiconductor material. The compound semiconductor material of the second conductivity type semiconductor material layer 36 can be any suitable semiconductor material, such as p-type III-nitride compound semiconductor material, e.g., gallium nitride and/ or aluminum gallium nitride. In one embodiment, the nanowires cores 32 can include n-doped GaN, and the second conductivity type semiconductor material layer 36 can include p-doped InGaN or GaN.

The second conductivity type semiconductor material layer 36 can be formed by selective deposition of the doped semiconductor material on the outer surfaces of the active regions 34. For example, a selective epitaxy process can be employed.

During the selective deposition process (which can be a selective epitaxy process), discrete semiconductor material portions grow from the outer surfaces of each of the active regions until the discrete semiconductor material portions merge to form the second conductivity type semiconductor material layer 36 as a continuous semiconductor material layer. In other words, duration and deposition rate of the selective deposition process can be selected so that the volumes between neighboring pairs of nanowires (32, 34) are filled with merged vertical portions of the second conductivity type semiconductor material layer 36. For example, the control of when the second type conductivity type semiconductor material meets can be done by controlling the volume of the deposited material (e.g., deposition duration and deposition rate). The desired volume can be achieved by control of individual facet relative growth rates (process parameters such as temperature, pressure, input precursor gas ratios and/or composition of (Al,In,Ga)N material). Upon continued deposition of the doped semiconductor material on the active shells 34, the deposited semiconductor material portions coalesce to form the second conductivity type semiconductor material layer 36 as a continuous layer contacting each active shell 34 within the array of semiconductor nanowires (32, 34). Each continuous cluster of nanowires (32, 34) and the second conductivity type semiconductor material layer 36 comprises at least one in-process subpixel (10G, 10B or 10R) of a direct view display device.

Prior to merging, each of the discrete portions of the deposited doped semiconductor material can grow with faceted surfaces, which can include vertical (e.g., m-plane) faceted surfaces that are parallel to the vertical faceted surfaces of the active region 34 on which a respective doped semiconductor material portion grows, and tapered (e.g., p-plane) faceted surfaces that are parallel to the tapered faceted surface of the active region 34 on which the respective doped semiconductor material portion grows.

The growth rate at various faceted surfaces may be different during the selective epitaxy process. For example, the growth rate from the m-planes prior to merging of the discrete portions of the deposited doped semiconductor material may be in a range of 3-15 times the growth rate from the p-planes prior to merging. Merging of the m-planes between neighboring pairs of deposited doped semiconductor material portions reduces the total area of remaining m-planes abruptly. Thus, the growth rate from the p-planes of the second conductivity type semiconductor material layer 36 (which is a continuous structure including the merged semiconductor material portions) may increase by a factor greater than 1, which can be in a range from 2 to 6 under typical growth conditions).

The second conductivity type semiconductor material layer 36 is deposited on vertical faceted surfaces of the active regions 34 that extend perpendicular to the top surface of the doped compound semiconductor layer 26, and on tapered faceted surfaces provided at a tip of each semiconductor nanowire (32, 34) within the cluster of semiconductor nanowires (32, 34) and adjoined to an upper edge of a respective one of the vertical faceted surfaces. In one embodiment, the second conductivity type semiconductor material layer 36 can include vertical seams at locations that are equidistant from outer sidewalls of a neighboring pair of active light emitting layers of the active shells 34. In some embodiments, the second conductivity type semiconductor material layer 36 can embed optional cavities between neighboring pairs of semiconductor nanowires (32, 34) among the array of semiconductor nanowires with a same cluster. Alternatively, the cavities may not be formed.

The selective deposition of the doped semiconductor material having a doping of the second conductivity type can continue until all vertical faceted surfaces of the second conductivity type semiconductor material layer 36 disappear, i.e., until p-plane faceted sidewalls of the second conductivity type semiconductor material layer 36 extend to the top surface of the growth mask layer 42 around a bottom periphery of the second conductivity type semiconductor material layer 36.

For example, the remaining vertical faceted surfaces of the second conductivity type semiconductor material layer 36 after formation of the vertical seams can include vertical faceted sidewalls that are adjoined among one another to form a continuous periphery that encircles a respective cluster of semiconductor nanowires (32, 34). In this case, the growth of the second conductivity type semiconductor material layer 36 perpendicular to the vertical faceted sidewalls proceeds at least at the growth rate of tapered faceted sidewalls of the second conductivity type semiconductor material layer 36 until the height of each vertical faceted sidewall shrinks to zero. In this case, the growth rate from the m-planes proceeds at least at the rate from the growth rate from p-planes, and typically at a higher growth rate than the growth rate from the p-planes, such as by at least 10%, such as by at least 50%, such as by a factor of 2 or more, until all the m-planes disappear with growth of the second conductivity type semiconductor material layer 36.

The second conductivity type semiconductor material layer 36 includes a horizontally extending portion that continuously extends horizontally and overlies the cluster of nanowires (32, 34) and vertical portions that are located between neighboring pairs of nanowires (32, 34). The horizontally extending portion of the second conductivity type semiconductor material layer 36 contacts faceted surfaces of the nanowires (32, 34) and has a resulting roughened or faceted surface. The horizontally extending portion of the second conductivity type semiconductor material layer 36 overlies the vertical portions of the second conductivity type semiconductor material layer 36. Each vertical portion of the second conductivity type semiconductor material layer 36 can contact a portion of the top surface of the patterned growth mask layer 42 and can be adjoined to the horizontally extending portion of the second conductivity type semiconductor material layer 36. The thickness of the horizontally extending portion of the second conductivity type semiconductor material layer 36 (as measured along the vertical direction) can be in a range from 50 nm to 2 microns, such as from 200 nm to 1 micron, although lesser and greater thicknesses can also be employed.

Each second conductivity type semiconductor material layer 36 over a cluster of semiconductor nanowires (32, 34) (which may be a two-dimensional periodic array of semiconductor nanowires (32, 34) within a corresponding area) contacts sidewalls of each semiconductor nanowire (32, 34) within the cluster. Faceted (e.g., tapered) sidewalls of the second conductivity type semiconductor material layer 36 adjoin a top surface of the growth mask layer 42 around a periphery of the second conductivity type semiconductor material layer 36. In one embodiment, the periphery of the second conductivity type semiconductor material layer 36 that adjoins the top surface of the growth mask layer 42 can have multiple linear segments, such as a set of six linear segments corresponding to six sides of a hexagon if the outer periphery of the cluster has a hexagonal shape in one embodiment. As used herein, a first element adjoins a second element if physical contact between the first and second elements is at least one-dimensional (i.e., includes a curve, a line, or a surface). Alternatively, the cluster can have a rectangular or circular shape. In one embodiment, the periphery is aligned to the underlying material crystal symmetry, such that the non-vertical p-plane facets are aligned at the periphery. This would produce a non-staggered outlined of the cluster, and may provide a tighter packing of the clusters (i.e., reduce the LED pitch). Each second conductivity type semiconductor material layer 36 can be a continuous material layer and contacting all outer surfaces of the active shells 34 of the array of semiconductor nanowires (32, 34) within a respective cluster of semiconductor nanowires (32, 34). In one embodiment, each of the faceted sidewalls of the second conductivity type semiconductor material layer 36 that adjoins the top surface of the growth mask layer 42 is at a same angle with respect the horizontal plane including the top surface of the growth mask layer 42. In one embodiment, the faceted sidewalls of the second conductivity type semiconductor material layer 36 include crystallographic p-planes, and the top surface of the growth mask layer 42 can be parallel to the crystallographic c-planes of the single crystalline structures in the exemplary structure. In one embodiment, each of the faceted sidewalls of the second conductivity type semiconductor material layer 36 extends within a respective two-dimensional plane from the top surface of the growth mask layer 42 to a location overlying a tip of a respective outermost semiconductor nanowire (32, 34) in each cluster.

Figure 6:
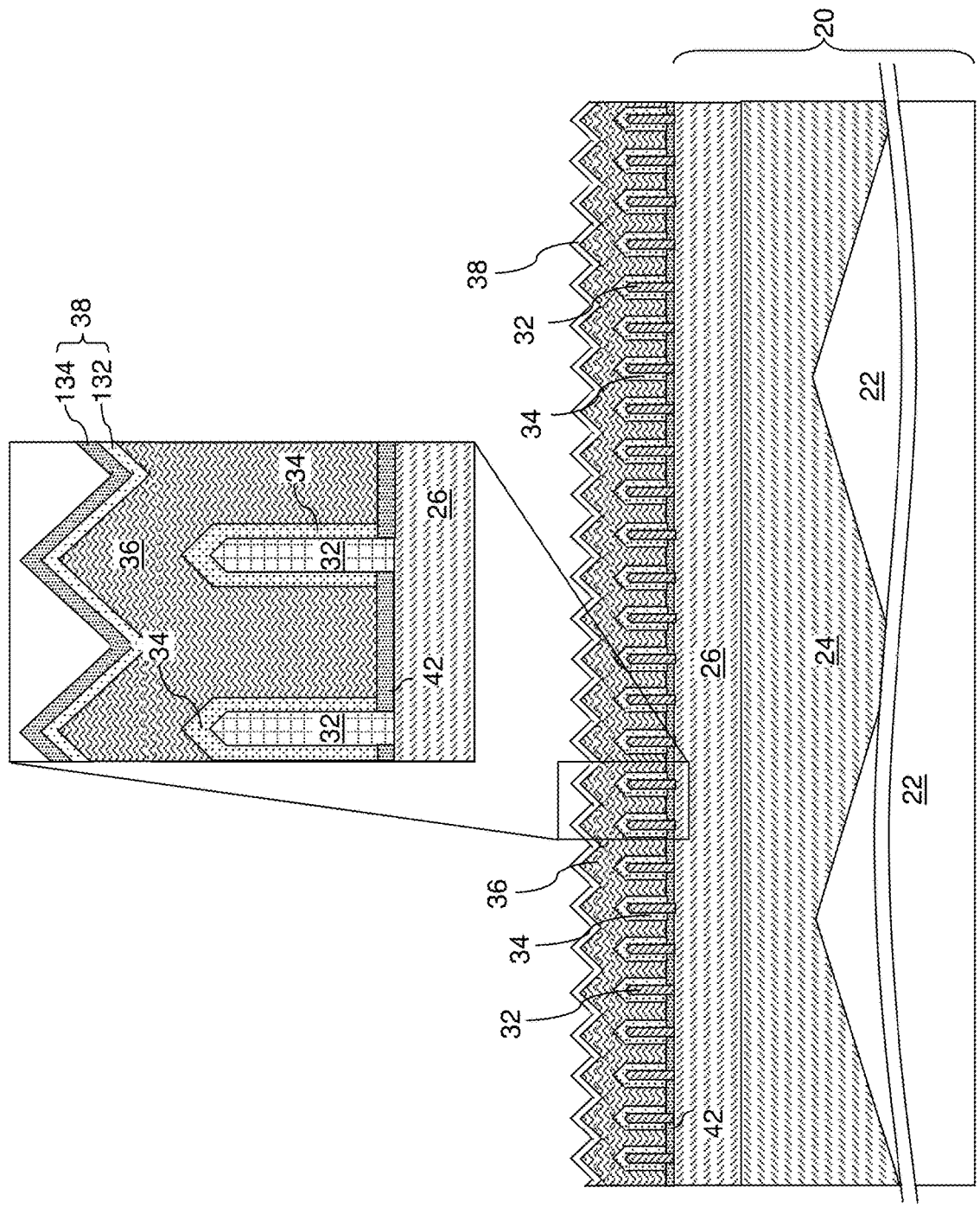
FIG. 6 is a vertical cross-sectional view of the exemplary structure after formation of a transparent conductive layer according to an embodiment of the present disclosure.

Referring to FIG. 6, a transparent conductive layer 38 including at least one transparent metal oxide material on the top surface of the second conductivity type semiconductor material layer 36. The transparent conductive layer 38 can include a stack of multiple transparent conductive layers, or can include a composite of a transition metal oxide and a noble metal. The thickness of the transparent conductive layer 38 can be selected to provide at least 70% transmission (and preferably more than 80% transmission) for the wavelength range of the underlying light emitting diodes.

In one embodiment, the transparent conductive layer 38 can include a stack of at least two transparent conductive layers (132, 134). For example, the transparent conductive layer 38 can include a first transparent conductive metal oxide layer 132 and a second transparent conductive metal layer 134. The stack of at least two transparent conductive layers (132, 134) can be formed, for example, by sequentially depositing a first metal layer including a first elemental metal in vacuum and a second metal layer including a second metal in vacuum without breaking vacuum between beginning of deposition for the first metal and the end of deposition for the second metal. Each of the first transparent conductive metal oxide layer 132 and the second transparent conductive metal layer 134 can be formed as a continuous conformal material layer that extends across the entire area of the second conductivity type semiconductor material layer 36 and having a uniform thickness throughout.

In one embodiment, the first metal can include a transition metal that forms a first transparent conductive metal oxide upon oxidation. For example, the first metal can be a transition metal, such as nickel, and the thickness of the first metal as deposited can be in a range from 1 nm to 10 nm, such as from 2 nm to 5 nm. The second metal can be a noble metal, such as gold, and the thickness of the second metal as deposited can be in a range from 1 nm to 10 nm, such as from 2 nm to 5 nm. The first metal and the second metal can be sequentially deposited in a same vacuum chamber, for example, employing two separate vacuum evaporation sources, such as electron beam evaporation sources. Subsequently, the exemplary structure can be annealed in an oxidizing ambient at an elevated temperature to convert the first metal layer into the first transparent conductive metal oxide layer 132. The oxidizing ambient can include oxygen, air and/or water vapor. In one embodiment, only water vapor can be used as the sole oxidizing ambient. The elevated temperature of the oxidation process can be in a range from 500 degrees Celsius to 850 degrees Celsius, preferably from 550 degrees Celsius to 650 degrees, Celsius although lower and higher temperatures can also be employed. The duration of the oxidation step at the elevated temperature may be in a range from 5 minutes to 200 minutes, such as from 10 minutes to 60 minutes, although shorter and longer oxidation time can also be employed.

In one embodiment, the transparent conductive layer 38 can include a stack of at least two transparent conductive layers comprising a first metal oxide layer 132, such as a nickel oxide-containing layer, and an overlying second noble metal layer 134, such as a gold layer.

In another embodiment, the temperature and duration of the oxidation process can be selected to induce complete interdiffusion of materials between the first metal layer and the second metal layer during the oxidation process. In this case, the transparent conductive layer 38 can include a homogenized metal oxide containing composite layer including a transition metal oxide, such as nickel oxide, and a noble metal, such as gold (i.e., NiO:Au composite having NiO regions and Au regions).

In another embodiment, the temperature and duration of the oxidation process can be selected to induce partial interdiffusion of materials between the first metal layer and the second metal layer during the oxidation process. In this case, the transparent conductive layer 38 can include a graded metal oxide and metal composite layer in which the metal composition has a vertical gradient. Specifically, portions of the transparent conductive layer 38 that is more proximal to the top surface than to the bottom surface may have a higher concentration of the second metal (such as gold) than portions of the transparent conductive layer 38 that is more proximal to the bottom surface than to the top surface. In other words, the concentration of nickel oxide can increase from the bottom surface to or toward the top surface.

Figure 7:
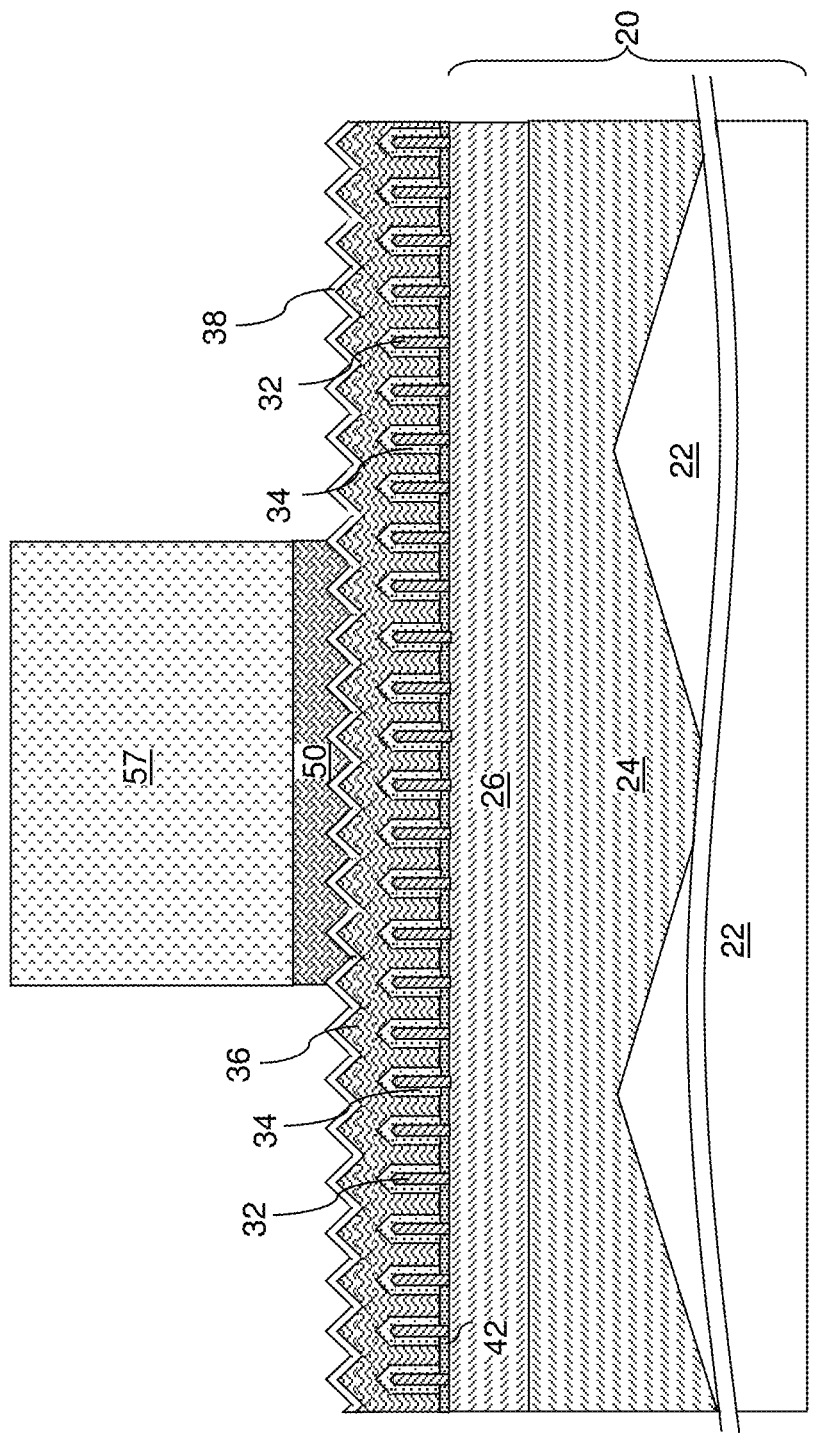
FIG. 7 is a vertical cross-sectional view of the exemplary structure after formation of a top contact electrode according to an embodiment of the present disclosure.

Referring to FIG. 7, a metallic material is deposited on the top surface of the transparent conductive layer 38. The metallic material can include a reflective metal such as aluminum, silver, copper, and/or gold. The metallic material can be deposited, for example, by sputtering. The average thickness of the deposited metallic material can be in a range from 50 nm to 500 nm, although lesser and greater thicknesses can also be employed. A photoresist layer 57 can be applied over the metallic material, and can be lithographically patterned to cover a center portion of each LED (e.g., each sub-pixel) to be subsequently formed. An etch process can be performed to remove unmasked portions of the metallic material employing the photoresist layer 57 as an etch mask. The etch process can be an isotropic etch process or an anisotropic etch process, and may, or may not, be selective to the materials of the transparent conductive layer 38. Each remaining portion of the metallic material that is patterned by the etch process constitutes a top contact electrode 50. The photoresist layer 57 is subsequently removed, for example, by ashing.

Optionally, at least one metallic (i.e., electrically conductive) barrier layer (not shown) can be formed as a component of the top contact electrode 50. In this case, the at least one metallic barrier layer can be located at a top surface of the top contact electrode 50, and can be employed to facilitate subsequent bonding of a solder material over the mesa structures. The at least one metallic barrier layer includes a metal or metal alloy (i.e., metallic) material layers that can be employed for under-bump metallurgy (UBM), i.e., a set of metal layers provide between a conductive bonding structure and a die. In one embodiment, the at least one metallic barrier layer can include a diffusion barrier layer and an adhesion promoter layer. Exemplary materials that can be employed for the diffusion barrier layer include titanium, titanium-tungsten, titanium-platinum or tantalum. Exemplary materials that can be employed for the adhesion promoter layer include tungsten, platinum, or a stack of tungsten and platinum. Any other under-bump metallurgy known in the art can also be employed.

Figure 8:
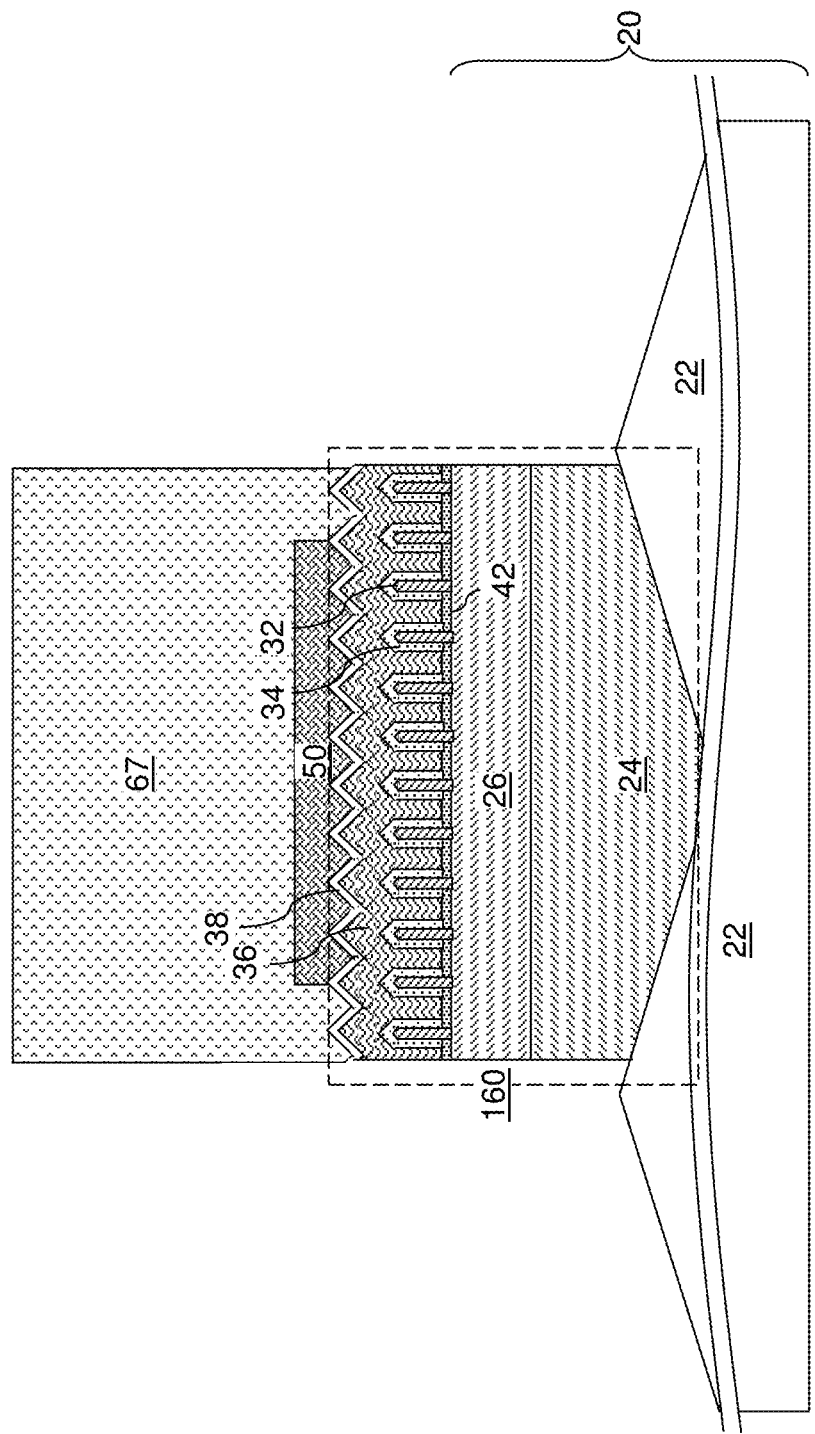
FIG. 8 is a vertical cross-sectional view of the exemplary structure after formation of a mesa structure according to an embodiment of the present disclosure.

Referring to FIG. 8, a photoresist layer 67 can be applied over each top contact electrode 50 and the transparent conductive layer 38, and can be lithographically patterned to cover an entire area of each LED (e.g., each sub-pixel) to be subsequently formed. Preferably, the photoresist layer 67 is wider than the top contact electrode 50 and covers the edges of the top contact electrode 50. An anisotropic etch process can be performed to sequentially etch unmasked portions of the transparent conductive layer 38, the second conductivity type semiconductor material layer 36, the semiconductor nanowires (32, 34), the patterned growth mask layer 42, the doped compound semiconductor layer 26, and the buffer layer 24 employing the photoresist layer 67 as an etch mask. The support substrate 22 can be employed as an etch stop structure. Each set of remaining portions of the transparent conductive layer 38, the second conductivity type semiconductor material layer 36, the semiconductor nanowires (32, 34), the patterned growth mask layer 42, the doped compound semiconductor layer 26, and the buffer layer 24 collectively constitute a mesa structure 160. The sidewalls of the transparent conductive layer 38, the second conductivity type semiconductor material layer 36, the patterned growth mask layer 42, the doped compound semiconductor layer 26, and the buffer layer 24 can be vertically coincident (i.e., located within a same vertical plane) for each mesa structure 160. Alternatively, the above sidewalls may be tapered rather than vertically coincident if a taper etch is used. Sidewalls of the nanowires cores (32, 34), if physically exposed, can be vertically coincident with the sidewalls of the transparent conductive layer 38, the second conductivity type semiconductor material layer 36, the patterned growth mask layer 42, the doped compound semiconductor layer 26, and the buffer layer 24 in a same mesa structure 160. The photoresist layer 67 is subsequently removed, for example, by ashing.

Figure 9:
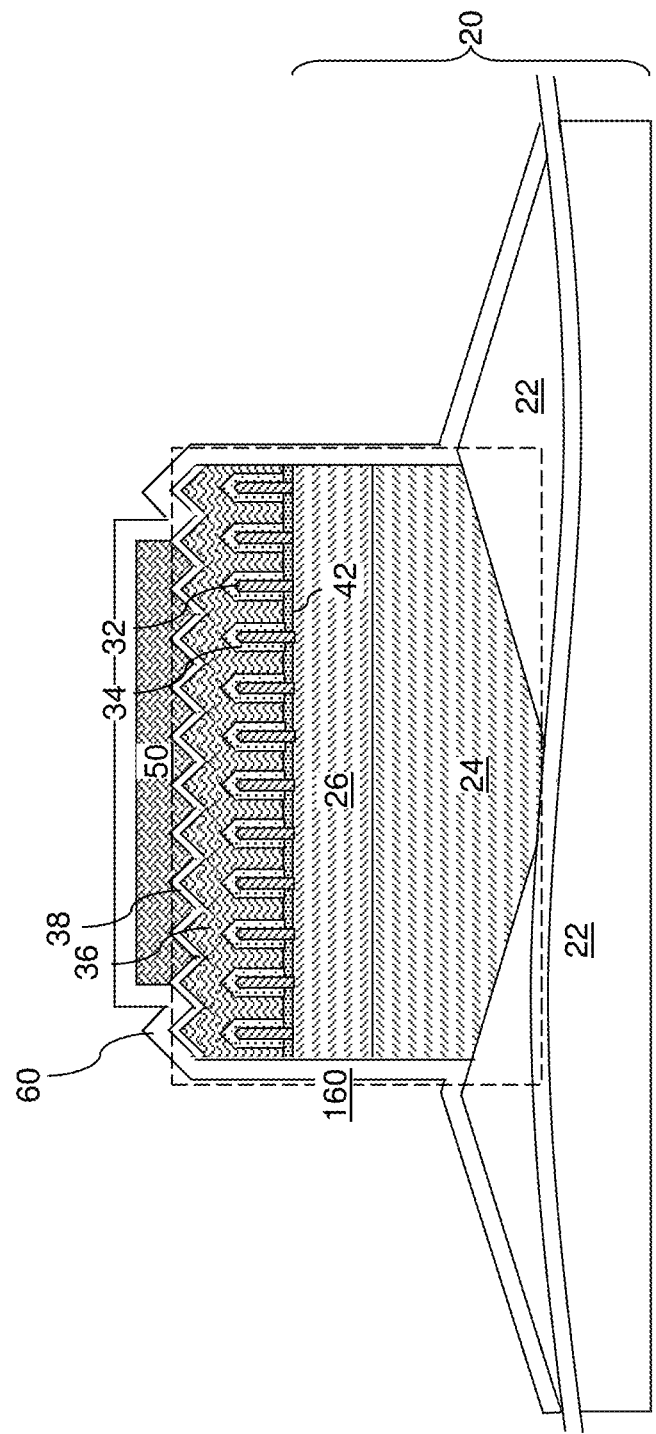
FIG. 9 is a vertical cross-sectional view of the exemplary structure after formation of a dielectric material layer according to an embodiment of the present disclosure.

Referring to FIG. 9, a dielectric material layer 60 may be deposited over the top contact electrode 50, the transparent conductive oxide layer 38 and the second conductivity type semiconductor material layer 36. The dielectric material layer 60 includes a dielectric material such as silicon oxide, silicon nitride, a dielectric metal oxide (such as aluminum oxide), organosilicate glass, or porous variants thereof. The dielectric material layer 60 can be transparent and can be deposited by a conformal deposition method (such as low pressure chemical vapor deposition (LPCVD) or atomic layer deposition (ALD)) or by a non-conformal deposition method (such as plasma enhanced chemical vapor deposition (PECVD) or physical vapor deposition (such as sputtering or e-beam deposition).

The dielectric material layer 60 can be formed over each mesa structure 160 containing the second conductivity type semiconductor material layer 36 and around each remaining group of nanowires (32, 34), and encapsulates each mesa structure 160 in combination with the support substrate 22. In one embodiment, at least one remaining group of nanowires (32, 34) in the mesa structure 160 can constitute an array of nanowires (32, 34). In one embodiment, the dielectric material layer 60 can be formed as a conformal material layer, i.e., a layer having a uniform thickness throughout. The thickness of the dielectric material layer 60 can be in a range from 100 nm to 4 microns, such as from 200 nm to 2 microns, although lesser and greater thicknesses can also be employed.

Figure 10:
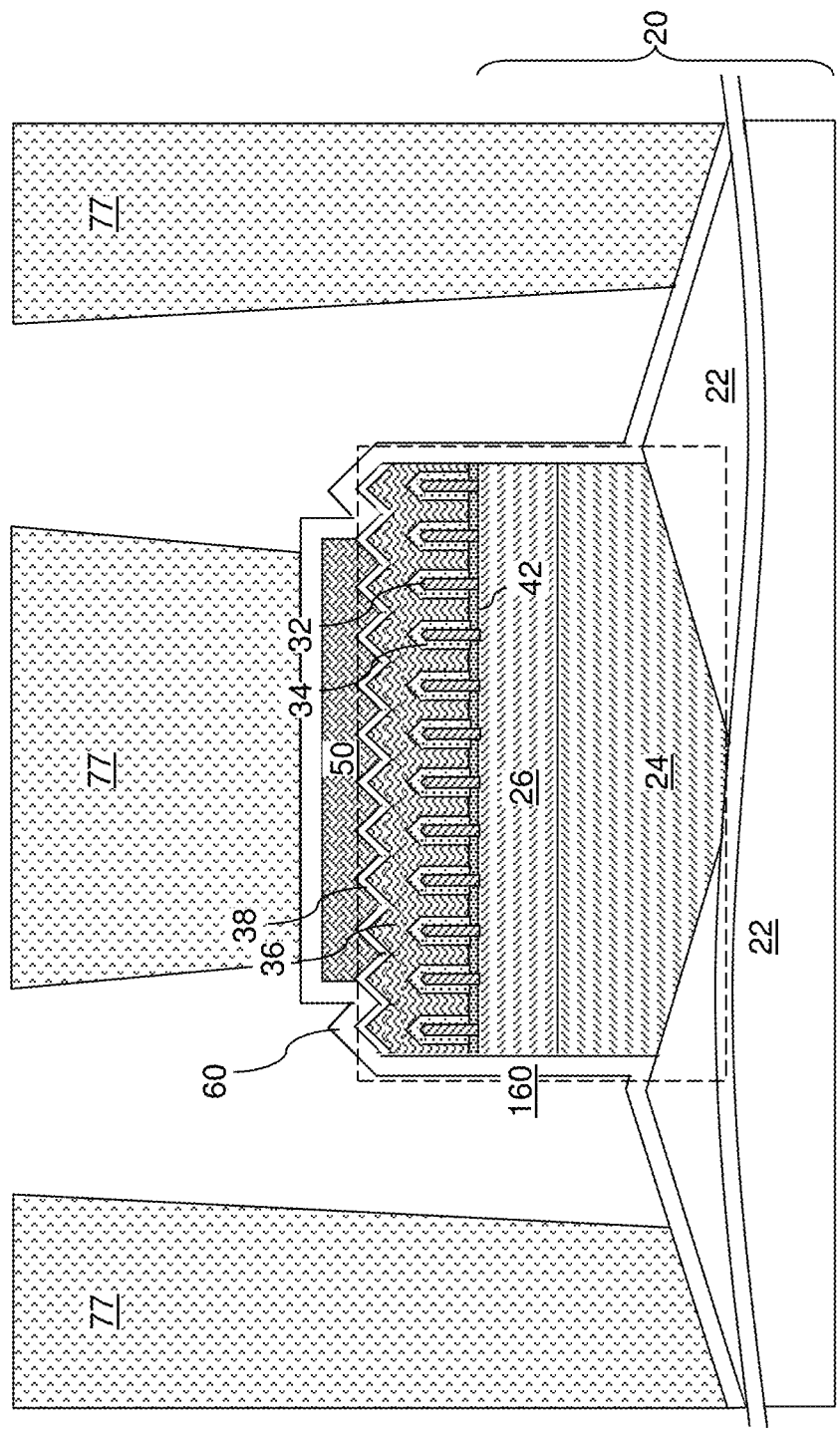
FIG. 10 is a vertical cross-sectional view of the exemplary structure after formation of a patterned photoresist layer according to an embodiment of the present disclosure.

Referring to FIG. 10, a photoresist layer 77 can be applied over the exemplary structure, and can be lithographically patterned to cover a center portion of each mesa structure 160, and not to cover an entire periphery of each mesa structure 160. Portions of the surfaces of the support substrate 22 located between neighboring mesa structures 160 can be covered with the patterned photoresist layer 77. In one embodiment, the uncovered areas of the exemplary structure can include annular regions located at a periphery of each mesa structure 160. The annular regions can have any suitable shape, such as a hollow rectangle (including hollow square), hollow circle, hollow ellipse, hollow hexagon, etc., shape. The annular regions can be laterally spaced from one another by remaining portions of the photoresist layer 77 that cover underlying portions of the support substrate 22. In one embodiment, the sidewalls of the patterned photoresist layer 77 can have a retro-taper to minimize deposition of a metallic material in a subsequent metallic material deposition process.

Figure 11:
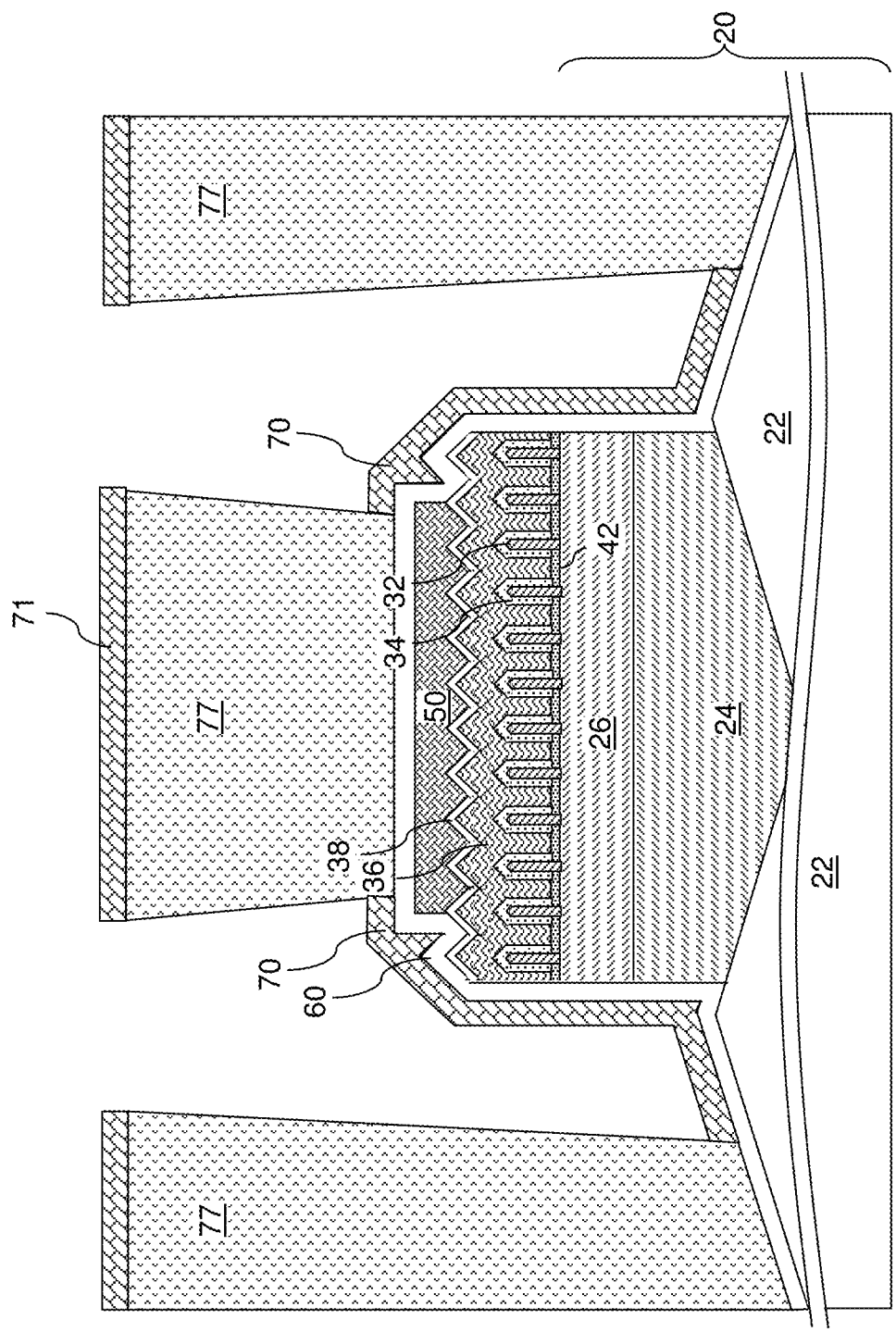
FIG. 11 is a vertical cross-sectional view of the exemplary structure after formation of a reflector structure according to an embodiment of the present disclosure.

Referring to FIG. 11, a reflector material can be deposited over the dielectric material layer 60 in regions that are not covered with the photoresist layer 77. The reflector material can be deposited by a direction deposition method such as vacuum evaporation or physical vapor deposition. Each portion of the reflector material that is deposited directly on the dielectric material layer 60 constitutes a reflector layer 70, which can be topologically homeomorphic to a ring. Each reflector layer 70 may comprise a hollow reflector frame which can have any suitable shape, such as a hollow rectangle (including hollow square), hollow circle, hollow ellipse, hollow hexagon, etc., shape. In one embodiment, each reflector layer 70 includes a reflective material such as a metal. In one embodiment, each reflector layer 70 includes at least one material selected from silver, aluminum, copper, and gold. In one embodiment, the reflector material can be a thin film distributed Bragg reflector (DBR) with small index changes to provide better reflectivity. The reflector material can include at least one conductive material and/or at least one electrically insulating material.

Reflector material portions 71 are formed on the top surfaces of the patterned portions of the photoresist layer 77. The thickness of horizontal portions of the reflector layer 70 can be in a range from 5 nm to 500 nm, such as from 10 nm to 250 nm, although lesser and greater thicknesses can also be employed.

Figure 12:
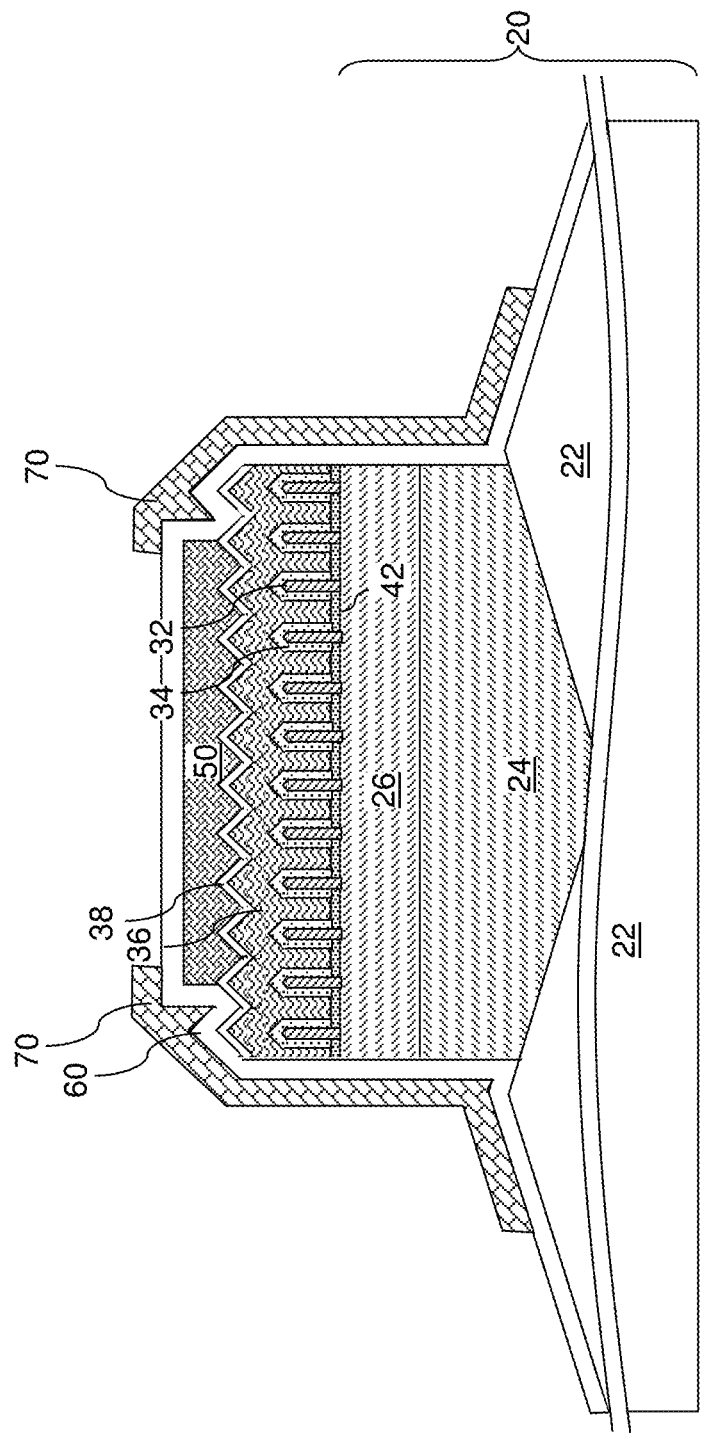
FIG. 12 is a vertical cross-sectional view of the exemplary structure after removal of the patterned photoresist layer according to an embodiment of the present disclosure.

Referring to FIG. 12, the remaining portions of the photoresist layer 77 and the reflector material portions 71 thereupon can be lifted off the exemplary structure, for example, by dissolving the photoresist layer 77 in a solvent.

Figure 13:
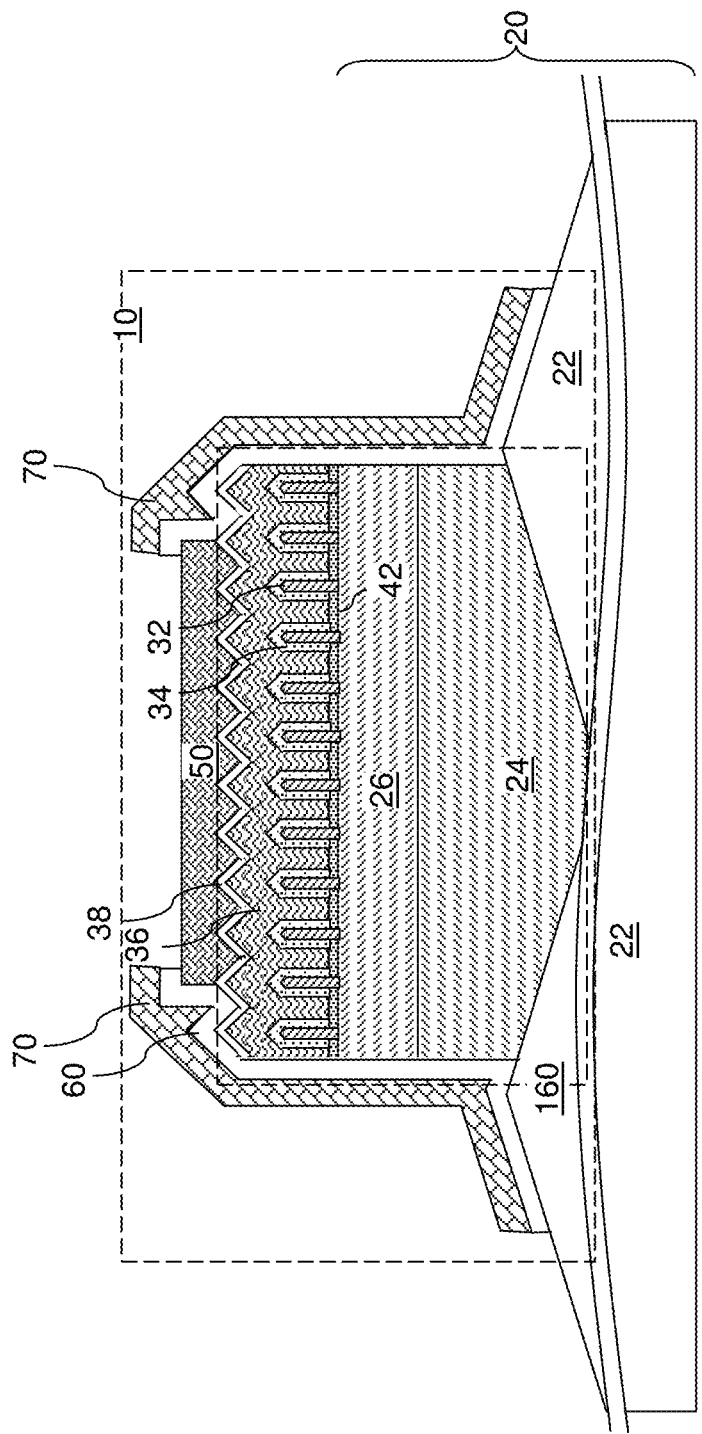
FIG. 13 is a vertical cross-sectional view of the exemplary structure after etching unmasked portions of the dielectric material layer according to an embodiment of the present disclosure.

Referring to FIG. 13, an etch process can be performed to etch unmasked portions of the dielectric material layer 60. The etch process may be an anisotropic etch process or an isotropic etch process. Portions of the dielectric material layer 60 that are not masked by the reflector layers 70 (i.e., the hollow reflector frame) are removed by the etch process. The top surface of each top contact electrode 50 and the top surface of the support substrate 22 are physically exposed in each area that is not covered with the reflector layers 70. A light emitting diode (LED) 10 is provided, which includes a mesa structure 160, a dielectric material layer 60, and a reflector layer 70 having an annular configuration. The LED can have any suitable horizontal cross sectional shape, such as a rectangle (including square), circle, ellipse, hexagon, etc., shape. The top surface of the top contact electrode 50 is physically exposed within a hole in the reflector layer 70, and within a hole in the dielectric material layer 60. The combination of the top contact electrode 50 and the reflector layer 70 form a reflector for each LED 10. Each LED 10 can be subsequently employed as a sub-pixel in a display device.

Referring to FIG. 14, a conductive bonding structure 431 is formed over each mesa structure 160. In one embodiment, the conductive bonding structures 431 can be formed directly on the at least one metallic barrier layer, which can be a topmost layer of the top contact electrode 50. The conductive bonding structures 431 include a solder material, which can include tin, and optionally includes an alloy of tin and silver, gold, copper, bismuth, indium, zinc, and/or antimony. The conductive bonding structures 431 can be formed as solder balls, or can be formed as a layer stack including at least one solder material.

Referring to FIG. 15, a backplane 401 is provided, which includes a backplane substrate 400 and bonding structures 421 located thereupon. A backplane can be an active or passive matrix backplane substrate for driving light emitting devices. As used herein, a "backplane substrate" refers to any substrate configured to affix multiple devices thereupon. The backplane substrate 400 is a substrate onto which various devices (e.g., LEDs) can be subsequently transferred. In one embodiment, the backplane substrate 400 can be a substrate of silicon, glass, plastic, and/or at least other material that can provide structural support to the devices to be subsequently transferred thereupon. In one embodiment, the backplane substrate 400 may be a passive backplane substrate, in which metal interconnect structures 440 comprising metallization lines are present, for example, in a criss-cross grid. In some embodiments, active device circuits (such as field effect transistors) may not be present in the backplane substrate 400. In another embodiment, the backplane substrate 400 may be an active backplane substrate, which includes metal interconnect structures 440 as a criss-cross grid of conductive lines and further includes a device circuitry at one or more intersections of the criss-cross grid of conductive lines. The device circuitry can comprise one or more transistors.

The backplane substrate 400 is disposed facing the substrate 20 (e.g., above, below or side-to-side) and aligned such that the conductive bonding structures 431 face, and contact, a respective one of the bonding structures 421. At least one of the LEDs 10 (i.e., at least one subpixel 10G, 10B or 10R) can be attached to the backplane 401 by inducing bonding between a respective pair of a conductive bonding structure 432 and a bonding structure 421 (which may be a bonding pad) on the backplane 401. Local heating (for example, by laser irradiation) of the respective pair of the conductive bonding structure 432 and the bonding structure 421 can be employed to induce reflow and bonding of the solder material. All, or only a subset, of the LEDs 10 on the substrate 20 can be bonded to the backplane 401, as will be described in more detail below with respect to FIGS. 16A to 16P.

Figure 16A:
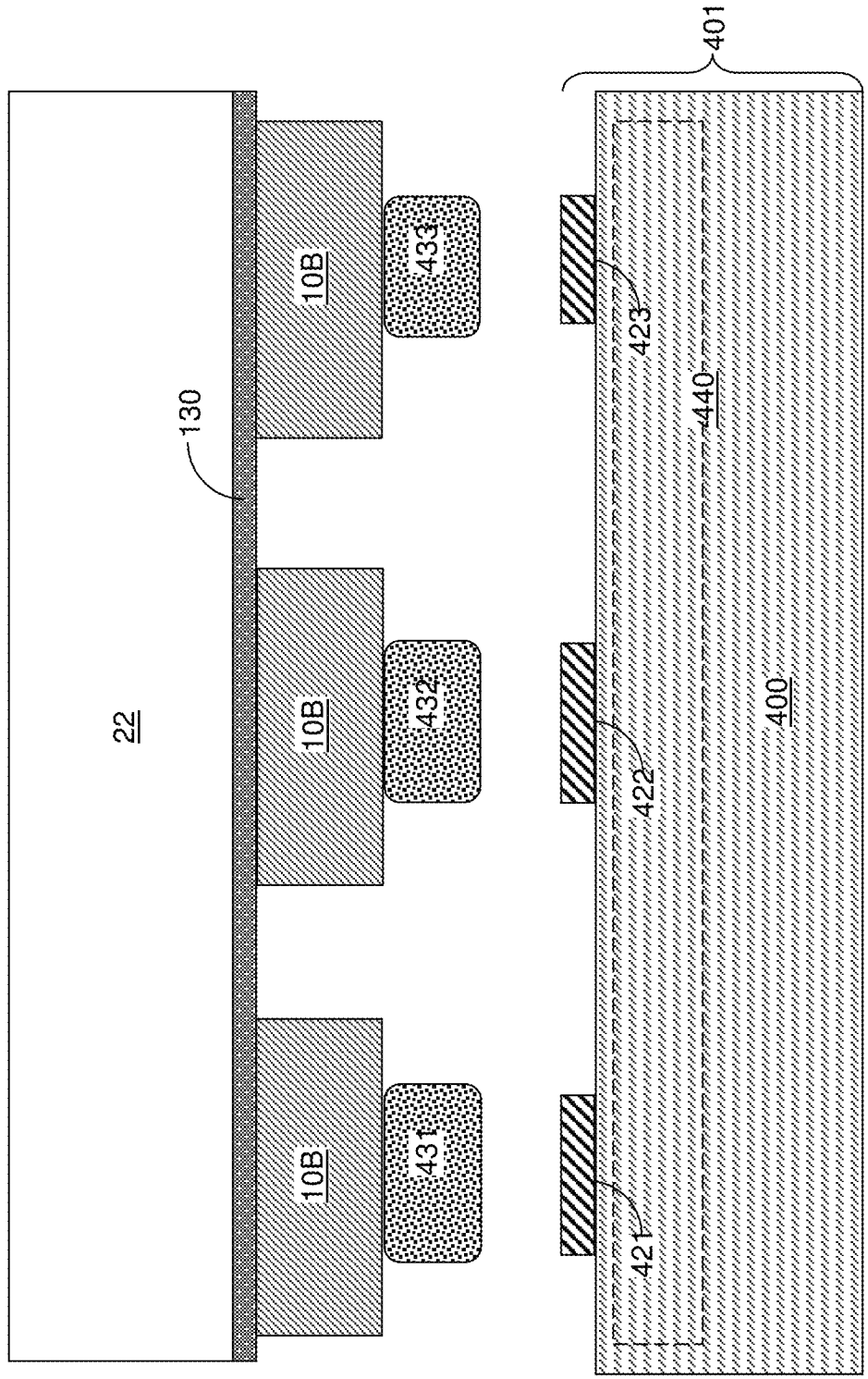
FIGS. 16A to 16P are schematic vertical cross-sectional views of steps in a method of incorporating LEDs into a display panel according to an embodiment of the present disclosure.

In one embodiment, each LED 10 die is subpixel (10B, 10G or 10R) that emits light of a given color, which may be, for example, blue, green, or red. FIGS. 16A-16P illustrate a method of incorporating the LEDs 10, such as a blue, green and/or red light emitting subpixels (10B, 10G, 10R) into a single pixel of direct view display from different growth substrates 20 shown in FIG. 1B. The LEDs 10 can be the nanowire LEDs described above, different nanowire LEDs and/or bulk (i.e., planar) LEDs. Each of the pixels comprises a red-light emitting diode 10R configured to emit light at a peak wavelength in a range from 620 nm to 750 nm, a green-light emitting diode 10G configured to emit light at a peak wavelength in a range from 495 nm to 570 nm, and a blue-light emitting diode 10B configured to emit light at a peak wavelength in a range from 440 to 495 nm.

Referring to FIG. 16A, an in-process structure is illustrated, which can be employed to form an exemplary light emitting device assembly (e.g., direct view display) according to an embodiment of the present disclosure in which the In this embodiment, the backplane substrate 400 may have a substantially planar (i.e., not stepped) upper surface or a stepped upper surface. The bond pads (421, 422, 423) can have the same height or different heights. The conductive bonding structures (431, 432, 433) can have the same height or different heights. The exemplary light emitting device assembly can include the same thickness bonding pads (421, 422, 423) for the respective first, second and third LEDs (10B, 10G, 10R) and the same height for the conductive bonding structures (431, 432, 433). The bond pads (421, 422, 423) can have the same or different composition as each other. The conductive bonding structures (431, 432, 433) can have the same or different composition as each other.

In one embodiment, the conductive bonding structures (431, 432, 433) can be formed on the LEDs 10 to be transferred to the backplane 401. For example, first light emitting diodes 10B can be the first devices to be transferred to the backplane substrate 400. The first light emitting diodes 10B can be located on first support substrate 22, which can be a first transfer substrate or a first-type growth substrate. The conductive bonding structures 431 are formed on a first subset of the first light emitting diodes 10B, for example as described above and include the conductive bonding structure 431. The second conductive bonding structures 432 are formed on a second subset of the first light emitting diodes 10B and the third conductive bonding structures 433 are formed on a third subset of the first light emitting diodes 10B.

In one embodiment, the conductive bonding structures (431, 432, 432) can be substantially spherical, substantially ellipsoidal, or substantially cylindrical. The maximum horizontal dimension (such as the diameter of a spherical shape or a cylindrical shape) of each conductive bonding structures (431, 432, 433) can be in a range from 0.25 microns to 100 microns (such as from 0.5 microns to 1 micron), although lesser and greater maximum horizontal dimensions can also be employed.

Figure 16B:
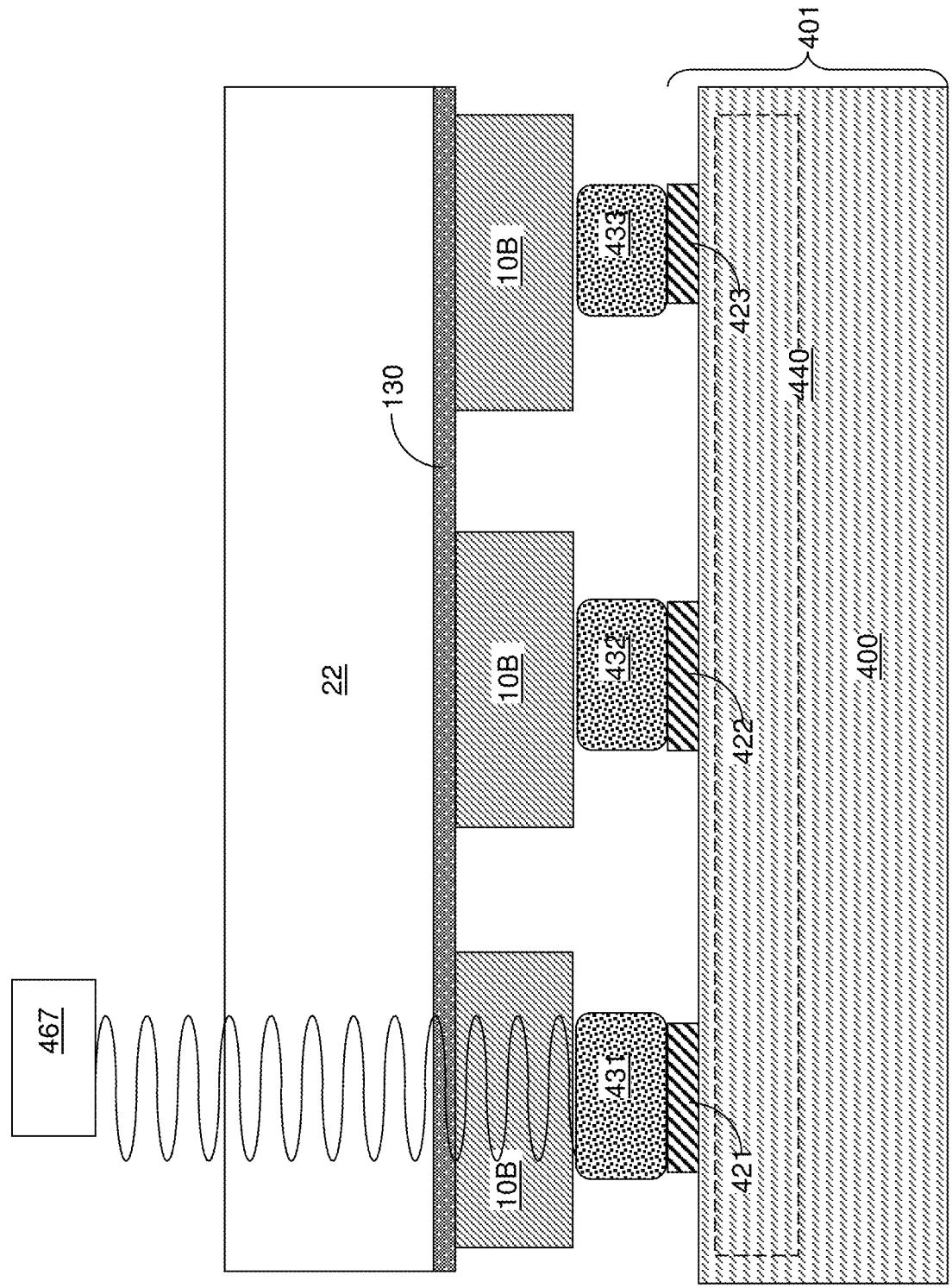

Referring to FIG. 16B, the backplane 401 and the assembly including the first light emitting diodes 10B are positioned such that each conductive bonding structure 431 is attached to one first LED 10B, and contacts the respective bonding pad 421. Each second conductive bonding structure 432 can be attached to the another first LED 10B and contacts the second bonding pad 422. Each third conductive bonding structure 433 is attached to yet another first LED 10R and contacts the third bonding pad 423.

A heating laser 467 can be employed to reflow the first conductive bonding structures 431. The heating laser 467 can have a wavelength that induces greater absorption of energy within the material of the conductive bonding structures (431, 432, 433) than within the materials of the support substrate 22 or within the materials of the devices to be transferred (e.g., the first LEDs 10B). For example, the heating laser 467 can have a wavelength in a range from 0.8 micron to 20 microns, such as 1 to 2 microns, to provide a differential heating between the material of the conductive bonding structures 431 which are to be reflowed and the material of the conductive bonding structures 432, 433 which are not to be reflowed. Differential heating is also provided between the conductive bonding structures 431 and the materials of the support substrate 22 and the devices to be transferred. The first conductive bonding structures 431 can be selectively heated by sequential irradiation of a laser beam from the heating laser 467 to reflow each first conductive bonding structure 431, and to bond each first conductive bonding structure 431 to an overlying first LED 10B and to an underlying first bonding pad 421. Preferably, the laser beam is provided through the support substrate 22. The laser beam may be transmitted through the support substrate 22 and through the devices to the reflector layer 82 which absorbs the laser beam and heats the adjacent conductive bonding structures 431 for selective heating and reflow. Alternatively, the laser beam may be absorbed by the support substrate or the device adjacent to the conductive bonding structures 431 to selectively heat and reflow the conductive bonding structures 431 without reflowing the remaining conductive bonding structures (432, 433).

Figure 16C:
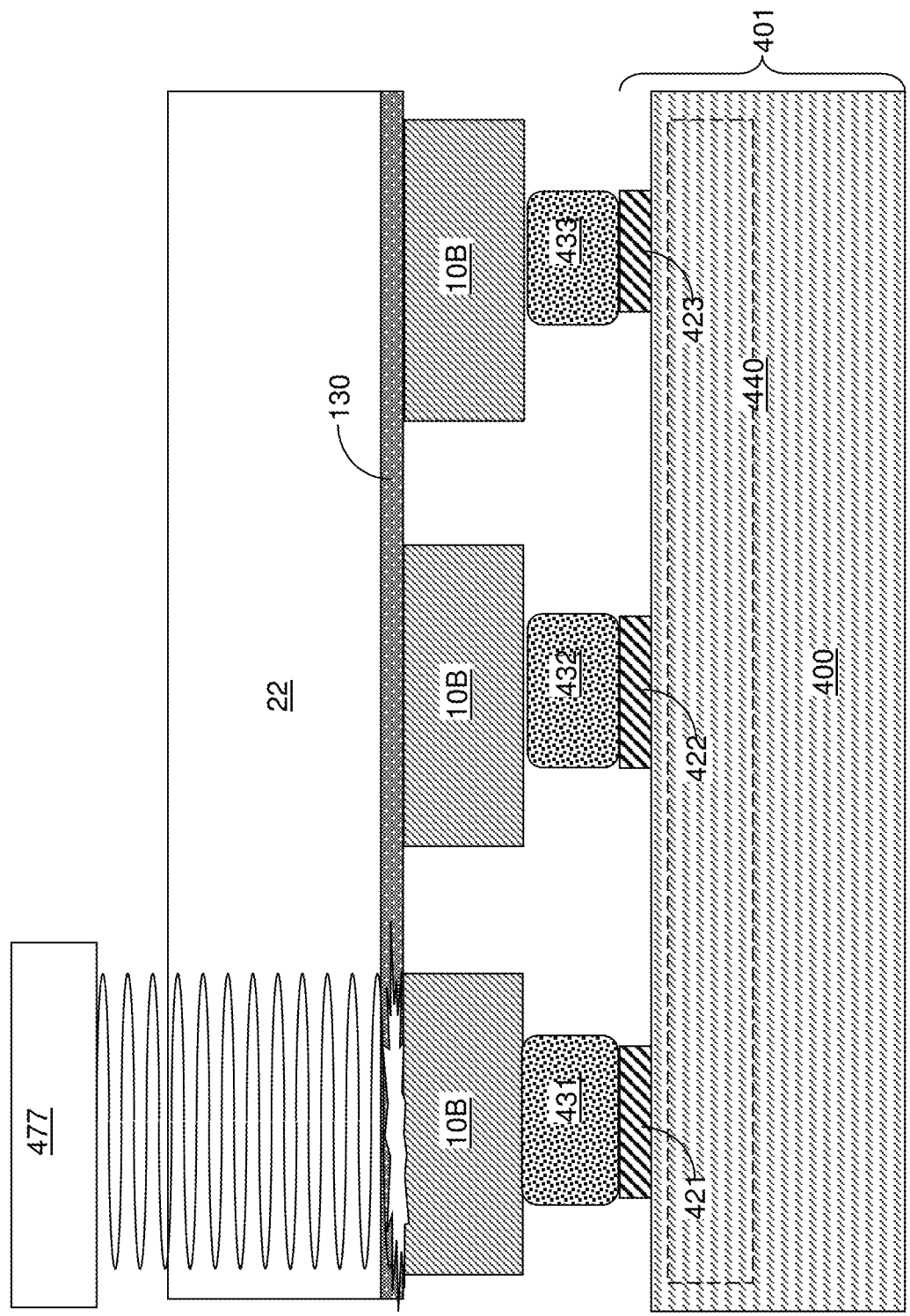

Referring to FIG. 16C, a laser irradiation process is performed to separate each bonded first LED 10B from the first support substrate. The wavelength of the laser 477 (which is herein referred to an "ablation laser") can be different (e.g., shorter) from the wavelength of the heating laser 467, for example between 0.1 and 0.75 micron, such as 0.25 to 0.5 micron. The laser provides more heating to the material of the ablation material layer 130 than to the materials of the support substrate 22 and the transferred devices (e.g., the first light emitting diodes 10B). The ablation material layer 130 may comprise the semiconductor buffer layer 24 (e.g., gallium nitride layer) described above or another material, such as a laser radiation absorptive insulating release layer (e.g., silicon rich silicon nitride layer). Each portion of the ablation material layer 130 overlying the first conductive bonding structures 431 can be sequentially irradiated by a laser beam from the laser 477 to dissociate each underlying first LED 10B.

Figure 16D:
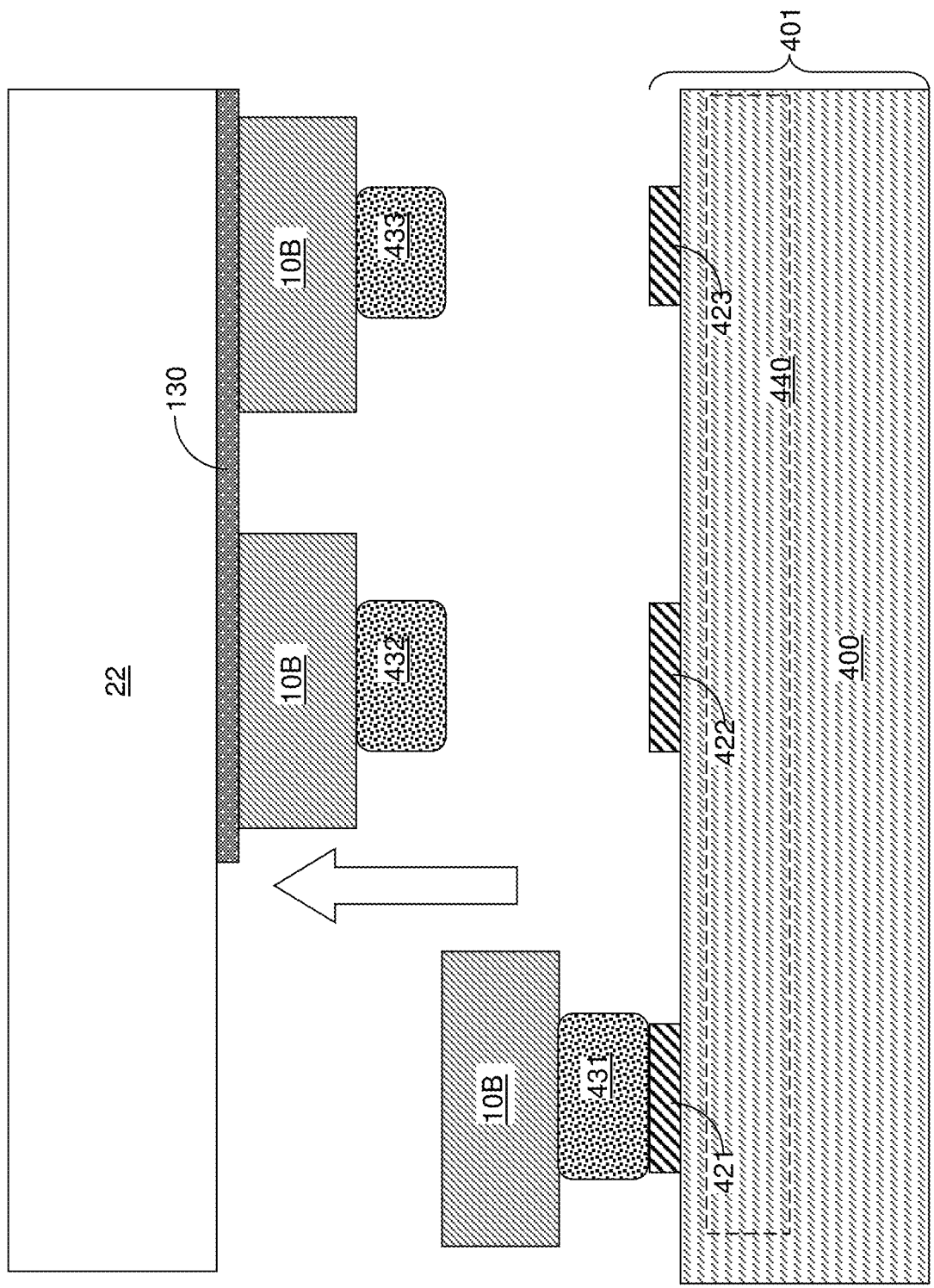

Referring to FIG. 16D, the assembly of the first support substrate 22 and attached first light emitting diodes 10B (i.e., the complement of the first subset of the first light emitting diodes 10B) is separated from the backplane 401 and the first subset of the first light emitting diodes 10B.

Figure 16E:
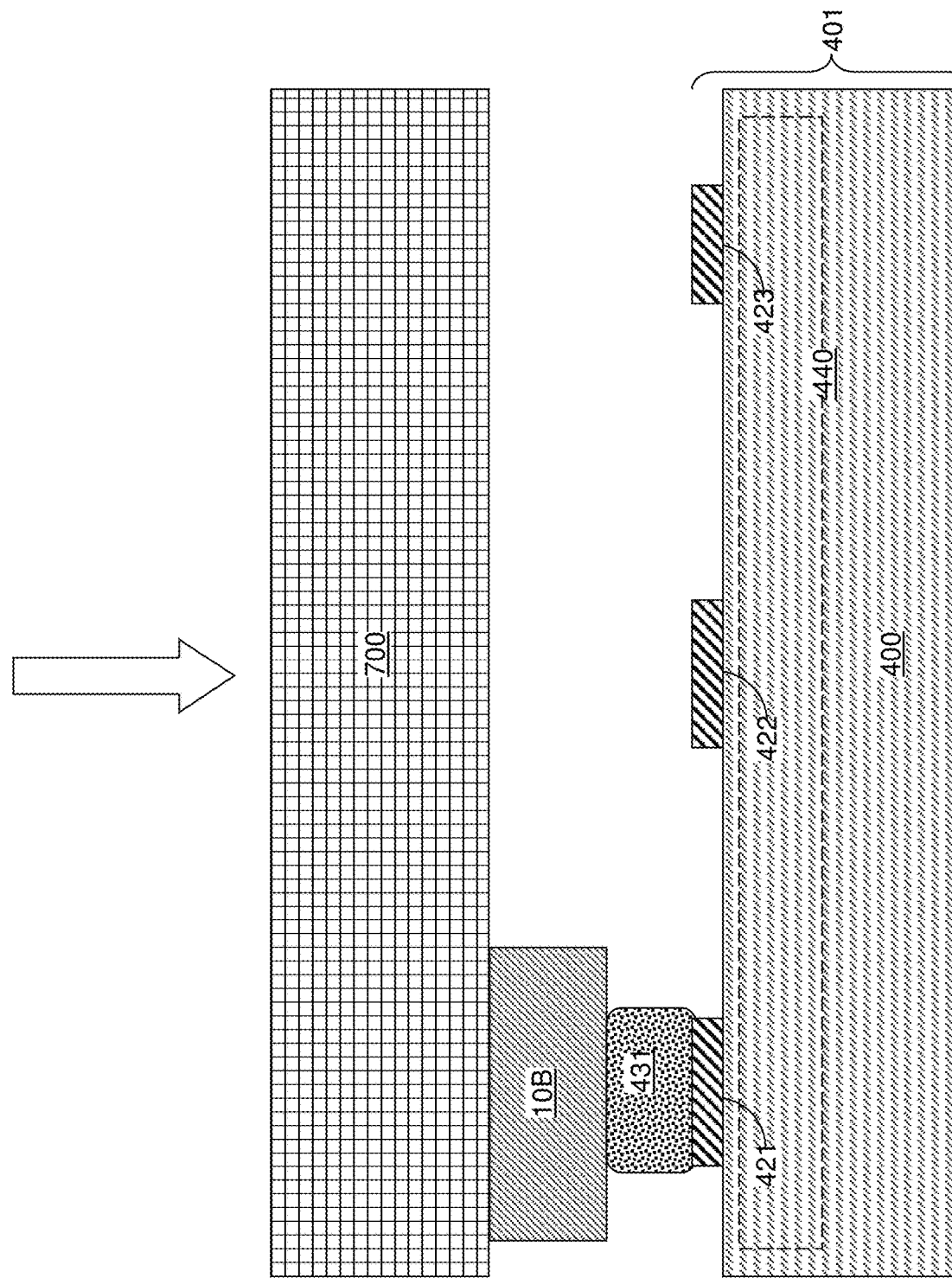

Referring to FIG. 16E, a dummy substrate 700 can employed to push the first light emitting diodes 10B on the first conductive bonding structures 431 toward the backplane 401 while optionally thermally reflowing the first conductive bonding structures 431. The compressible first conductive bonding structures can be compressed by 5 to 20% of their thickness during this step.

Figure 16F:
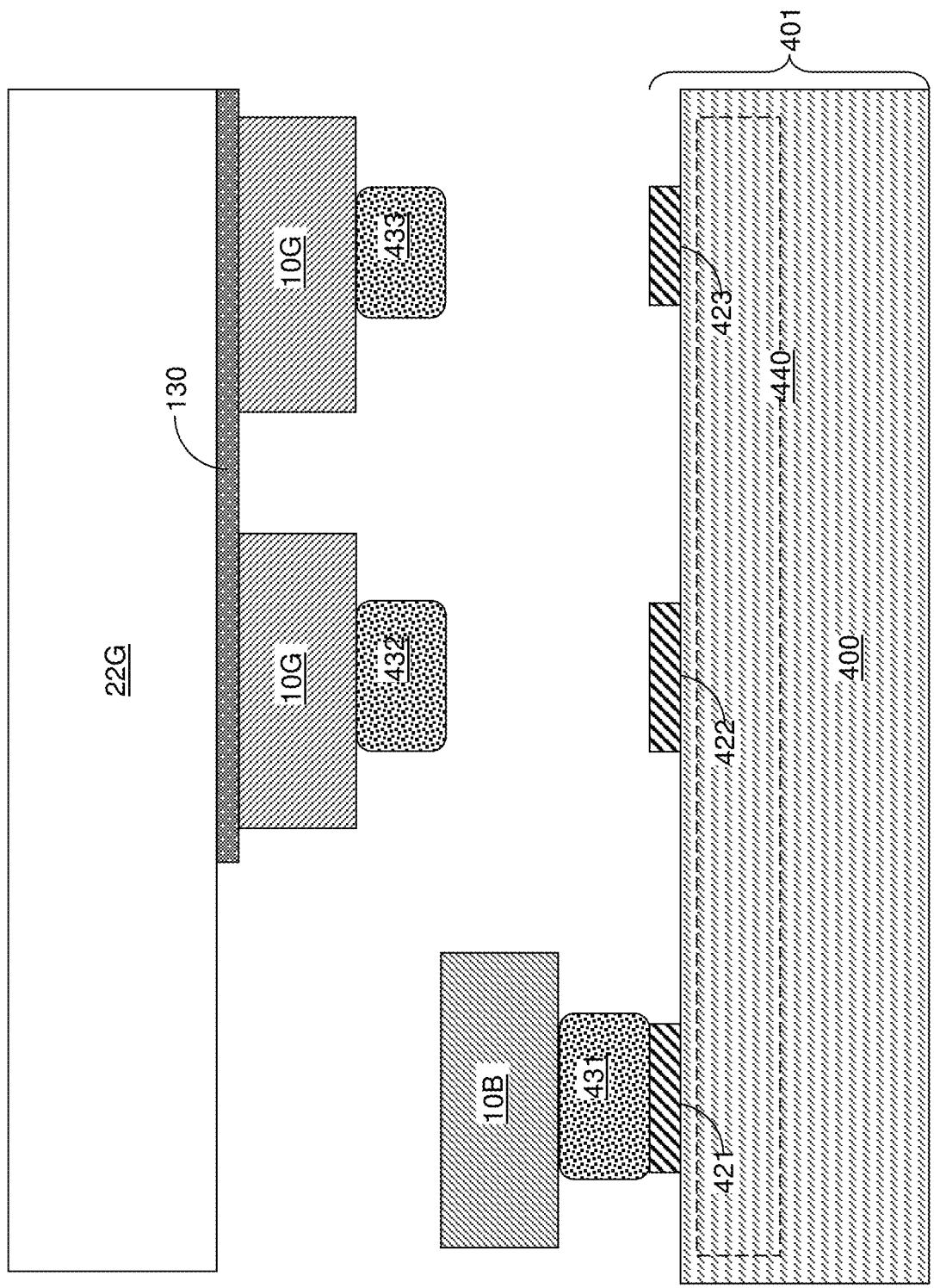
Figure 16G:
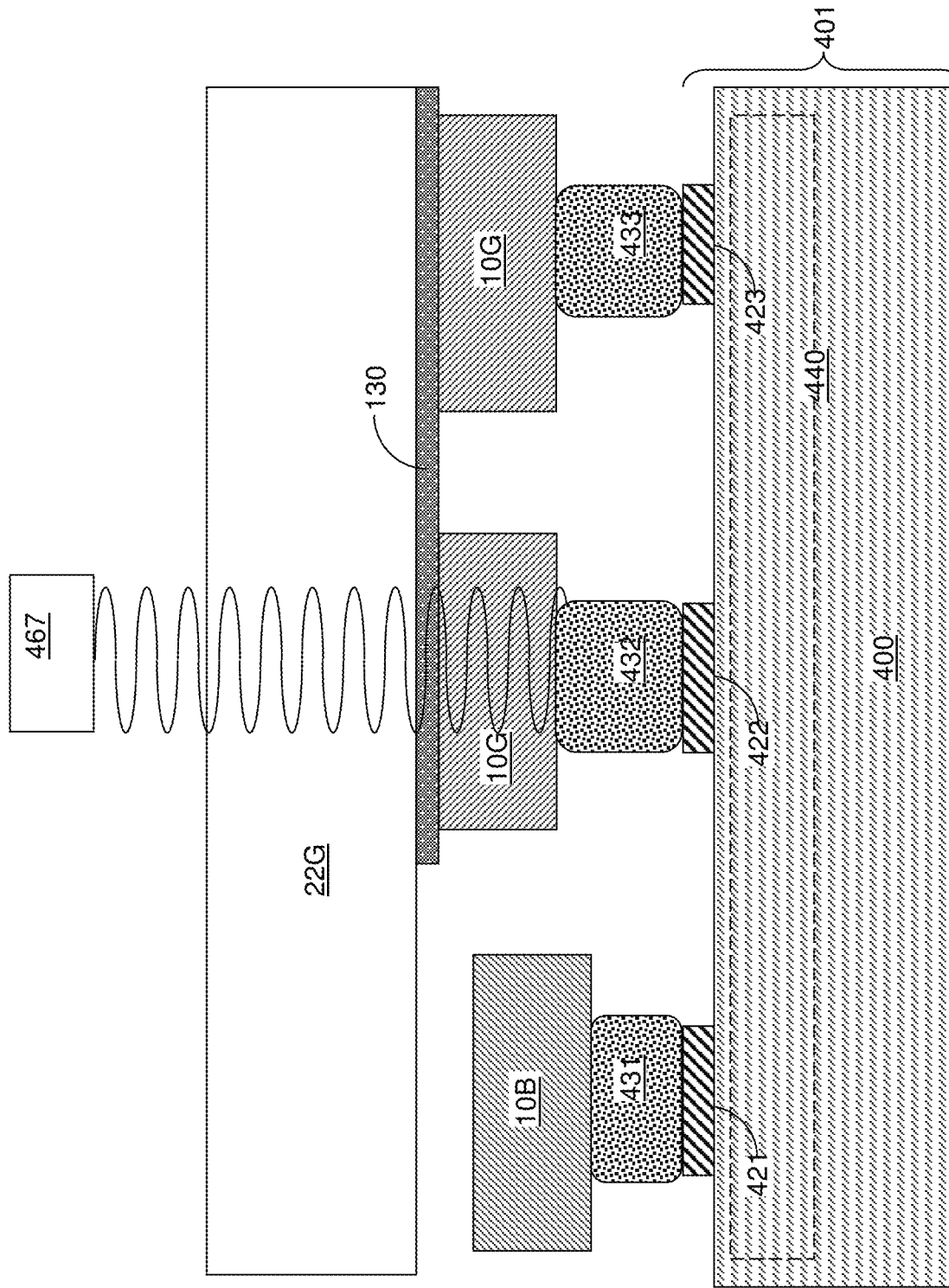

Referring to FIG. 16F, a second support substrate (such as a second growth or transfer substrate) 22G from which a first subset of second LEDs 10G are removed is positioned over the in-process exemplary light emitting device assembly, and is aligned such that a second subset of the second light emitting diodes 10G overlies the second bonding pads 422. Referring to FIG. 16G, the backplane 401 and the assembly including the second light emitting diodes 10G are positioned such that each second conductive bonding structure 432 is attached to the second LED 10G and contacts the second bonding pad 422.

In one embodiment, each second conductive bonding structure 432 can be attached to one of an overlying second LED 10G, and the second bonding pad 422, and each third conductive bonding structure 433 can be attached to one of an overlying second LED 10G and contacts the third bonding pad 423. A heating laser 467 is employed to reflow the second conductive bonding structures 432 without reflowing the remaining conductive bonding structures (431, 433). The heating laser 467 can have a wavelength that induces greater absorption of energy within the material of the conductive bonding structures (431, 432, 433) than within the materials of the support substrate 22G or within the materials of the devices to be transferred (e.g., the second LEDs 10G). The same heating laser can be employed as in the processing steps of FIG. 16B. The second conductive bonding structures 432 can be sequentially irradiated by a laser beam from the heating laser 467 to reflow each second conductive bonding structure 432, and to bond each second conductive bonding structure 432 to an overlying second LED 10G and to an underlying second bonding pad 422.

Figure 16H:
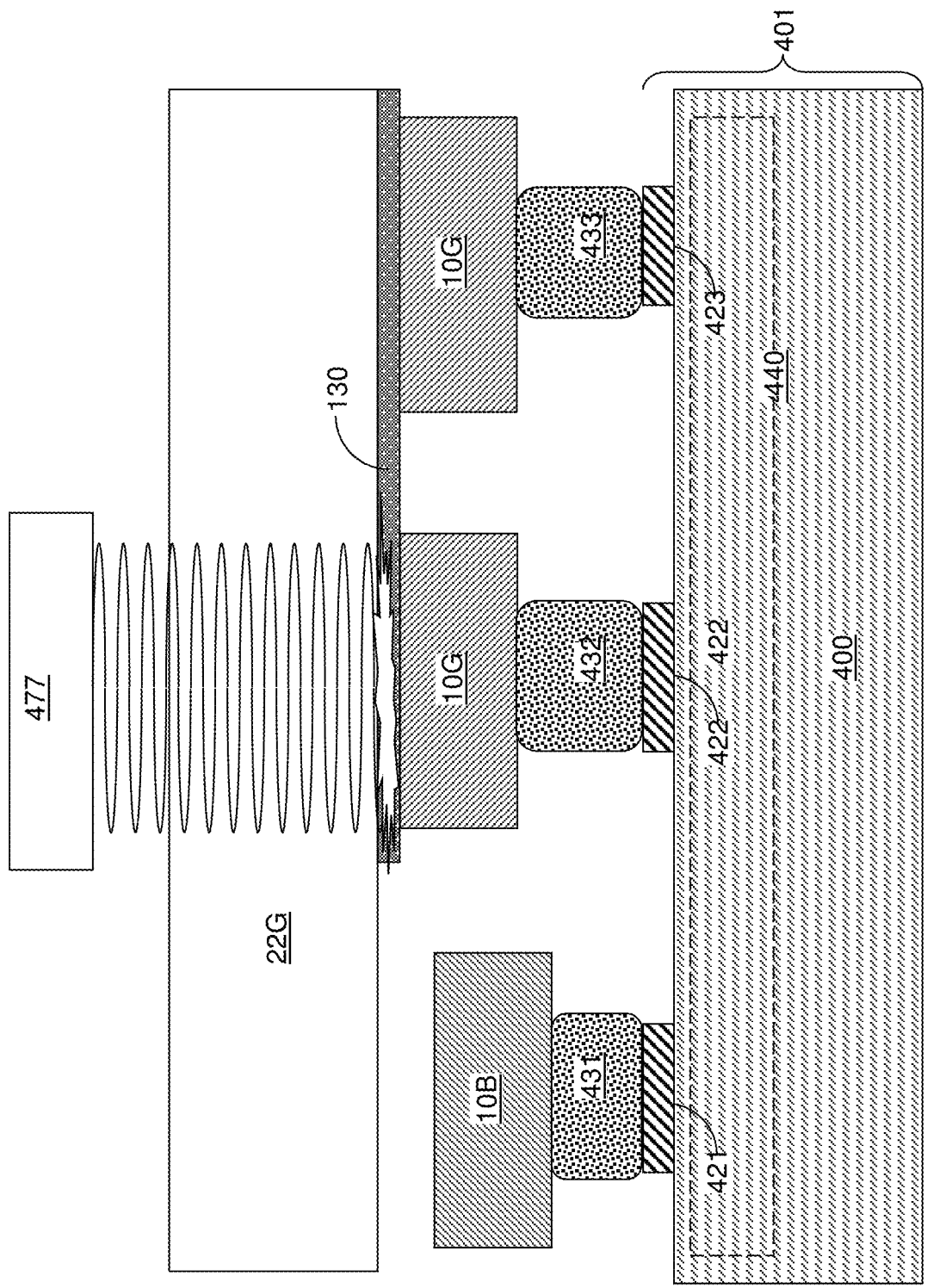

Referring to FIG. 16H, a laser irradiation process is performed to separate each bonded second LED 10G from the second support substrate. The wavelength of the laser 477 can be different from the wavelength of the heating laser 467, and provides more heating to the material of the ablation material layer 130 than to the materials of the support substrate 22G and the transferred devices (e.g., the second light emitting diodes 10G). Each portion of the ablation material layer 130 overlying the second conductive bonding structures 432 can be sequentially irradiated by a laser beam from the laser 477 to dissociate each underlying second LED 10G.

Figure 16I:
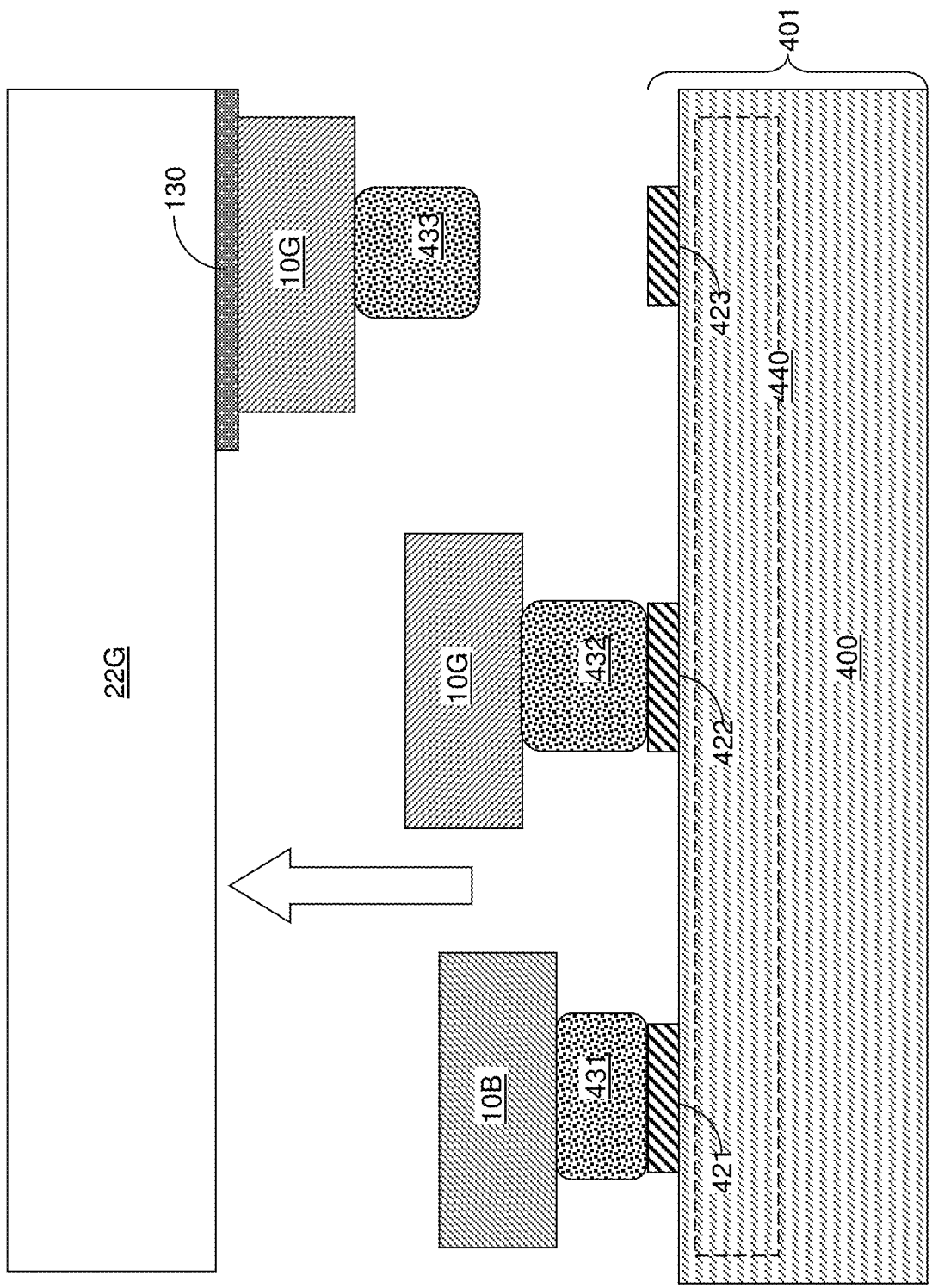
Figure 16J:
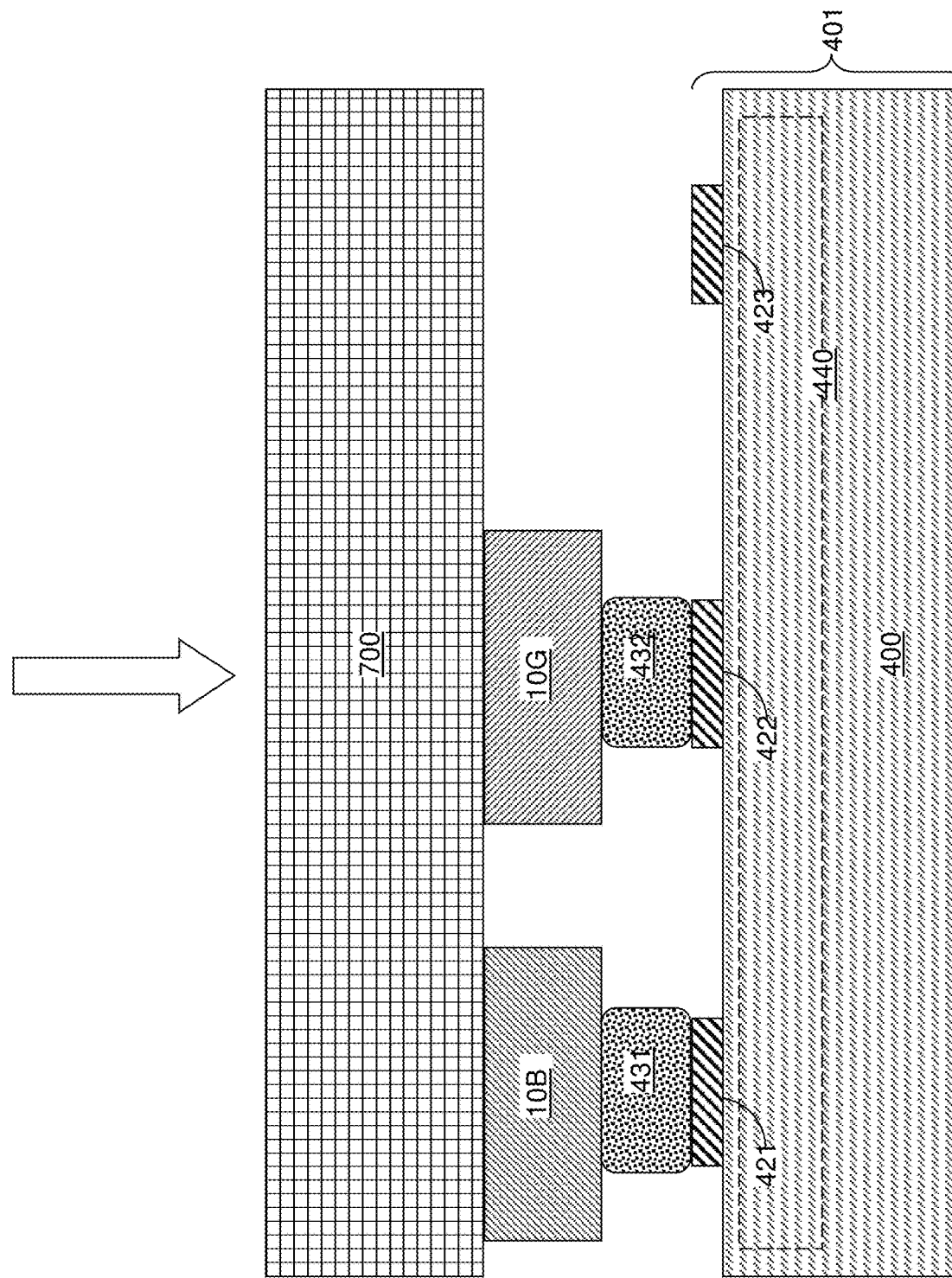
Figure 16K:
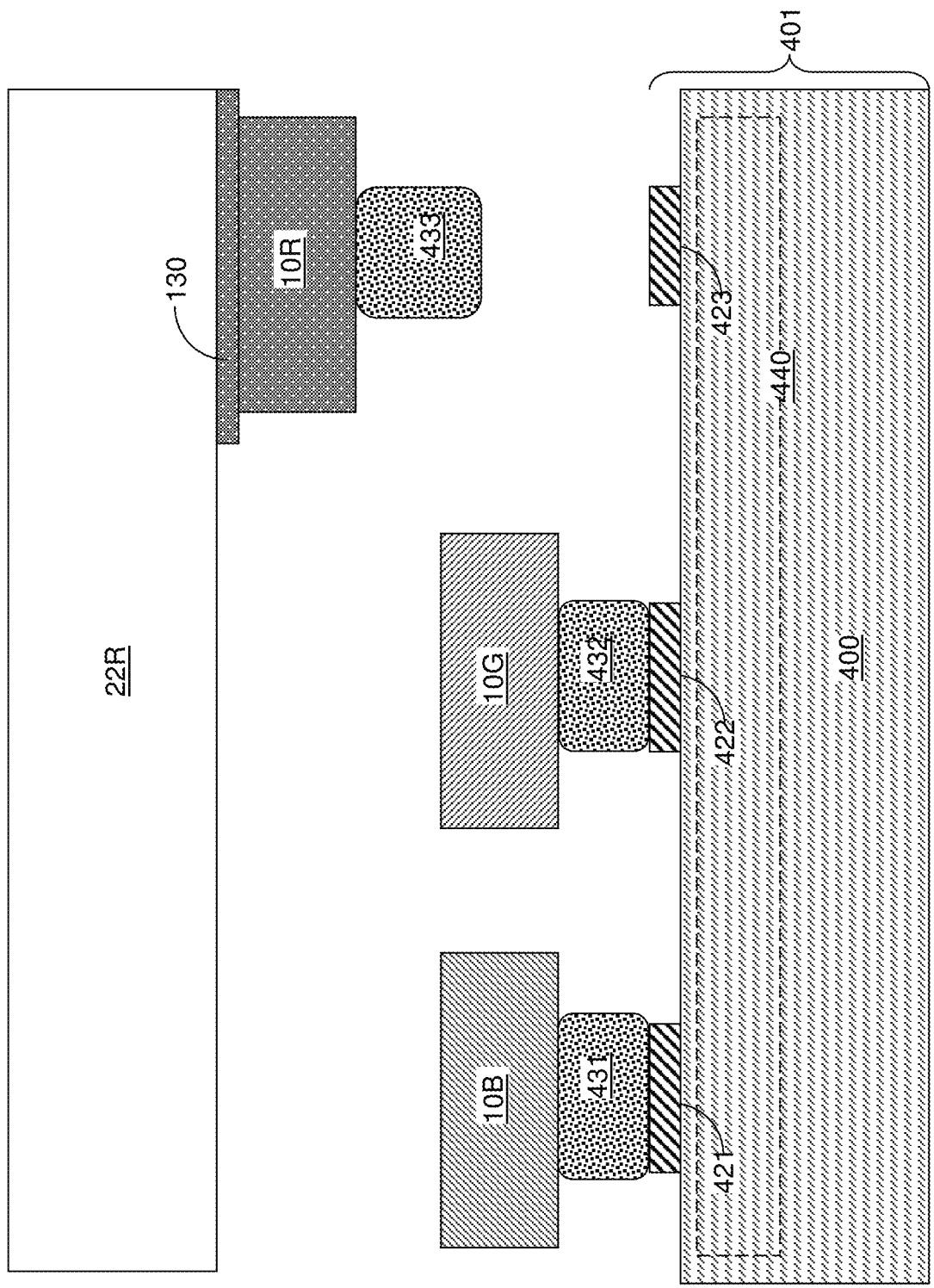

Referring to FIG. 16I, the assembly of the second support substrate 22G and attached second light emitting diodes 10G (a third subset of the second light emitting diodes 10G that remain on the second support substrate) is separated from the backplane 401 and the second subset of the second light emitting diodes 10G that are now attached to the backplane 401. Referring to FIG. 16J, a dummy substrate 700 can employed to push the second light emitting diodes 10G on the second conductive bonding structures 432 toward the backplane 401 in the same manner as described above. Referring to FIG. 16K, a third support substrate (such as a third transfer substrate 22R), from which a first subset and a second subset of third LEDs 10R have been removed in prior processing steps, is positioned over the in-process fourth exemplary light emitting device assembly, and is aligned such that a third subset of the third light emitting diodes 10R overlies the third bonding pads 423.

Figure 16L:
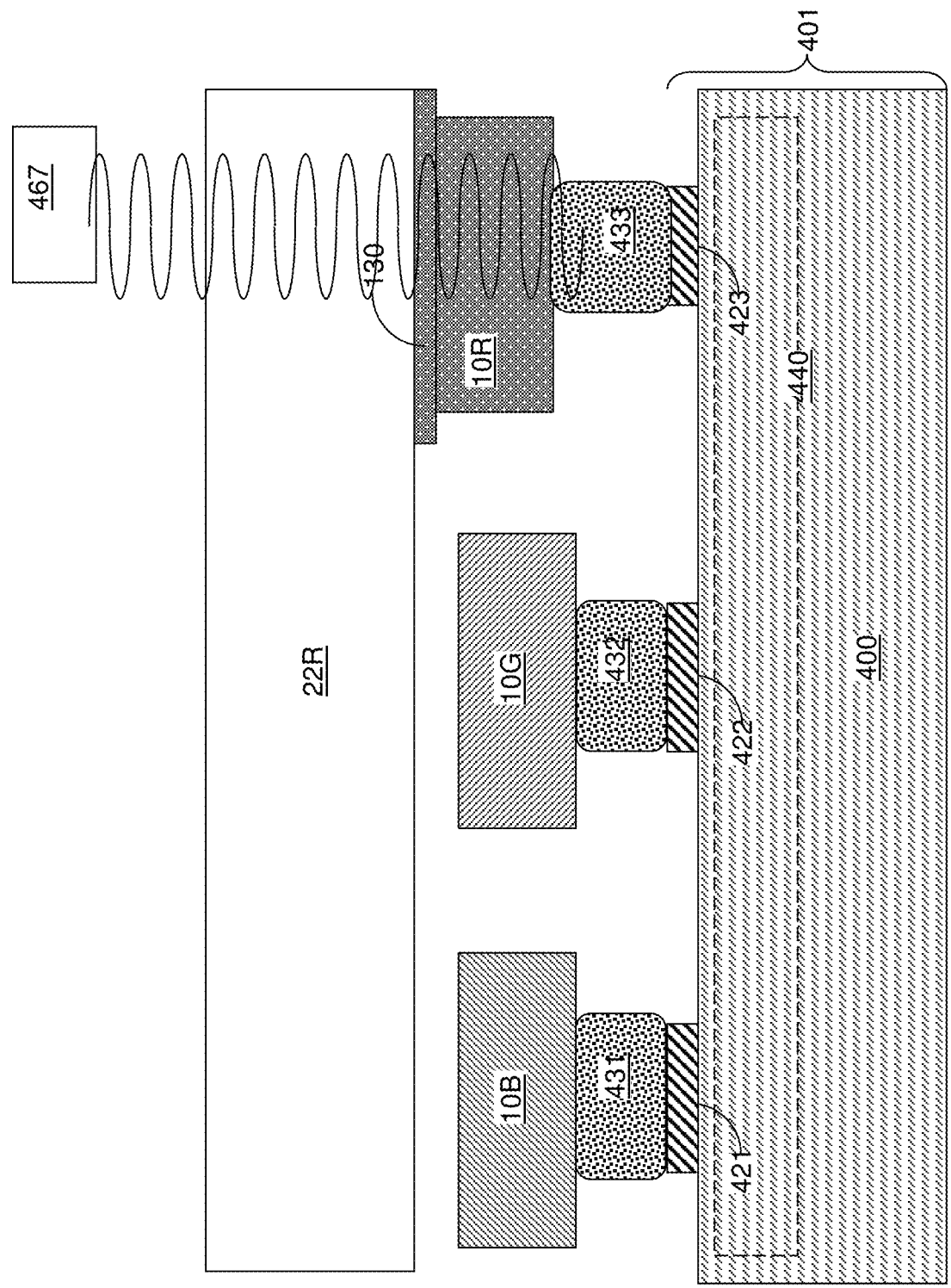

Referring to FIG. 16L, the backplane 401 and the assembly including the third light emitting diodes 10R are positioned such that each third conductive bonding structure 433 is attached a third LED 10R and contacts the third bonding pad 423. If any addition conductive bonding structures (not shown) are present, additional conductive bonding structures (not shown) overlying such additional bonding pads can contact underlying additional bonding pads and overlying third LEDs 10R, and can be attached to the underlying additional bonding pads or to the overlying third LEDs 10R.

A heating laser 467 is employed to reflow the third conductive bonding structures 433. The heating laser 467 can have a wavelength that induces greater absorption of energy within the material of the third conductive bonding structures 433 than within the materials of the support substrate 22R or within the materials of the devices to be transferred (e.g., the third LEDs 10R). The same heating laser can be employed as in the processing steps of FIG. 16B or FIG. 16G. The third conductive bonding structures 433 can be sequentially irradiated by a laser beam from the heating laser 467 to reflow each third conductive bonding structure 433, and to bond each third conductive bonding structure 433 to an overlying third LED 10R and to an underlying third bonding pad 423.

Figure 16M:
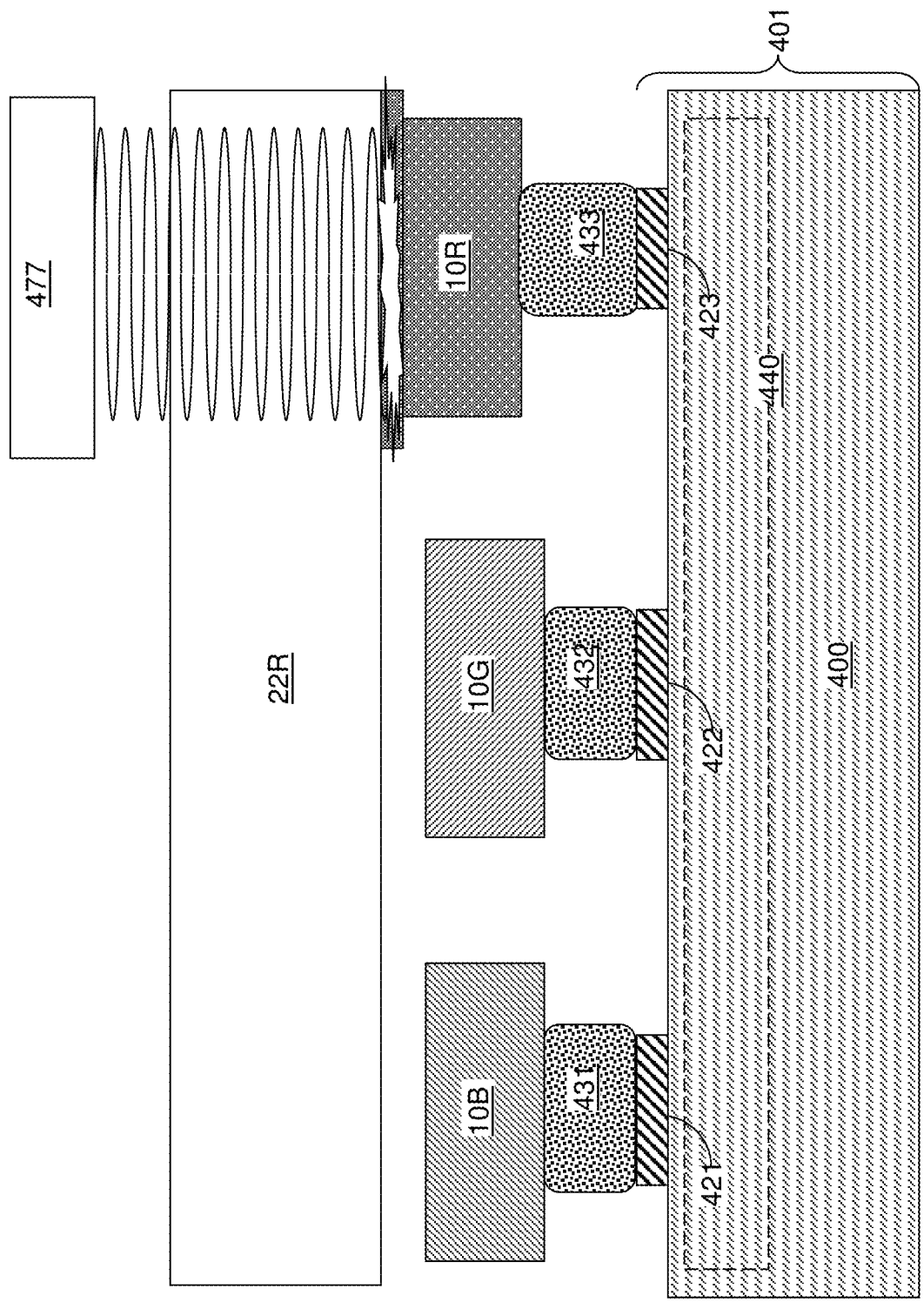

Referring to FIG. 16M, a laser irradiation process is performed to separate each bonded third LED 10R from the third support substrate in the same manner as in the processing steps of FIG. 15A.

Figure 16N:
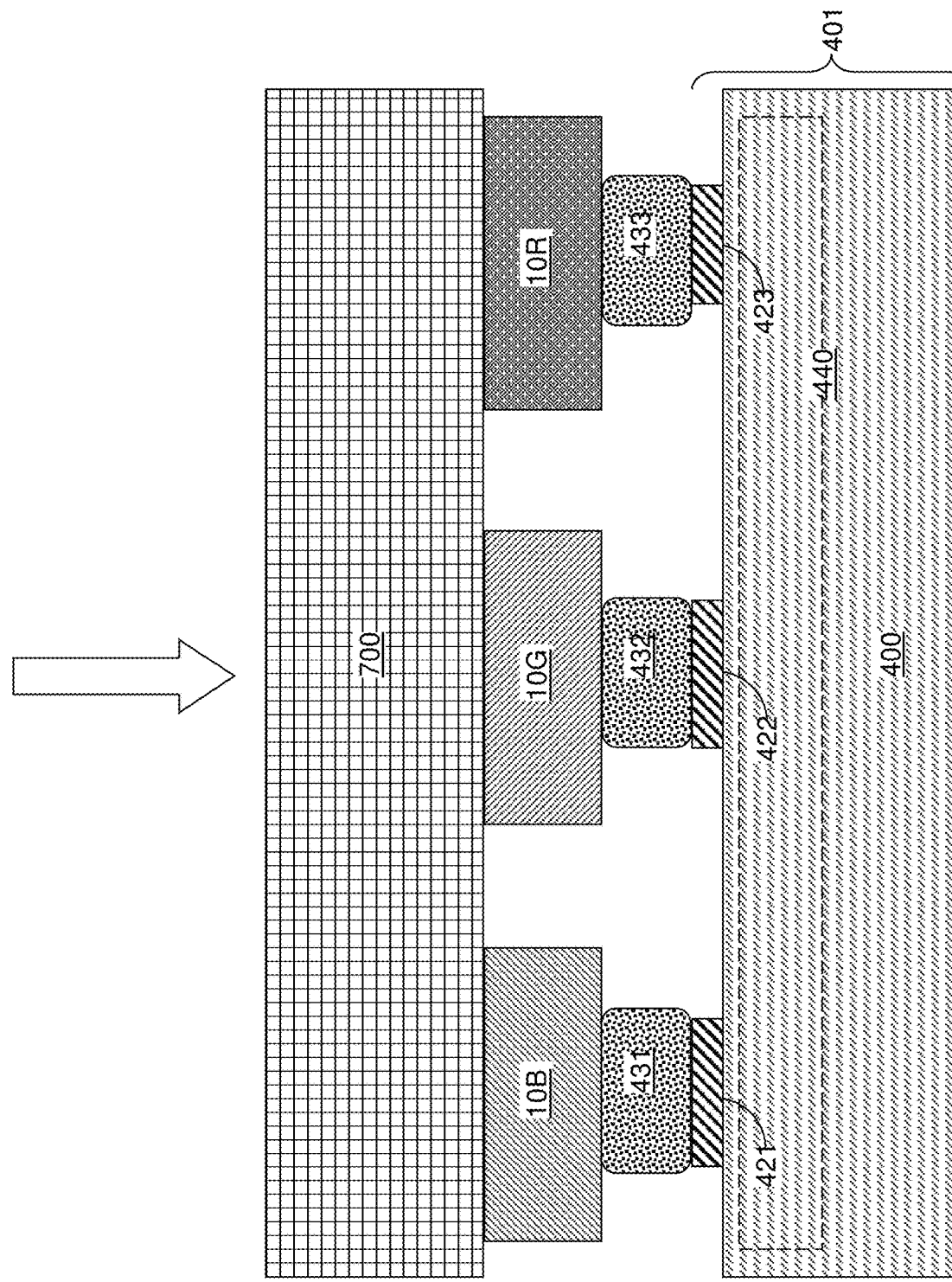

Referring to FIG. 16N, a dummy substrate 700 may be employed to push the third light emitting diodes 10R on the third conductive bonding structures 433 toward the backplane 401. The assembly of the third support substrate 22R and any remaining third light emitting diodes 10R, if any, is separated from the backplane 401 and the third subset of the third light emitting diodes 10R that are now attached to the backplane 401 in the same manner as above. The first, second and third LEDs (10B, 10G, 10R) attached to the backplane 401 have co-planar top and bottom surfaces (e.g., top surfaces which deviate by less than 0.25 microns (e.g., 0 to 0.2 microns) from a first common plane and bottom surfaces which deviate by less than 0.25 (e.g., 0 to 0.2 microns) microns from a second common plane due to the compressible conductive bonding structures.

Figure 16O:
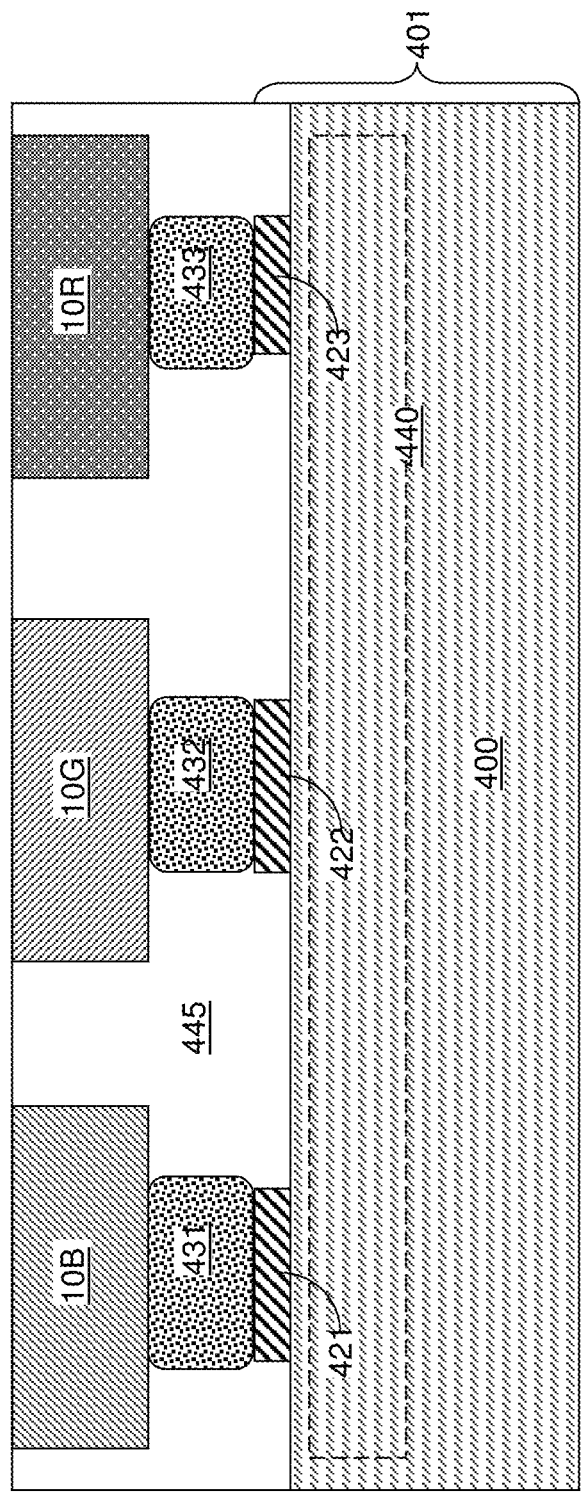
Figure 16P:
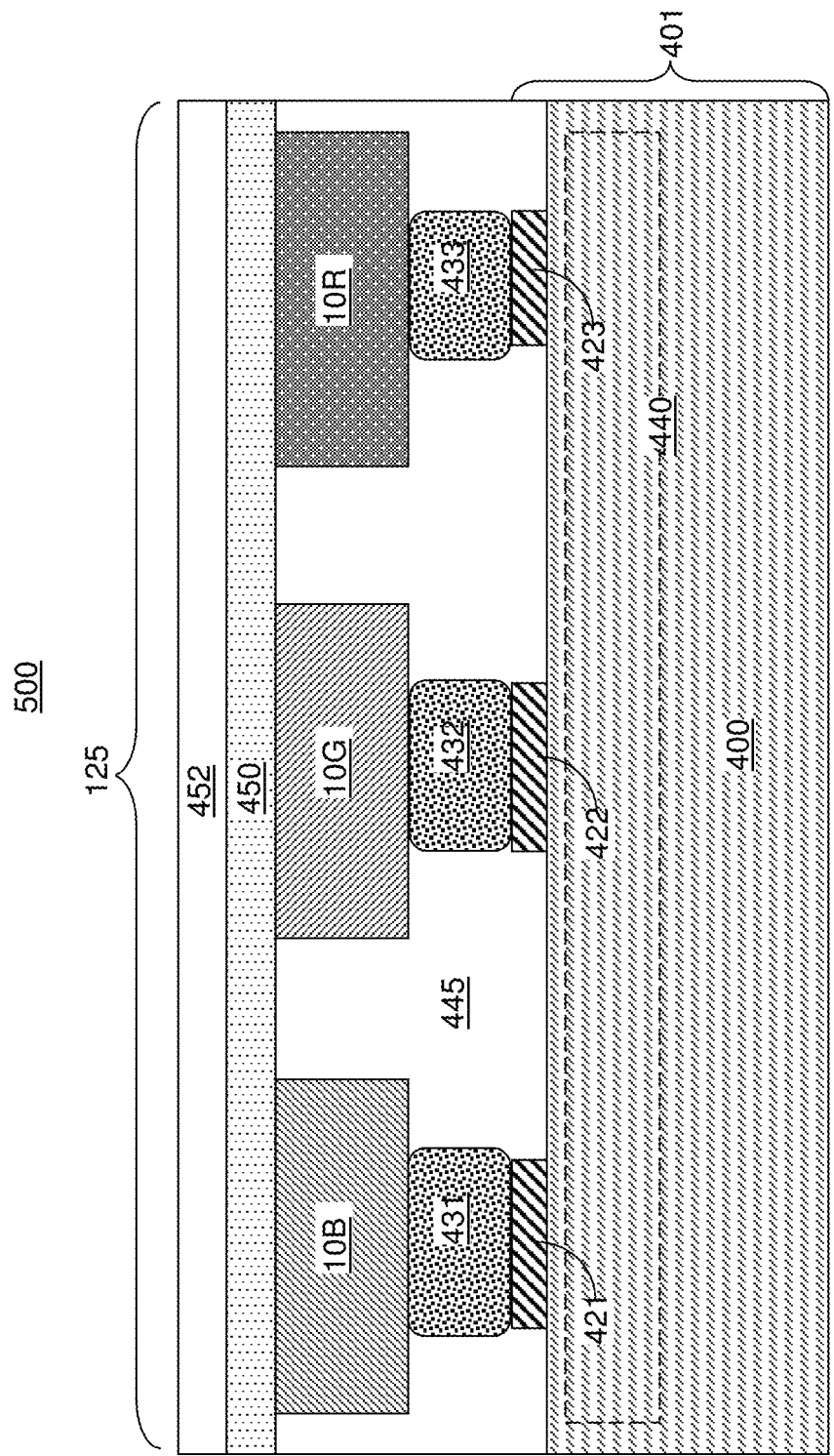

Referring to FIG. 16O, a dielectric matrix 445 can be applied in the spaces between the light emitting diode subpixels (10B, 10G, 10R) that are bonded to the backplane 401. While FIG. 16O illustrates only three subpixels (10B, 10G, 10R), it is understood that an array of pixels is formed on the backplane 401, and each pixel includes a set of light emitting diodes such as a blue-light emitting diode as a first LED subpixel 10B, a green-light emitting diode as a second LED subpixel 10G, and a red-light emitting diode as a third LED subpixel 10R. The dielectric matrix 445 can laterally surround each of the red-light emitting diodes, the green-light emitting diodes, and the blue light emitting diodes within the array of pixels. The dielectric matrix 445 can include a self-planarizing dielectric material such as spin-on glass (SOG) or polymer, or can be planarized by a recess etch or chemical mechanical planarization. The top surface of the dielectric matrix 445 as planarized can be within the horizontal plane including the top surfaces of the subpixels (10B. 10G, 10R), or can be vertically recessed below the horizontal plane including the top surfaces of the subpixels (10B. 10G, 10R).

Referring to FIG. 16P, a front side transparent conductive oxide layer 450 can be formed over the dielectric matrix 445 and directly on the electrical nodes that are located on top of each subpixel (10B, 10G, 10R). For example, the front side transparent conductive oxide layer 450 can be deposited on the semiconductor buffer layer 24 or directly on the compound semiconductor material layer 26 of the first conductivity type. For example, if the buffer layer 24 has a high resistivity and is not removed during the laser ablation step described above, then an additional etch back or CMP is performed to remove the buffer layer 24 and expose the doped compound semiconductor layer 26 of the first conductivity type.

In this case, the front side transparent conductive oxide layer 450 can be a common ground electrode for each of the red-light emitting diode subpixels 10R, the green-light emitting diode subpixels 10G, and the blue-light emitting diode subpixels 10B. The subpixels 10R, 10B, 10G form a pixel 125 of a direct view display device 500.

An optional transparent passivation dielectric layer 452 can be formed over the front side transparent conductive oxide layer 450. The transparent passivation dielectric layer 452 can include silicon nitride or silicon oxide. Thus, the LED subpixels 10B, 10G and 10R are so-called bottom emitting, vertical LEDs 10 which emit light through the compound semiconductor material layer 26, the front side transparent conductive oxide layer 450 and transparent passivation dielectric layer 452. The LEDs are vertical devices because they have electrical contacts (i.e., the front side transparent conductive oxide layer 450 and bonding structures or pads (431, 432, 433)) on opposite sides of each LED (10B, 10G, 10R).

According to one embodiment of the present disclosure, a light emitting device, such as the LED 10, comprises a substrate 20 including a doped compound semiconductor layer 26, a growth mask layer 42 located on a top surface of the doped compound semiconductor layer 26, semiconductor nanowires (32, 34) extending from a top surface of the doped compound semiconductor layer 26, and a second conductivity type semiconductor material layer 36 located over, and around, the semiconductor nanowires (32, 34) and contacting sidewalls of each semiconductor nanowire (32, 34) within each cluster of semiconductor nanowires (32, 34). Each semiconductor nanowire comprises nanowire core 32 of a first conductivity type extending through a respective opening 43 through the growth mask layer 42, and an active light emitting shell 34. Faceted sidewalls of the second conductivity type semiconductor material layer 36 adjoin a top surface of the growth mask layer 42 around a periphery of the second conductivity type semiconductor material layer 36, and the faceted sidewalls of the second conductivity type semiconductor material layer 36 include crystallographic p-planes.

Each light emitting diode (LED) 10 can have a length of 1 to 5 microns parallel to a top surface of the doped compound semiconductor layer 26. The second conductivity type semiconductor material layer 36 is a continuous material layer within each LED 10, and contacts all outer surfaces of the active light emitting shells 34 within each LED 10.

The outer surfaces of the active light emitting shells 34 include vertical m-plane faceted surfaces that extend perpendicular to the top surface of the doped compound semiconductor layer 26, and tapered p-plane faceted surfaces located at a tip of each semiconductor nanowire and adjoined to an upper edge of a respective one of the vertical m-plane faceted surfaces.

Each of the faceted sidewalls of the second conductivity type semiconductor material layer 36 that adjoins the top surface of the growth mask layer 42 is at a same angle with respect a plane including the top surface of the growth mask layer 42. Each of the faceted sidewalls of the second conductivity type semiconductor material layer 36 extends within a respective two-dimensional plane from the top surface of the growth mask layer 42 to a location overlying a tip of a respective outermost semiconductor nanowire (32, 34) within a cluster of semiconductor nanowires.

Generally, the exemplary LEDs 10 of the present disclosure can be employed to form a direct view display device 500 shown in FIG. 16P. In this case, a backplane 401 with bonding structures (421, 422, 423) can be employed. Each of the bonding structures (421, 422, 423) is electrically connected to a respective one of metal interconnect structures 440 located within, or on, the backplane 401. Multiple instances of the LED 10 are provided as subpixels. Each instance of the LED 10 can be bonded to a respective bonding structure (421, 422, 423) on the backplane 401. Each bonded instance of the LED subpixel emits light at a given peak wavelength for a respective pixel 125 of the direct view display device 500.

Thus, each LED 10 is electrically connected to a respective one of the metal interconnect structures 440 and constitutes a first subpixel (e.g., 10B) which emits light at a first peak wavelength (e.g., blue) of a respective pixel of the direct view display device. The respective pixel further comprises a second subpixel 10G comprising a second LED 10 which emits light at a second peak wavelength (e.g., green) different from the first peak wavelength, and a third subpixel 10R comprising a third LED 10 which emits light at a third peak wavelength (e.g., red) different from the first and the second peak wavelengths.

Each instance of the first LED subpixel 10B can be electrically connected to a respective one of the metal interconnect structures 440 and constitutes a subpixel which emits light at a first peak wavelength for a respective pixel. Multiple instances of a second LED subpixel 10G can be provided, which includes a same set of components as the first LED subpixel 10B with a modification that the active layer of the second LED subpixel 10G is configured to emit light at a second peak wavelength that is different from the first wavelength. Each instance of the second LED subpixel 10G is electrically connected to a respective one of the metal interconnect structures 440 and constitutes another subpixel for a respective pixel. Likewise, multiple instances of a third LED subpixel 10R can be provided, which includes a same set of components as the first LED subpixel 10B with a modification that the active layer of the third LED subpixel 10R is configured to emit light at a third peak wavelength that is different from the first wavelength and from the second wavelength. Each instance of the third LED subpixel 10R is electrically connected to a respective one of the metal interconnect structures 440 and constitutes yet another subpixel for a respective pixel. The direct view display device can be a multicolor direct view display device in which each pixel comprises a plurality of subpixels which emits light at different wavelengths (e.g., red, green and blue light).

Figure 17A:
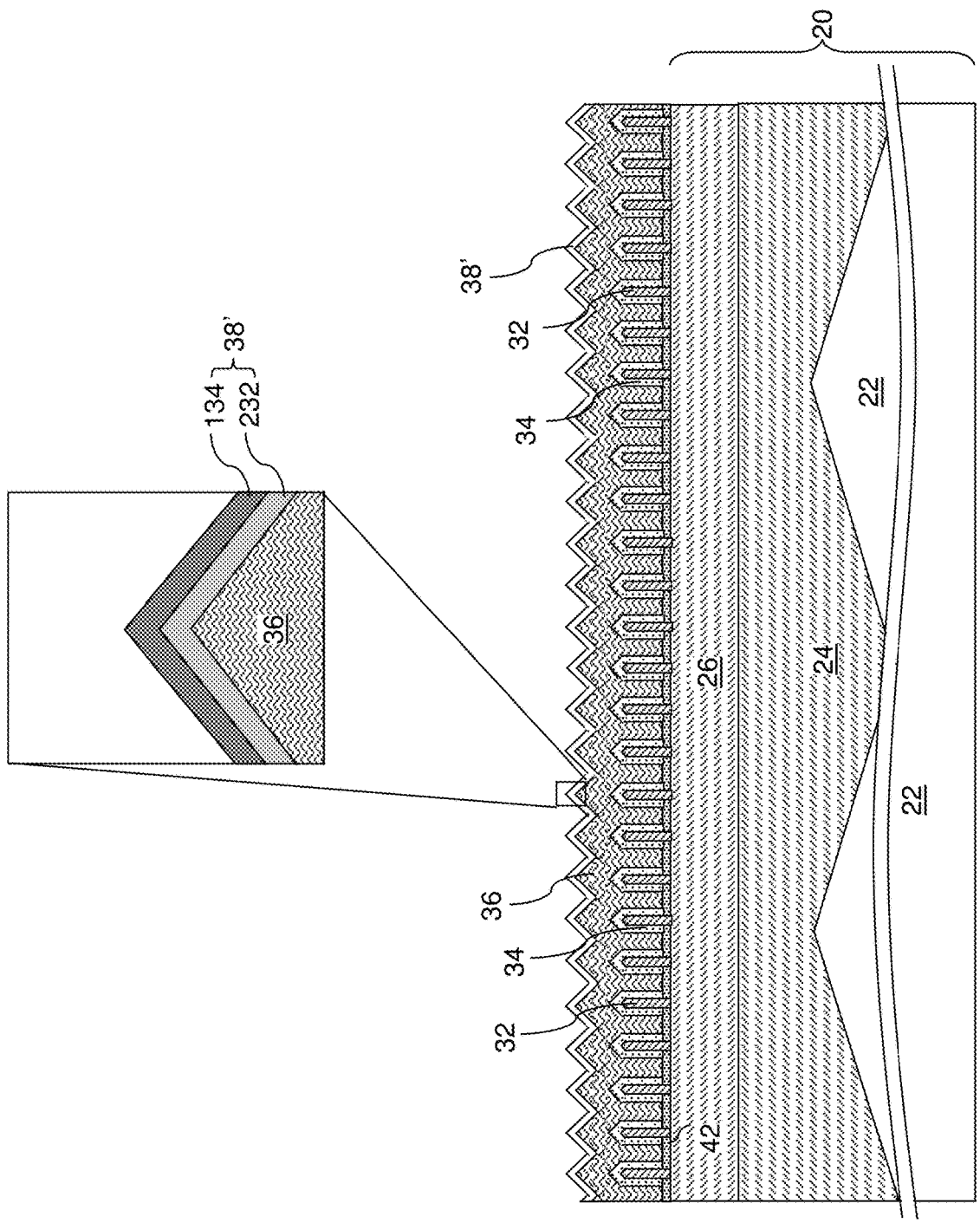
FIGS. 17A-17D illustrate light emitting diodes according to different embodiments of the present disclosure.

Referring to FIG. 17A, an exemplary structure of a first embodiment is illustrated at a processing step after the processing steps of FIG. 5 and prior to the processing steps of FIG. 6. Generally, at least one semiconductor nanowire light emitting diode can be provided as described above. Typically, a plurality of semiconductor nanowire light emitting diodes can be formed on a substrate 20 or on a plurality of substrates 20. Each semiconductor nanowire light emitting diode can be provided by forming a nanowire core 32 having a doping of a first conductivity type (such as n-type), forming an active shell 34 around the nanostructure core 32, and forming a second conductivity type semiconductor material layer 36 having a doping of a second conductivity type (such as p-type) over the active shell 34. The second conductivity type semiconductor material layer 36 can be formed over a plurality of active shells 34 laterally surrounding a respective nanowire core 32.

In alternative embodiments, each light emitting diode 10 is not a nanowire light emitting diode. For example, in a second embodiment shown in FIG. 17B, each area for a light emitting diode 10 includes a respective single opening in the patterned growth mask layer 42. Alternatively, in a third embodiment shown in FIG. 17C, each area for a light emitting diode 10 includes a respective array of openings in the patterned growth mask layer 42. In a fourth embodiment shown in FIG. 17D, the patterned growth mask layer 42 is not employed. In this embodiment, continuous planar semiconductor layers are formed on the n-doped compound semiconductor substrate layer 26.

Figure 17B:
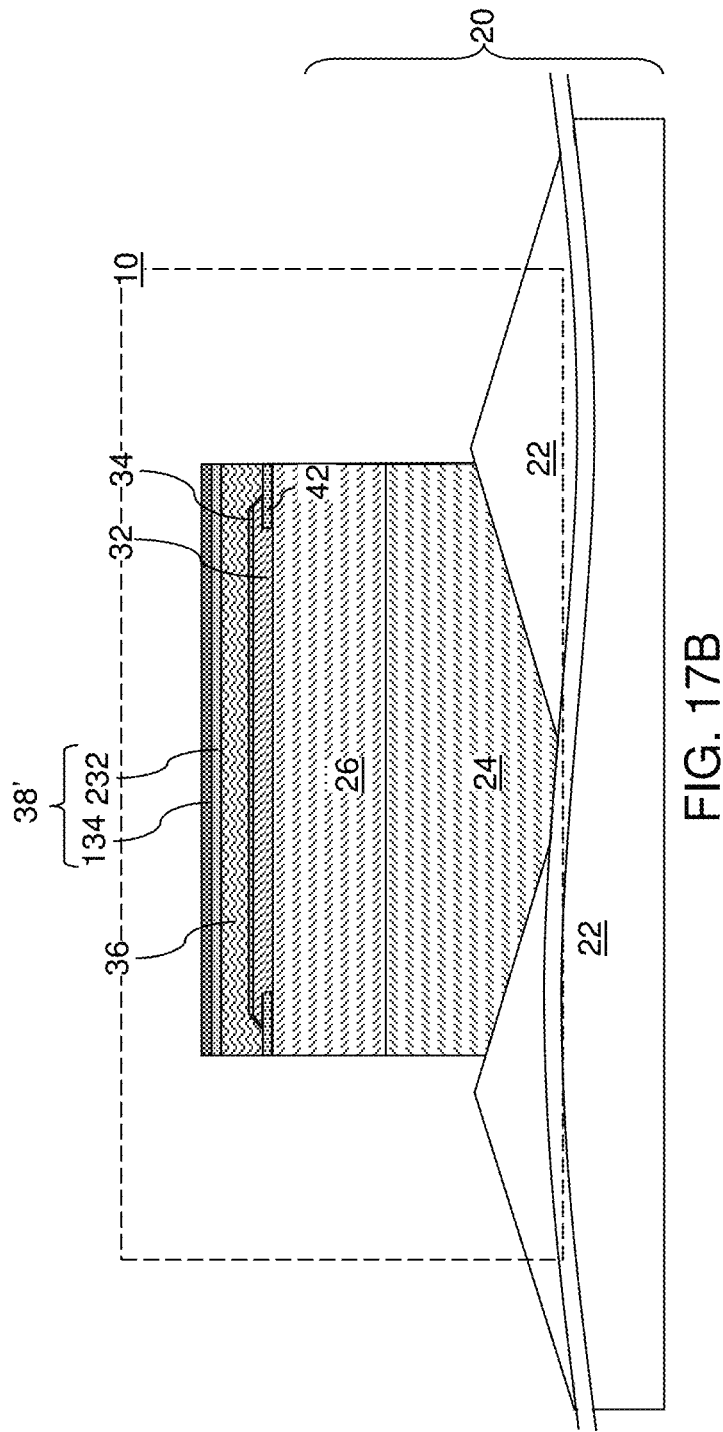

In the second embodiment illustrated in FIG. 17B, the n-doped compound semiconductor region 32 comprises a semiconductor core which can be formed as a microdisc. As used herein, a disc refers to a structural element having a top surface and a bottom surface that are parallel to each other and the area of the top surface is greater than the total area of surfaces (such as faceted surfaces or sidewall surfaces) that are not parallel to the top surface. A "microdisc" refers to a disc for which the maximum lateral dimension of the top surface is at least 1 micron and is less than 1 mm. A microdisc may have a circular, oval or polygonal (e.g., rectangular, hexagonal, etc.) when viewed from above.

Figure 17C:
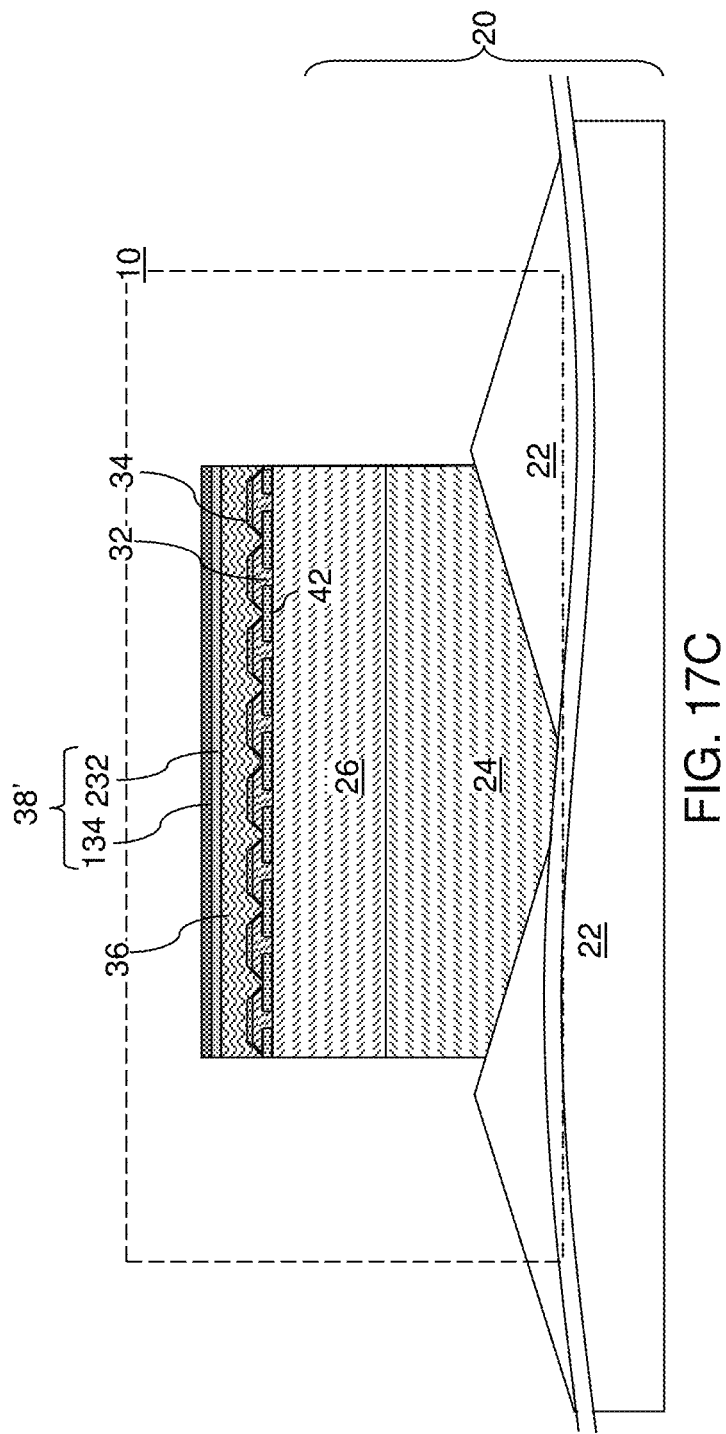

In the third embodiment illustrated in FIG. 17C, the n-doped compound semiconductor regions 32 comprises semiconductor cores which can be formed as nanodiscs. A "nanodisc" refers to a disc for which the maximum lateral dimension of the top surface is at least 1 nm and less than 1 micron. A cluster of microdiscs or nanodiscs can be formed for each area of a light emitting diode 10.

Figure 17D:
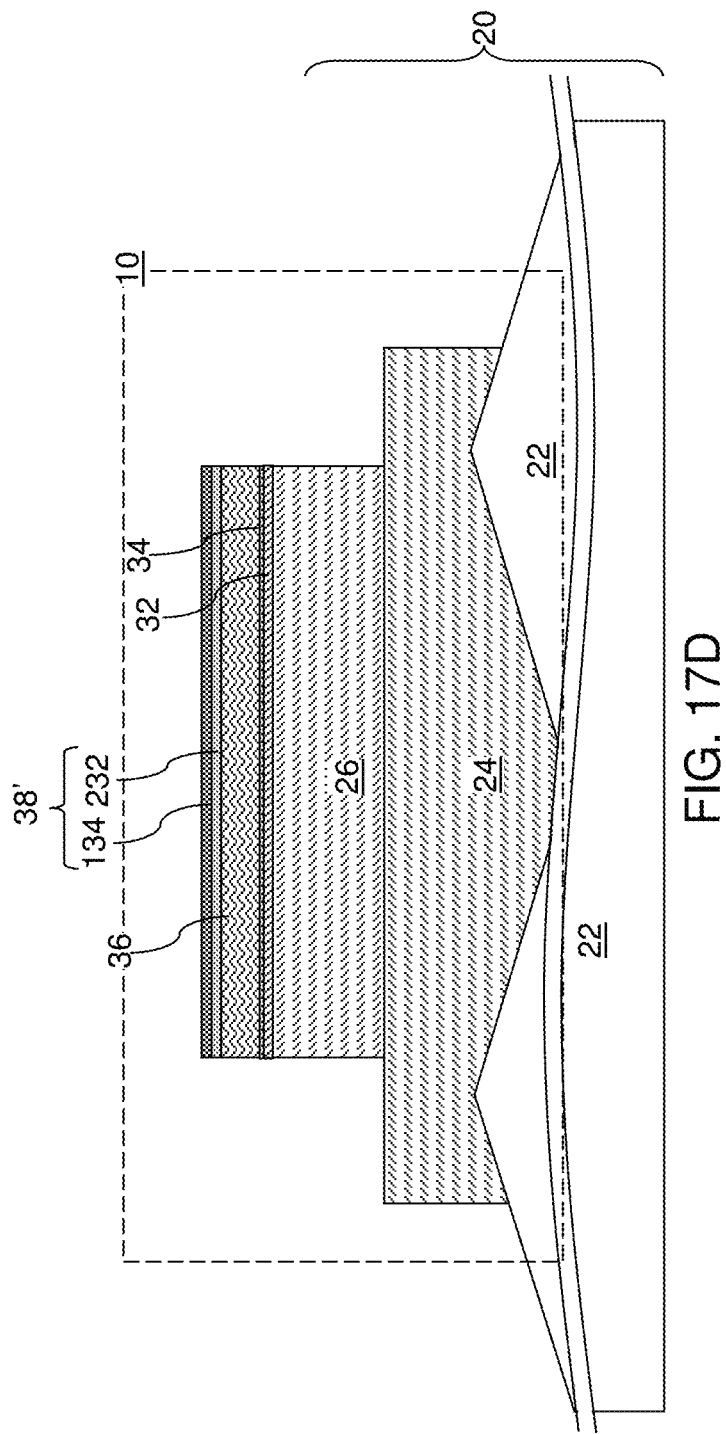

In the fourth embodiment illustrated in FIG. 17D, the epitaxy of the n-doped compound semiconductor region 32 may be performed without employing a patterned growth mask 42 on all physically exposed surfaces of an array of patterned portions of the n-doped compound semiconductor substrate layer 26. In this fourth embodiment, n-doped compound semiconductor region 32 comprises a continuous planar semiconductor layer.

Subsequently, an active region 34 including an optically active compound semiconductor layer stack configured to emit light is formed on each n-doped compound semiconductor region 32 in the first, second, third or fourth embodiments of respective FIGS. 17A-17D as described above. A p-doped semiconductor material layer 36 is formed on the planar top surfaces and faceted outer surfaces of the active region 34 in the first, second or third embodiments of respective FIGS. 17A-17C as described above. A p-doped semiconductor material layer 36 is formed on the planar top surface the active region 34 in the fourth embodiment of FIG. 17D.

A metal layer stack 38' including a first metal layer 232 and a second metal layer 134 is formed on the p-doped semiconductor material layer 36 in the light emitting diodes 10 of the first, second, third or fourth embodiments of respective FIGS. 17A-17D. The first metal layer 232 comprises, and may consist essentially of, an elemental metal that forms a conductive metal oxide upon oxidation. In one aspect, the first metal layer 232 comprises, and may consist essentially of nickel and has a thickness of 1 nm to 10 nm, such as 1 nm to 5 nm, for example 2 nm to 3 nm. The first metal layer 232 may be substantially free of oxygen. In one aspect, the second metal layer 134 comprises, and may consist essentially of gold, and has a thickness in a range from 1 nm to 10 nm, such as 1 nm to 5 nm, for example 2 nm to 3 nm. In one aspect, the metal layer stack 38' can be formed by vacuum evaporating the first metal layer 232 followed by vacuum evaporating the second metal layer 134 without breaking vacuum between vacuum evaporating the first metal layer 232 and vacuum evaporating the second metal layer 134.

Figure 18:
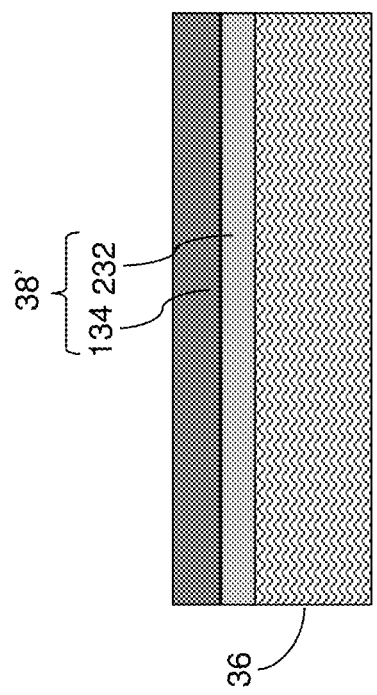
FIGS. 18, 19 and 20 are sequential vertical cross-sectional views of portions of embodiment light emitting diodes during manufacturing processes according to an embodiment of the present disclosure.

FIG. 18 illustrates a close up of the metal layer stack 38' in a portion of the light emitting diode of any of the first, second, third or fourth embodiment of respective FIG. 17A, 17B, 17C or 17D.

Figure 19:
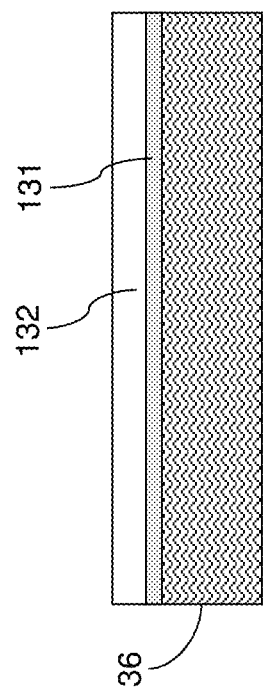

FIG. 19 illustrates the result of an oxidation step of the metal layer stack 38' of FIG. 18. Due to the low thickness of metal layers 232 and 134 (e.g., 10 nm or less, such as 1 to 5 nm), the first metal layer 232 can be oxidized to form a transparent conductive layer 132 comprising a conductive metal oxide material, such as nickel oxide. In one embodiment, the step of oxidizing the first metal layer 232 comprises oxidizing the metal layer stack 38' in an ambient comprising water vapor. The temperature can be elevated to accelerate the oxidation process. For example, the elevated temperature may be in a range from 500 degrees Celsius to 800 degrees Celsius, although lower and higher temperatures can also be employed.

In one embodiment, the gold atoms of the second metal layer 134 diffuse through the thin first metal layer 232 during the oxidation process into the p-doped semiconductor material layer 36 to form a doped semiconductor region 131 at the top of the p-doped semiconductor material layer 36. For example, if the p-doped semiconductor material layer 36 comprises a Group III-nitride semiconductor material, such as GaN, InGaN, AlGaN or InAlGaN, and the second metal layer 134 comprises gold, then the doped semiconductor region 131 comprises a gold doped III-nitride semiconductor region, such as a gold doped GaN, InGaN, AlGaN or InAlGaN region. Due to the low thickness of the second metal layer 134, the entire volume of the second material layer 134 can be diffused into the doped semiconductor region 131. Thus, at least 90 atomic percent, such as 90 to 99.99 atomic percent of the entire second metal layer 134 is diffused into the doped semiconductor region 131, such that the no second metal layer 134 remains on top of the transparent conductive layer 132. The transparent conductive layer 132 may comprise less than 10 atomic percent gold, such as zero to 5 atomic percent gold, such as 0.1 to 1 atomic percent gold, and 90 to 100 atomic percent nickel oxide.

The transparent conductive layer 132 is an electrically conductive layer and passes light in the visible wavelength range. For example, more than 90%, such as more than 97%, of the light can pass through the transparent conductive layer 132 within the visible wavelength range, i.e., in the wavelength range from 400 nm to 800 nm. The transparent conductive layer 132 can have a thickness of 1 nm to 10 nm, such as 1 nm to 5 nm, for example 2 nm to 3 nm. The doped semiconductor region 131 can have a thickness of 0.1 nm to 1 nm, such as 0.2 nm to 0.8 nm.

Figure 20:
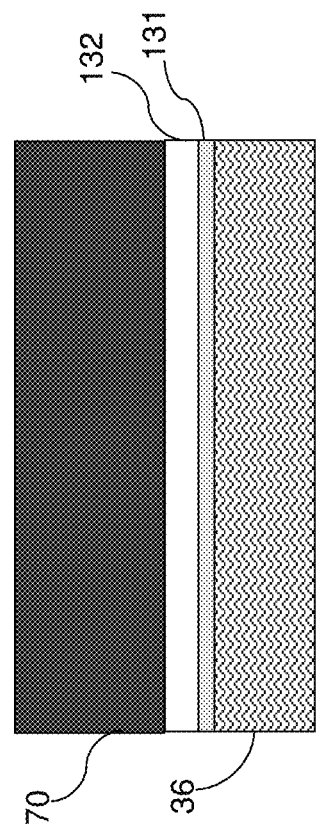
Figure 21A:
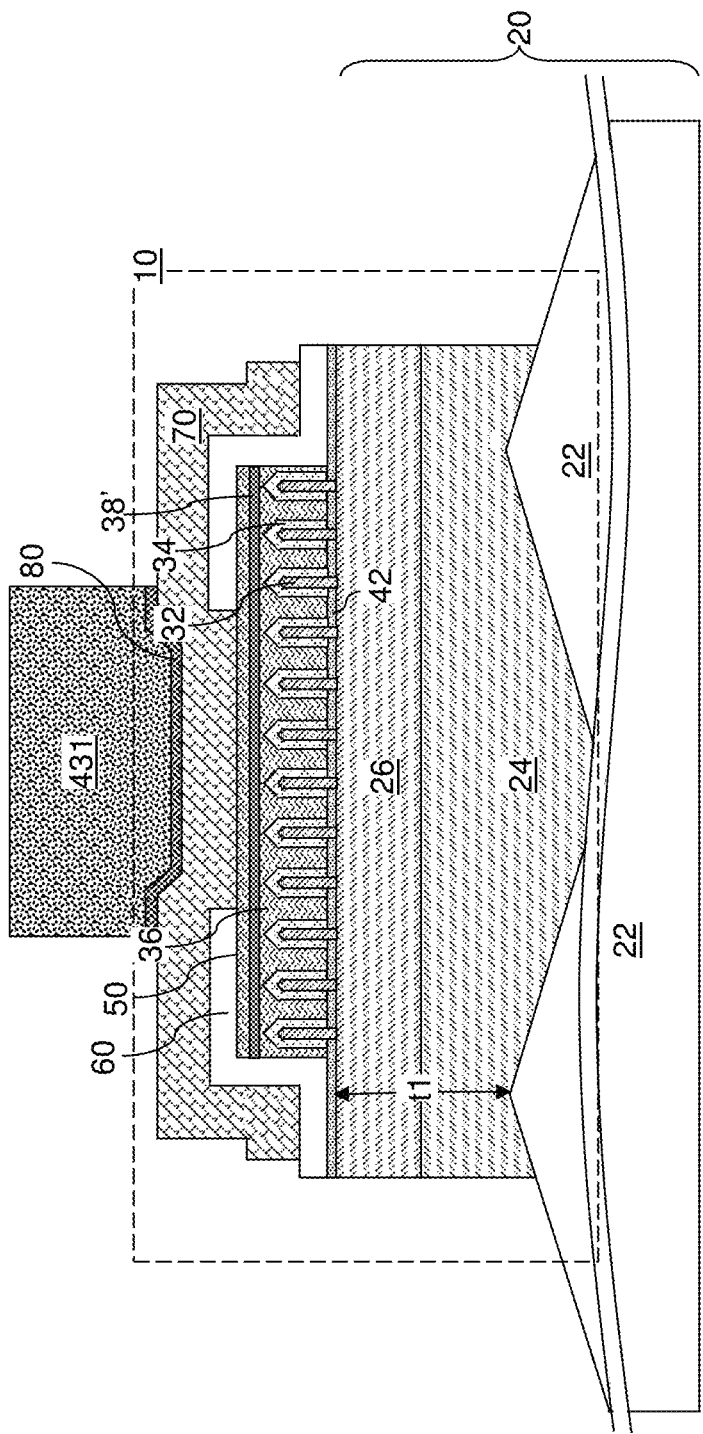
FIGS. 21A-21D illustrate light emitting diodes of FIGS. 17A-17D according to different embodiments of the present disclosure after the steps illustrated in FIGS. 18 to 20 are performed.
Figure 21B:
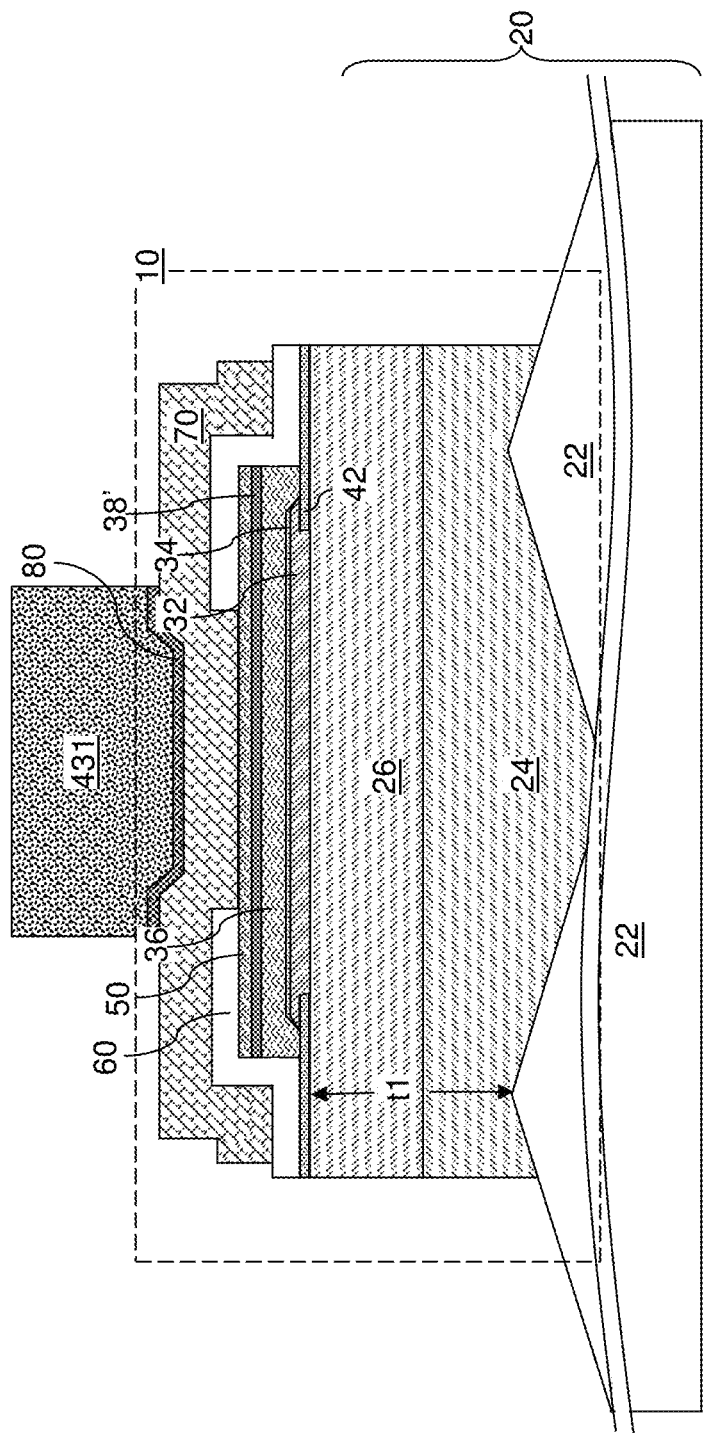
Figure 21C:
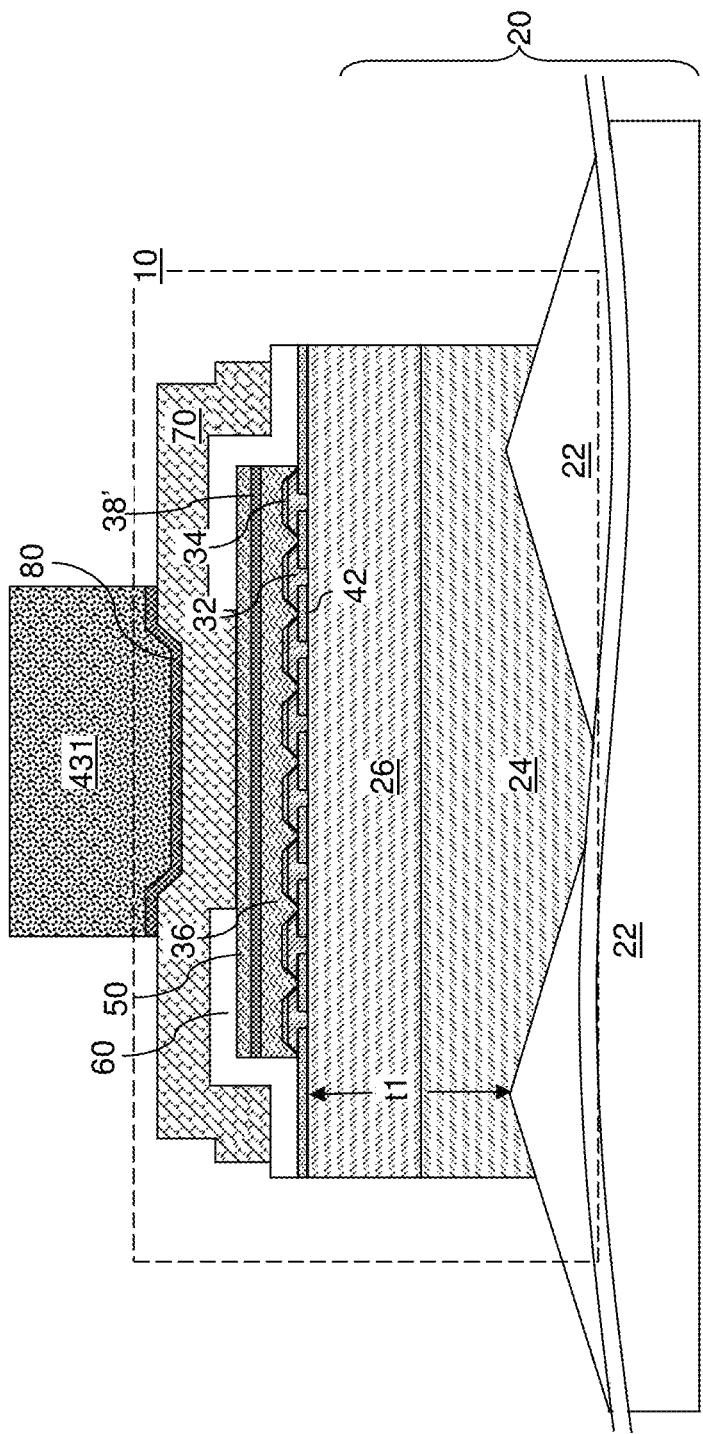
Figure 21D:
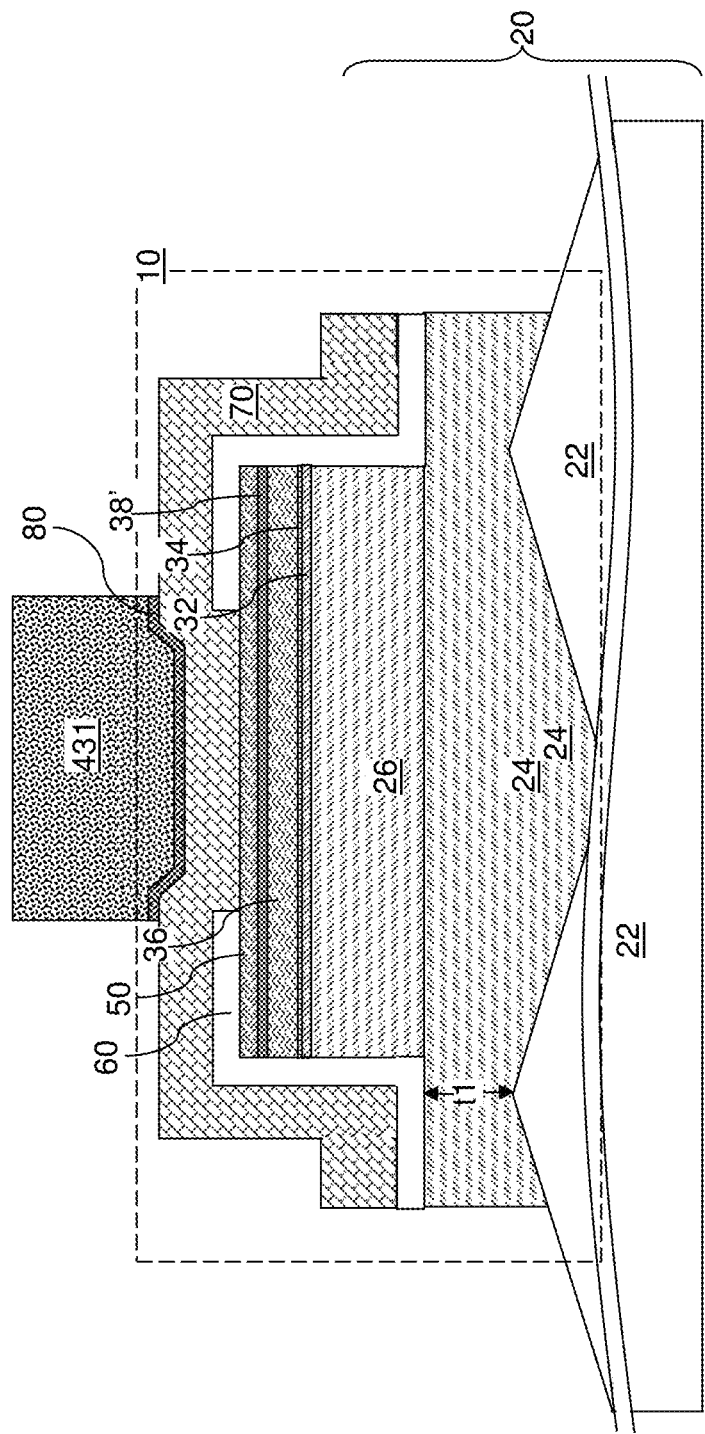

Referring to FIG. 20, a reflector layer 70 is formed on the transparent conductive layer 132. The reflector layer 70 may comprise aluminum or silver and have a thickness of 10 nm to 3 microns, such as 100 nm to 2 microns. The process then proceeds as described above with respect to FIGS. 14 to 16P.

FIGS. 21A-21D illustrate the respective devices of FIGS. 17A-17D after formation of the metal layer stack 38', the top contact electrode 50, the dielectric material layer 60 and the reflector 70.

For example, the metal layer stack 38' may comprise a first layer which contains at least one of nickel and gold. For example, the metal layer stack 38' may include both nickel and gold. For example, the metal layer stack 38' may include a nickel oxide layer and a gold layer or a composite gold-nickel oxide layer which may or may not include a composition gradient.

The top contact electrode 50 may be deposited on top of the metal layer stack 38'. The top contact electrode 50 may comprise a reflective material, such as aluminum or silver. Preferably, the top contact electrode 50 comprises aluminum. The top contact electrode 50 may have a thickness of 0.1 to 0.5 microns, such as 0.2 to 0.3 microns. Preferably, the lateral width of the top contact electrode 50 is not less than 1 microns smaller than the lateral width of the underlying mesa. For example, the lateral width of the top contact electrode 50 is not less than 1 microns smaller than the lateral width of the underlying second conductivity type semiconductor material layer 36. In one embodiment, the lateral width of the top contact electrode 50 is the same as the lateral width of the underlying mesa (i.e., the same as the lateral width of the underlying second conductivity type semiconductor material layer 36). In another embodiment, the lateral width of the top contact electrode 50 is smaller than the lateral width of the underlying mesa (i.e., smaller than the lateral width of the underlying second conductivity type semiconductor material layer 36) by 1 micron or less, such as by 0.1 to 0.5 microns. For example, if the lateral width of the mesa is 20 microns, then the lateral width of the top contact electrode 50 may be 19 to 20 microns, such as 19.5 to 19.9 microns. In general, the lateral width of the mesa may be 10 to 50 microns, and the lateral width of the top contact electrode 50 may be 9 to 50 microns, such as 9.5 to 49.9 microns. The high lateral width of the reflective top contact electrode reduces the amount of emitted light that is lost and increases the external quantum efficiency of the LED 10.

The dielectric material layer 60 may be deposited over the sidewalls of the mesa and over the top surface of the top contact electrode 50. The dielectric material layer 60 may comprise any suitable insulating material, such as aluminum oxide or silicon nitride, and may have a thickness of 0.2 to 0.5 microns, such as 0.3 to 0.4 microns. The dielectric material layer 60 may be patterned to form an opening over the mesa to expose the top contact electrode 50. The top contact electrode 50 may function as an etch stop during the formation of the opening.

The reflector 70 may be deposited over the dielectric material layer 60 and into the opening in the dielectric material layer 60 to contact the top contact electrode 50. The reflector may be any reflective material, such as such as aluminum or silver. Preferably, the reflector 70 comprises aluminum. The reflector 70 may have a thickness of 0.1 to 0.5 microns, such as 0.15 to 0.25 microns. The reflector 70 is patterned such that it remains over the dielectric material layer 60 located on the sidewalls and top of the mesa.

A device side bonding pad 80 and a tin portion 431 may be formed on the reflector 70. The bonding pad 80 may comprise one or more sublayers, such as titanium, tungsten, platinum and/or a platinum-tin alloy. The tin portion 431 functions as a solder bump and comprises either pure tin or a tin-indium alloy. The tin portion 431 may be bonded to a backplane of the direct view display device when the LED is located in the direct view display device.

Preferably, the thickness, t1, of the semiconductor material layer or layers between the support substrate 22 and the reflector 70 (i.e., below a portion of the reflector 70 located past the sidewalls of the mesa) is at least 2 microns, such as 2 to 10 microns. This prevents short circuits between the reflector 70 and the n-type electrode that may be formed on the semiconductor material layer(s) after removal of the support substrate 22. For example, the thickness t1 of the single crystalline buffer semiconductor layer 24 located between the support substrate 22 and the reflector 70 may be at least 2 microns, such as 2 to 10 microns.

Thus, in one embodiment, the light emitting diode 10 includes a first conductivity type semiconductor material region 32, an active region 34 located over the first conductivity type semiconductor material region, a second conductivity type semiconductor material layer 36 located over the active region, a first layer 38' containing at least one of nickel or gold located over the second conductivity type semiconductor material layer, a reflective top contact electrode 50 located over the first layer, a dielectric material layer 60 located over the top contact electrode and containing an opening, and a reflector 70 located on the dielectric material layer and contacting the top contact electrode through the opening in the dielectric material layer.

In one embodiment, the first conductivity type semiconductor material region 32, the active region 34 and the second conductivity type semiconductor material layer 36 are patterned into a mesa having sidewalls. The first layer 38' and the top contact electrode 50 are located only on top of the mesa, the dielectric material layer 60 is located over the top contact electrode and on sidewalls of the mesa, the opening is located over the top of the mesa, and the reflector 70 is located on the dielectric material layer over the top and the sidewalls of the mesa.

Figure 22:
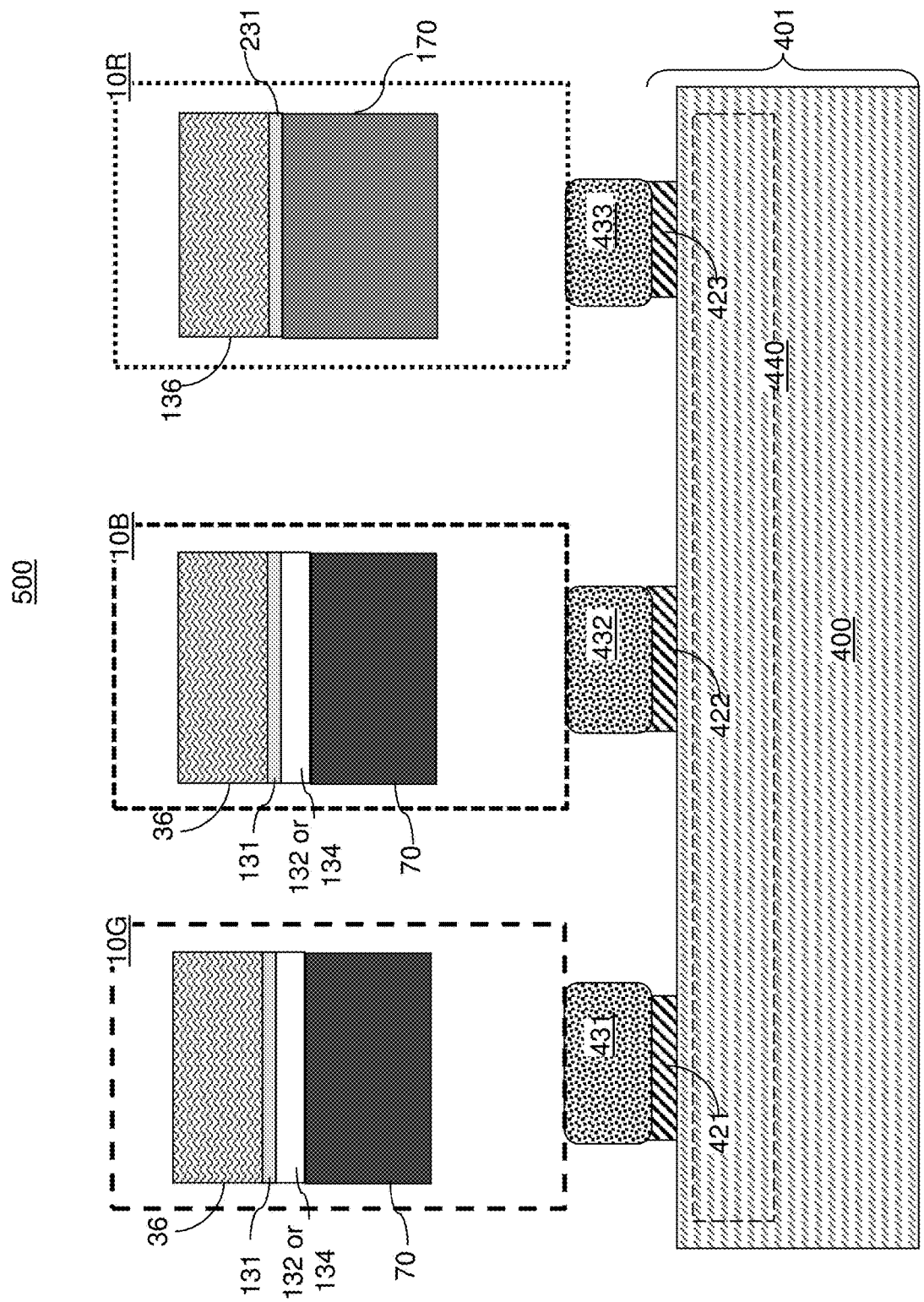
FIG. 22 is a vertical cross-sectional view of a display device according to an embodiment of the present disclosure.

In a fifth embodiment shown in FIG. 22, a device contains light emitting diodes 10 emitting light of different peak wavelengths located on the same support. For example, the device of the fifth embodiment may include a direct view display device 500 illustrated in FIG. 16P containing at least one first-type light emitting diode 10G (such as at least one green-light-emitting diode), that emits light at a first peak wavelength (such as a peak wavelength in a range from 495 nm to 570 nm), at least one second-type light emitting diode 10B (such as at least one blue-light-emitting diode) that emits light at a second peak wavelength (such as a peak wavelength in a range from 400 nm to 495 nm), and at least one third-type light emitting diode 10R (such as at least one red-light-emitting diode 10R) that emits light at a third peak wavelength (such as a peak wavelength in a range from 600 nm to 700 nm) located on the same backplane 401. Each light emitting diode (10G, 10B, 10R) can have the configuration of any one of the first, second, third or fourth embodiments illustrated in FIG. 17A, 17B, 17C or 17D, respectively. The light emitting diodes 10 in FIG. 22 are shown schematically by dashed lines to indicate that they can include any type of light emitting diode, and only the regions of the transparent conductive layers and reflector layers are shown in detail.

The shorter wavelength light emitting diodes, such as the LEDs that emit light at a peak wavelength in range from 440 nm to 599 nm (such as the blue and/or green-light-emitting diodes 10B and/or 10G) have a different transparent conductive and reflector layers from the longer wavelength light emitting diodes, such as the LEDs that emit light at a peak wavelength in range from 600 nm to 750 nm (such as the red-light-emitting diodes 10R).

For example, the shorter wavelength light emitting diodes (e.g., 10B and/or 10G) may have the structure described above with respect to FIG. 20. Specifically, each the shorter wavelength light emitting diodes (e.g., 10B and/or 10G) may have the gold doped semiconductor region 131 located in the p-doped semiconductor material layer 36, an aluminum or silver reflector layer 70 and a transparent conductive layer 132 or 134 located between the p-doped semiconductor material layer 36 and the aluminum or silver reflector layer 70. The transparent conductive layer 132 or 134 may comprise either the nickel oxide transparent conductive layer 132 described above or a thin gold layer 134 having a thickness of 10 nm or less, such as 1 nm to 5 nm. The gold layer 134 is transparent to visible light due to its small thickness.

In contrast, the longer wavelength light emitting diodes 10R have a second gold doped semiconductor region 231 located in the second p-doped semiconductor material layer 136, and a gold reflector layer 170 contacting the second gold doped semiconductor region 231. The longer wavelength light emitting diodes 10R may exclude the aluminum or silver reflector layer 70 and the transparent conductive layer (e.g., the nickel oxide layer 132 and/or the thin gold layer 134). The gold reflector layer 170 does not transmit visible light due to its larger thickness of at least 100 nm, which may be 100 nm to 3 microns. The gold reflector layer 170 contains at least 90 atomic percent gold, such as 90 to 100 atomic percent gold.

Without wishing to be bound by a particular theory, the inventors believe that the gold reflector layer 170 causes red shifting of the light that is reflected from the gold reflector layer 170 by pushing the dominant wavelength of the LED 10R to longer wavelength while suppressing the shorter wavelength tail. In other words, the peak wavelength of the light reflected from the gold reflector layer 170 is believed to be greater than the peak wavelength of the incident light emitted from longer wavelength light emitting diode 10R. Thus, it is believed that the gold reflector layer 170 performs effective spectral modification through differential reflectivity within the visible wavelength range such that light emitted from the LED 10R appears more red to an observer after being reflected from the gold reflector layer 170. The shorter wavelength light emitting diodes (e.g., 10B and/or 10G) emit blue light or green light, and thus, spectral modification is not desired. Thus, a metal other than gold, such as aluminum and/or silver, can be used as the reflector layer 70 for these LEDs 10B and/or 10G.

The red shift of the center of the emission spectrum is advantageous because light emission efficiency decreases within an increase in the emission wavelength in compound semiconductor based light emitting diodes. By inducing a red shift of the emission spectrum through reflection by a gold reflector, the direct view display device can generate a more vivid red color to human eyes, and thus, enhance the overall vibrancy of the color spectrum provided by the direct view display device.

As illustrated in FIG. 22, the direct view display device 500 comprises a first light emitting diode (10G and/or 10B) bonded to a backplane 401, and a second light emitting diode 10R bonded to the backplane 401. The first light emitting diode (10G and/or 10B) is configured to emit light of a first peak wavelength and comprises a transparent conductive layer (132 or 134) located between a first doped semiconductor layer 36 and an aluminum or silver reflector layer 70. The second light emitting diode 10R is configured to emit light of a second peak wavelength longer than the first peak wavelength and comprises a gold reflector layer directly 170 contacting a second doped semiconductor layer 36.

In one embodiment, the transparent conductive layer (132 or 134) in the first light emitting diode (10G and/or 10B) comprises at least one of a gold layer 134 or a nickel oxide layer 132 having a thickness in a range from 1 nm to 10 nm, and the gold reflector layer 170 of the second light emitting diode 10R has a thickness of at least 100 nm. The first light emitting diode (10G and/or 10B) is configured to emit blue or green light, and the second light emitting diode 10R is configured to emit red light.

In one embodiment, the transparent conductive layer (132 or 134) contacts a first gold doped semiconductor region 131 in the first doped semiconductor layer 36 in the first light emitting diode (10G and/or 10B). The gold reflector layer 170 contacts a second gold doped semiconductor region 231 in the second doped semiconductor layer 136 in the second light emitting diode 10R. In one embodiment, the gold reflector 170 is configured to shift light emitted by the second light emitted diode 10R to a higher wavelength.

Referring to various embodiments of the present disclosure, a light emitting device 10 comprises a first conductivity type semiconductor material region 32, an active region 34 located over the first conductivity type semiconductor material region 32, a second conductivity type semiconductor material layer 36 located over the active region 34, a gold doped semiconductor region 131 located in the second conductivity type semiconductor material layer 36, a transparent conductive layer comprising nickel oxide 132 located in contact with the gold doped semiconductor region 131, and a reflector layer 70 located on the transparent conductive layer 132, as shown in FIG. 20.

In one embodiment, the light emitting device 10 comprises a first light emitting diode (10B and/or 10G) located in a direct view display device 500, as shown in FIG. 22. The reflector layer 70 may comprise a silver or aluminum reflector layer. In one embodiment, a second light emitting diode 10R is located in the direct view display device 500. The second light emitting diode 10R contains a gold reflector layer 170 directly contacting a gold doped semiconductor region 231 in a second conductivity type semiconductor material layer 136 of the second light emitting diode 10R.

In the first, second, third and fourth embodiments illustrated in FIGS. 17A-17D, respectively, the first conductivity type semiconductor material region 32 comprises at least one of a semiconductor nanowire core, a semiconductor microdisc, a semiconductor nanodisc or a semiconductor layer.

In another embodiment, a light emitting device includes a doped compound semiconductor layer 26, a growth mask layer 42 located on a top surface of the doped compound semiconductor layer 26, a semiconductor core 32 extending from a top surface of the doped compound semiconductor layer 26 through an opening in the growth mask layer 42, an active region 34 (e.g., active region shell or active layer) located over the semiconductor core 32, a second conductivity type semiconductor material layer 36 located over the active region 34, a transparent conductive layer located (132, 38, 138) on the second conductivity type semiconductor material layer 36 and comprising nickel oxide, and a reflector layer 70 located on the transparent conductive layer (132, 38, 138).

In one embodiment, the transparent conductive layer (132, 38, 138) comprises at one of an underlying nickel oxide layer and an overlying gold layer, a composite of nickel oxide and gold or a composite of nickel oxide and gold in which a concentration of the nickel oxide increases from bottom toward top of the transparent conductive layer.

The semiconductor core 32 can comprise at least one of a semiconductor nanowire core, a semiconductor microdisc, a semiconductor nanodisc, as described above with respect to FIGS. 17A-17C, respectively.

The preceding description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the following claims and the principles and novel features disclosed herein.

The invention claimed is:

1. A light emitting diode (LED), comprising:
a first conductivity type semiconductor material region;
an active region located over the first conductivity type semiconductor material region;
a second conductivity type semiconductor material layer located over the active region;
a first layer comprising at least one of nickel or gold located over the second conductivity type semiconductor material layer;
a reflective top contact electrode located over the first layer;
a dielectric material layer located over the top contact electrode, wherein the dielectric material layer contains an opening; and
a reflector located over the dielectric material layer and contacting the top contact electrode through the opening in the dielectric material layer,
wherein:
the first conductivity type semiconductor material region, the active region and the second conductivity type semiconductor material layer are patterned into a mesa having sidewalls;
the dielectric material layer is located over the reflective top contact electrode and on sidewalls of the mesa;
the opening is located over the top of the mesa; and
the reflector is located on the dielectric material layer over the top and the sidewalls of the mesa.

2. The LED of claim 1, wherein:
the first layer and the top contact electrode are located only on top of the mesa.

3. The LED of claim 2, wherein the top contact electrode comprises aluminum, and the reflector comprises aluminum.

4. The LED of claim 2, wherein a lateral width of the top contact electrode is not less than 1 microns smaller than the lateral width of the mesa.

5. The LED of claim 4, wherein the lateral width of the top contact electrode is not less than 1 microns smaller than a lateral width of the second conductivity type semiconductor material layer in the mesa.

6. The LED of claim 5, wherein the lateral width of the top contact electrode is the same as the lateral width of the mesa and is the same as the lateral width of the second conductivity type semiconductor material layer.

7. The LED of claim 5, wherein the lateral width of the top contact electrode is smaller than the lateral width of the mesa by 1 micron or less.

8. The LED of claim 7, wherein the lateral width of the top contact electrode is smaller than the lateral width of the mesa by 0.1 to 0.5 microns.

9. The LED of claim 7, wherein the lateral width of the top contact electrode is smaller than the lateral width of the second conductivity type semiconductor material layer by 1 micron or less.

10. The LED of claim 9, wherein the lateral width of the top contact electrode is smaller than the lateral width of the second conductivity type semiconductor material layer by 0.1 to 0.5 microns.

11. The LED of claim 2, wherein a thickness of at least one semiconductor material layer is at least 2 microns below a portion of the reflector located past the sidewalls of the mesa.

12. The LED of claim 11, wherein the at least one semiconductor material layer comprises a single crystalline buffer semiconductor layer.

13. The LED of claim 1, further comprising a bonding pad and a tin portion located on the reflector.

14. The LED of claim 13, wherein the LED is located in a direct view display device.

15. The LED of claim 14, wherein the tin portion is bonded to a backplane of the direct view display device.

16. The LED claim 1, wherein the first layer comprises at least one of an underlying nickel oxide layer and an overlying gold layer, a composite of nickel oxide and gold or a composite of nickel oxide and gold in which a concentration of the nickel oxide increases from bottom toward top of the transparent conductive layer.

17. The LED claim 1, wherein the dielectric material layer comprises aluminum oxide.

18. The LED of claim 1, wherein:
the first conductivity type semiconductor material region comprises n-type gallium nitride;
the active region comprises indium gallium nitride; and
the second conductivity type semiconductor material layer comprises p-type gallium nitride.

19. The LED of claim 1, wherein the first conductivity type semiconductor material region comprises at least one of a semiconductor nanowire core, a semiconductor nanodisc, a semiconductor microdisc or a semiconductor layer.

20. The LED of claim 1, wherein the reflector contacts a side surface of the dielectric material layer in the opening in the dielectric material layer.

* * * * *